United States Patent [19]
Kobayashi et al.

[11] Patent Number: 5,616,401
[45] Date of Patent: Apr. 1, 1997

[54] OXYNITRIDE FILM AND ITS FORMATION METHOD, AND METHOD FOR FORMING AN ELEMENT ISOLATION OXIDE FILM USING THE OXYNITRIDE FILM

[75] Inventors: Maiko Kobayashi; Takashi Kuroi, both of Hyogo, Japan

[73] Assignee: Mitsubishi Denki Kabushiki Kaisha, Tokyo, Japan

[21] Appl. No.: 559,874

[22] Filed: Nov. 20, 1995

[30] Foreign Application Priority Data

Jan. 31, 1995 [JP] Japan ................... 7-013674

[51] Int. Cl.⁶ .................................. H01L 21/76
[52] U.S. Cl. .............. 428/212; 204/192.23; 204/192.37; 204/298.11; 427/99; 427/126.1; 427/255; 427/255.2; 427/255.3; 427/325; 427/344; 427/574; 427/579; 428/195; 428/210; 428/446; 428/698; 428/699; 428/701; 428/702; 437/255; 437/241
[58] Field of Search ................ 427/344, 99, 126.1, 427/325, 588, 574, 579, 255, 255.2, 255.3; 437/225, 241; 204/192.23, 192.37, 298.11; 428/195, 210, 212, 446, 698, 699, 701, 702

[56] References Cited

U.S. PATENT DOCUMENTS

| | | | |
|---|---|---|---|
| 3,652,324 | 3/1972 | Chu et al. | 117/106 |
| 4,616,245 | 10/1986 | Topich et al. | 357/23.5 |
| 4,657,630 | 4/1987 | Agatsuma | 427/93 |
| 4,668,365 | 5/1987 | Foster et al. | 428/698 |
| 4,876,582 | 10/1989 | Janning | 357/23.5 |
| 4,901,133 | 2/1990 | Curran et al. | 357/54 |
| 5,015,353 | 5/1991 | Hubler et al. | 204/192.31 |

*Primary Examiner*—Archene Turner
*Attorney, Agent, or Firm*—Lowe, Price, LeBlanc & Becker

[57] ABSTRACT

An oxynitride film whose compositional ratio between oxygen and nitrogen varies in the thickness direction thereof is formed on a main surface of a silicon substrate, on which a silicon nitride film is formed. The oxynitride film is so controlled in composition that said film has a portion near the silicon substrate which has a composition close to that of a silicon oxide film and that said film has a composition closer to that of a silicon nitride film toward the silicon nitride film. The silicon nitride film and the oxynitride film are patterned in a desired form. Using the patterned silicon nitride film and oxynitride film as a mask, the main surface of the silicon substrate is thermally oxidized. The use of the oxynitride film whose composition varies in the thickness direction thereof can suppress bird's beak extension of an element isolation oxide film and also formation of crystal defects in the main surface of the silicon substrate.

24 Claims, 45 Drawing Sheets

OXYNITRIDE FILM AND ITS FORMATION METHOD, AND METHOD FOR FORMING AN ELEMENT ISOLATION OXIDE FILM USING THE OXYNITRIDE FILM

BACKGROUND OF THE INVENTION

1. Field of the Invention

This invention relates to an oxynitride film which comprises nitrogen and oxygen whose compositional ratio varies along the thickness of the film and a method for forming the film. The invention also relates to a method for forming an element isolation oxide film using the oxynitride film.

2. Description of the Related Art

In semiconductor integrated circuits, it is essential to form element isolation regions in order to avoid electric interference between the adjacent elements in operation and also to completely and independently control individual elements. For the formation of element isolation regions, the LOGOS (local oxidation of silicon) method has been hitherto known widely.

Reference is now made to FIGS. 115 to 117 for illustrating the LOGOS method which has been popularly, widely known in the art. FIGS. 115 to 117 are, respectively, sectional views showing first to third steps of the known LOCOS method.

As shown in FIG. 115, an about 500 Å thick silicon oxide film 6 is formed on a main surface of a silicon substrate 1 according to a thermal oxidation method. Subsequently, an about 1000 Å thick silicon nitride film 3 is further formed on the silicon oxide film 6 by a CVD (chemical vapor deposition) method or the like. In order to relax the stress of the silicon nitride film 3 exerted on the silicon substrate 1 at the time of selective oxidation, the silicon oxide film 6 should have a thickness which is at least half the thickness of the silicon nitride film 3.

Referring to FIG. 116, the silicon nitride film 3 is patterned in a given form according to photolithography and etching techniques. Using the patterned silicon nitride film 3 as a mask, selective oxidation is effected to selectively form an element isolation oxide film 4 on the main surface of the silicon substrate 1 as shown in FIG. 117. Thereafter, the silicon nitride film 3 is removed by use of hot phosphoric acid or the like, followed by removal of the silicon oxide film 6 by use of hydrofluoric acid or the like.

The element isolation oxide film 4 is formed through the above steps. However, the LOCOS method has the problems set out hereinbelow.

As shown in FIG. 117, the element isolation oxide film 4 has bird's beaks extending beneath the silicon nitride film 3. A greater length of the bird's beak (i.e., a length of the bird's beaks extending in parallel to the main surface of the silicon substrate 1) causes a greater deal of troubles concerning the high degree of integration of semiconductor integrated circuits. The bird's beak length is greatly influenced by the thickness of the silicon oxide film 6. More particularly, a greater thickness of the silicon oxide film 6 undesirably leads to a greater length of the bird's beaks. In the known LOCOS method, the silicon oxide film 6 should be formed in a thickness as large as approximately half the thickness of the silicon nitride 3, thus presenting the problem that the bird's peaks undesirably become prolonged.

In order to solve the above problem, many improvements have been proposed. One of such improvements is particularly shown in FIGS. 118 to 120. FIGS. 118 to 120 are, respectively, sectional views showing first to third steps of the LOCOS method proposed in Japanese Patent Laid-open No. 63-21848.

As shown in FIG. 118, a silicon oxide film 6 having a thickness of about 100 Å to about 200 Å is formed on the main surface of a silicon substrate 1 according to a thermal oxidation method. Then, an oxynitride film 8 having a thickness of about 200 Å is formed on the silicon oxide film 6 according to a low pressure CVD method. The oxynitride film 8 is an oxygen atom-containing silicon nitride film and is intermediate between the silicon oxide film and the silicon nitride film with respect to the properties thereof. The oxynitride film 8 contains oxygen and nitrogen substantially uniformly along the thickness of the film. According to a low pressure CVD method, a silicon nitride film 3 having a thickness of approximately 1500 Å is formed on the oxynitride film 8.

Referring to the FIG. 119, the silicon nitride film 3 and the oxynitride film 8 are patterned using photolithography and etching techniques. Subsequently, selective oxidation is carried out using the pattern of the silicon nitride film 3 and the oxynitride film 8 as a mask, thereby selectively forming an element isolation oxide film 4 on the main surface of the silicon substrate 1.

In the above improvement, the oxynitride film 8 is formed beneath the silicon nitride film 3. Since the oxynitride film 8 has intermediate properties between the silicon oxide film and the silicon nitride film as set out hereinabove, the oxynitride film 8 is softer than the silicon nitride film 3. This serves to relax the stress exerted on the silicon substrate 1 by the action of the silicon nitride film 3. As a result, it becomes possible that the thickness of the silicon oxide film 6 formed beneath the oxynitride film 8 is smaller than in the case of the afore-stated known LOCOS method. This eventually leads to a smaller length of the bird's beaks.

However, the above improvement has the following problems. The oxynitride film 8 used in the improvement contains oxygen and nitrogen substantially uniformly along the thickness thereof. This means that the oxynitride film 8 contains nitrogen in a substantially uniform amount not only in portions near the main surface of the silicon substrate 1 but also in portions distant from the silicon substrate 1. Accordingly, the stress of the silicon nitride film 3 exerted on the silicon substrate 1 is not relaxed satisfactorily.

In order to relax the stress of the silicon nitride film 3 and effectively prevent the formation of crystal defects in the main surface of the silicon substrate 1, it is necessary to form a silicon oxide film 6. The silicon oxide film should have a relatively large thickness although the thickness is not so large as required in the known LOCOS method. Thus, the improvement is disadvantageous in that some limitation is placed on the reduction of the bird's beak length.

SUMMARY OF THE INVENTION

The invention has been made in order to solve the problems involved in the prior art. Accordingly, an object of the invention is to provide an oxynitride film which enables the bird's beak length to be further reduced and which has a good stress-relaxing function and also a method for making the same.

Another object is to provide a method for forming an element isolation oxide film which ensures a further reduction in length of bird's beaks and which can effectively suppress the formational of crystal defects.

The oxynitride film of the invention has a compositional ratio between oxygen and nitrogen which varies along the thickness thereof.

As set out hereinabove, the oxynitride film of the invention has a varying compositional ratio between oxygen and nitrogen in the thickness direction of the film. By this, when the oxynitride film is formed on a main surface of a silicon substrate, the compositional ratio between the oxygen and nitrogen can be so controlled that the content of oxygen in portions at the side of the silicon substrate is greater than the content of nitrogen and that the content of nitrogen in portions at the side distant from the silicon substrate is greater than the content of oxygen. As a consequence, the oxynitride film has a composition close to that of a silicon oxide film in the vicinity of the silicon substrate and has a composition close to that of the silicon nitride film at portions kept away from the Silicon substrate. The oxynitride film whose composition varies in the thickness direction thereof has both good stress relaxing function and good oxidation-resistant function. Moreover, where the compositional ratio between the oxygen and nitrogen in the thickness direction of the oxynitride film is gradually varied, the resultant oxynitride film has a better stress relaxing function. Since the oxynitride film has such a good stress relaxing function, it is not required to form any silicon oxide film between the oxynitride film and the silicon substrate. This enables one to reduce the length of bird's beaks over that attained by the prior art improvement set out hereinbefore. If a silicon oxide film is formed between the oxynitride film and the silicon substrate, its thickness can be significantly reduced in comparison with the case of the prior art improvement. Even in this case, the length of the bird's beaks can be reduced over the case of the prior art improvement.

The method for making an oxynitride film according to the invention is characterized in that vapor phase epitaxy is performed while changing a first gas feed for supplying oxygen and a second gas feed for supplying nitrogen. By this, the resultant oxynitride film has a compositional ratio between the oxygen and nitrogen which varies in the thickness direction thereof.

The method for forming an element isolation oxide film according to the invention makes use, in one aspect thereof, of an oxynitride film which is formed on a main surface of a silicon substrate and contains predetermined amounts of oxygen and nitrogen therein, the oxynitride film having a first surface layer portion comprising a first surface located at a main surface side of the silicon substrate and a second surface layer portion comprising a second surface opposite to the first surface. According to the method for forming an element isolation oxide film of the invention, the oxynitride film is formed on the silicon substrate by forming the first surface layer portion according to a chemical vapor deposition method wherein a first gas feed for supplying oxygen is larger than a second gas feed for supplying nitrogen and then forming the second surface layer portion according to a chemical vapor deposition method wherein the first gas feed is smaller than the second gas feed. The oxynitride film is patterned in a given shape to selectively expose the main surface of the silicon substrate. The exposed main surface of the silicon substrate is selectively oxidized to form an element isolation oxide film.

Thus, according to one aspect of the invention, the element isolation oxide film is formed by forming the first surface layer portion wherein the first gas feed for supplying oxygen is greater than the second gas feed for supplying nitrogen, and then forming the second surface layer portion wherein the first gas feed is less than the second gas feed. By this, the resultant oxynitride film is so formed that the first surface layer portion contains oxygen larger in amount than nitrogen and the second surface layer portion contains nitrogen larger in amount than oxygen. The first surface layer portion is formed at the side of the silicon substrate and the second portion is kept away from the silicon substrate. This means that the oxynitride film has a composition close to that of a silicon oxide film in the vicinity of the silicon substrate and has a composition close to that of a silicon nitride film at portions kept away from the silicon substrate. The oxynitride film which is thus compositionally modulated has both good oxidation-resistant function and good stress-relaxing function. Hence, it is not necessary to form any silicon oxide between the oxynitride film and the silicon substrate. Alternatively, even if a silicon oxide film is formed, its thickness can be reduced remarkably as compared with the case of the prior art. Using the oxynitride film as a mask, the main surface of the silicon substrate is selectively oxidized to form an element isolation oxide film. The thus formed element isolation oxide film has a reduced length of bird's beaks and the main surface of the silicon substrate can be effectively suppressed from generation of crystal defects.

The method for forming an element isolation oxide film according to another aspect of the invention comprises forming a silicon nitride film on a main surface of a silicon substrate with a silicon oxide film interposed therebetween. The silicon nitride film is patterned in a given shape. Thereafter, an oxynitride film is formed to cover the main surface of the silicon substrate and the patterned silicon nitride film wherein a first surface layer portion of the oxynitride film is formed according to a chemical vapor deposition method in such a way that a first gas feed for supplying oxygen is greater in amount than a second gas feed for supplying nitrogen, and a second surface layer portion is formed in such a way that the first gas feed is less in amount than the second gas feed. The thus formed oxynitride film is then subjected to anisotropic etching to selectively expose the main surface of the silicon substrate and to form side wall insulating films made of the oxynitride film to cover the side walls of the silicon nitride film. Using the side wall insulating films and the silicon nitride film as a mask, the main surface of the silicon substrate is selectively oxidized to form an element isolation oxide film.

In this aspect of the invention, the side wall insulating films formed on the side walls of the patterned silicon nitride film are made of the oxynitride film. Like the case of the one aspect of the invention, the length of the bird's beaks can be reduced. When compared with the case using a silicon nitride film as side wall insulating films, the degree of recess on the surface of the element isolation oxide film can be effectively reduced. The reason for this is described below. Where a silicon nitride film is used as side wall insulating films, a silicon oxide film has to be formed between the silicon nitride film and the silicon substrate in order to relax the stress between them. A greater thickness of the silicon oxide film results in a greater length of the bird's beaks of the resultant element isolation oxide film. In contrast, a smaller thickness of the silicon oxide film ensures a smaller length of the bird's beaks. However, when the silicon oxide film is made thin, an oxidizing agent is unlikely to supply to the edge portion of the element isolation oxide film owing to the existence of the side wall insulating film made of the silicon nitride film. This is the reason why a recess is formed on the surface of the element isolation oxide film. In contrast, where the oxynitride film of the invention is used as the side wall insulating film, the side wall insulating film has a composition close to that of silicon nitride film in the surface thereof but has a composition close to that of the silicon oxide film at the bottom thereof. This permits relatively smooth supply of an oxidizing agent to the edge portion of the element isolation oxide film in comparison with the case using the silicon nitride film as the side wall insulating film. This enables one to effectively reduce the degree of recess on the surface of element isolation oxide film while reducing the length of each bird's beak.

The foregoing and other objects, features, aspects and advantages of the present invention will become more apparent from the following detailed description of the present invention when taken in conjunction with the accompanying drawings.

PREFERRED EMBODIMENTS OF THE INVENTION

Embodiments of the invention are described with reference to FIGS. 1 to 114.

First Embodiment

Figure 2:
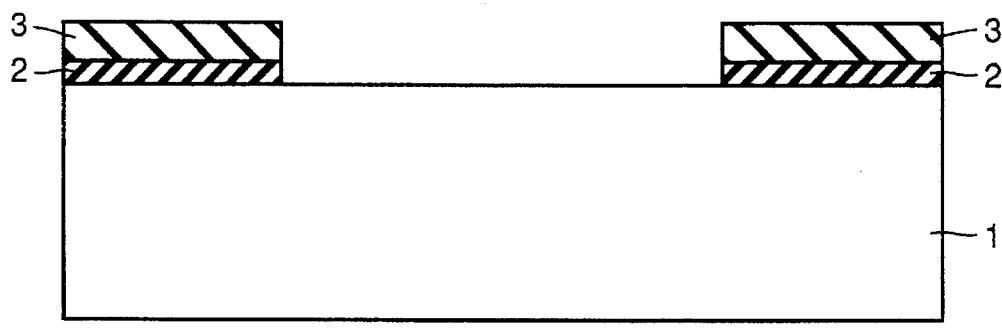
Figure 3:
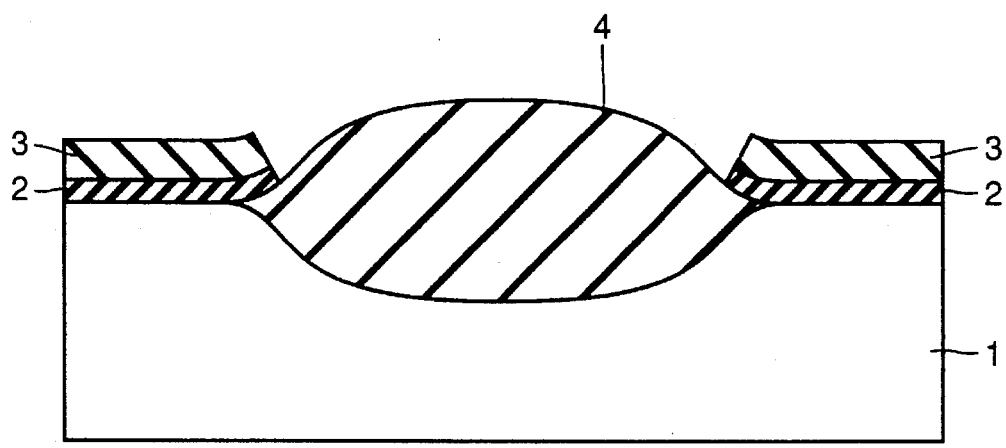

Reference is now made to FIGS. 1 to 17 to illustrate a first embodiment and its modifications or variations. FIGS. 1 to 3 are, respectively, sectional views showing first to third steps of forming an element isolation oxide film according to the first embodiment of the invention.

Figure 1:
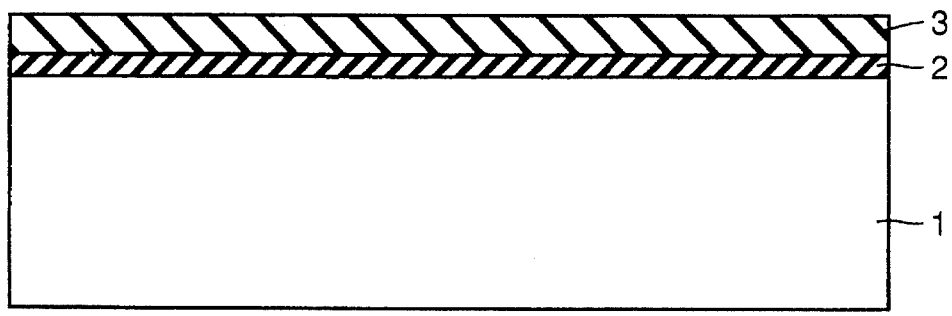
FIGS. 1 to 3 are, respectively, sectional views showing first to third steps of forming an element isolation oxide film according to a first embodiment of the invention.

Referring to FIG. 1, an oxynitride film 2 according to the invention is formed on a main surface of a silicon substrate 1, for example, according to a low pressure CVD method. More particularly, the oxynitride film 2 according to the invention is formed according to the low pressure CVD method using a mixed gas of $SiH_2Cl_2$, $NH_3$ and $N_2O$. For the formation of a portion in the vicinity of the silicon substrate 1, a feed of $NH_3$ is made smaller than a feed of $N_2O$. In contrast, in order to form a portion kept away from the silicon substrate 1, $NH_3$ is fed in amounts larger than $N_2O$. By this, the resultant oxynitride film 2 has a composition closer to the silicon oxide film in the vicinity of the silicon substrate 1 and has a composition closer to the silicon nitride film at a position which is more distant from the silicon substrate 1.

Figure 4A:
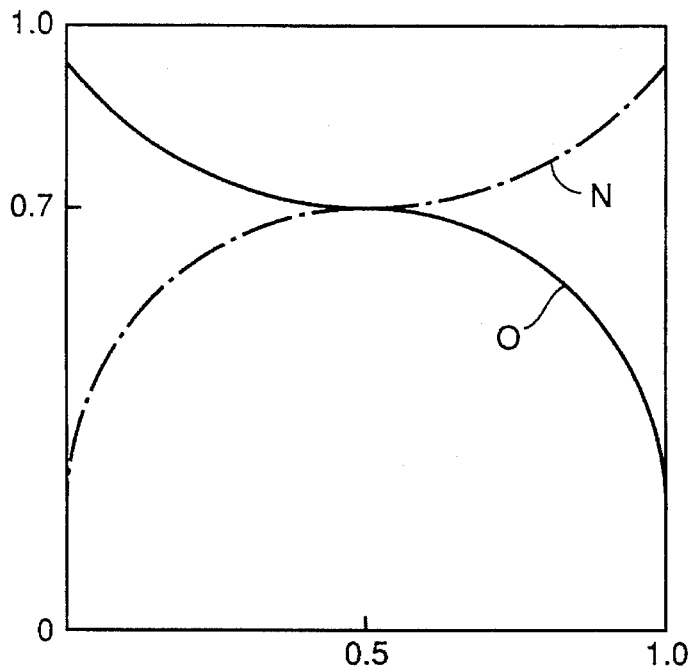
FIG. 4A is a graph showing the relation between the compositional ratio of O (oxygen) and that of N (nitrogen) in the thickness direction of an oxynitride film according to one aspect of the invention.
Figure 4B:
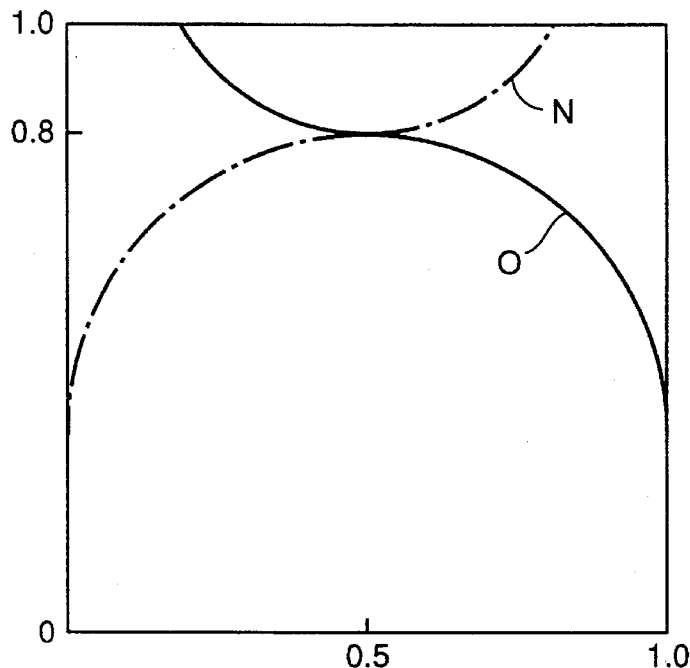
FIG. 4B is a graph showing the relation between the compositional ratio of O (oxygen) and that of N (nitrogen) in the thickness direction of an oxynitride film according to another aspect of the invention.

FIGS. 4A and 4B are, respectively, a graph showing the relation between the compositional ratio of oxygen (O) and thereof nitrogen (N) in the thickness direction of the oxynitride film 2 of the invention. In FIGS. 4A and 4B, an oxygen-rich portion is positioned at a side of the silicon substrate 1. In these figures, the thickness of the oxynitride film 2 is assumed to be 1. As shown in FIGS. 4A and 4B, the oxynitride film 2 of the invention is so arranged that oxygen (O) is relatively rich at a portion positioned at the side of the silicon substrate 1 and nitrogen becomes relatively rich at a position which is more distant from the silicon substrate 1. Since the oxynitride film 2 has such an arrangement as set out above, the stress of a silicon nitride film 3 formed on the oxynitride film 2 can be satisfactorily relaxed owing to the existence of the oxygen-rich portion, and the oxidizing agent can be effectively suppressed from diffusion owing to the existence of the nitrogen-rich portion. In the oxynitride film 2, the oxygen content increases toward the silicon substrate 1, so that the stress-relaxing function becomes excellent.

The silicon nitride film 3 is formed on the oxynitride film 2 according to a low pressure CVD method or the like.

Reference is made to FIG. 2, wherein a resist (not shown) formed in a desired pattern is formed on the silicon nitride film 3. The silicon nitride film 3 and the oxynitride film 2 are successively etched using the resist as a mask, thereby patterning the silicon nitride film 3 and the oxynitride film 2 in the desired form.

Referring to FIG. 3, the main surface of the silicon substrate 1 is thermally oxidized at a temperature of about 1000° C. using the patterned silicon nitride film 3 and oxynitride film 2 as a mask. As a result, an element isolation oxide film 4 is formed. Since the oxynitride film having such a composition as set out hereinabove is used at the time of the formation of element isolation oxide film 4, an extension of each bird's beak of the element isolation oxide film can be effectively suppressed.

The reason why the bird' beak of the element isolation oxide film 4 is suppressed from extension when using the oxynitride film 2 of the invention is described as follows. The extension of the bird's beaks becomes greater as the silicon oxide film formed on the main surface of the silicon substrate 1 is thicker. Accordingly, a smaller thickness of the silicon oxide film on the silicon substrate 1 enables one to suppress the extension of the bird's beaks of the element isolation oxide film 4.

The oxynitride film 2 of the invention has a good stress relaxing function. Accordingly, it is not always necessary to provide a silicon oxide film for stress relaxation between the silicon substrate 1 and the oxynitride film 2. If the silicon oxide film for stress relaxation is formed, a thin film is sufficient for this purpose. As shown in FIGS. 4A and 4B, the oxynitride film 2 contains a small amount of nitrogen (N) in a portion near the main surface of the silicon substrate 1. The diffusion of an oxidizing agent can be effectively suppressed owing to the existence of nitrogen. As set out hereinabove, using the oxynitride film 2 of the invention, the bird's beaks of the element isolation oxide film 4 can be effectively suppressed from extension. Further, since the oxynitride film 2 of the invention has a good stress relaxing function, the formation of crystal defects in the main surface of the silicon substrate 1 can be effectively suppressed.

Thereafter, hot phosphoric acid is used to remove the silicon nitride film 3 and a portion of the oxynitride film 2 which has a high concentration of nitrogen, followed by further removal of a portion of the oxynitride film 2 having a high concentration of oxygen by use of hydrofluoric acid.

First Modification

Figure 5:
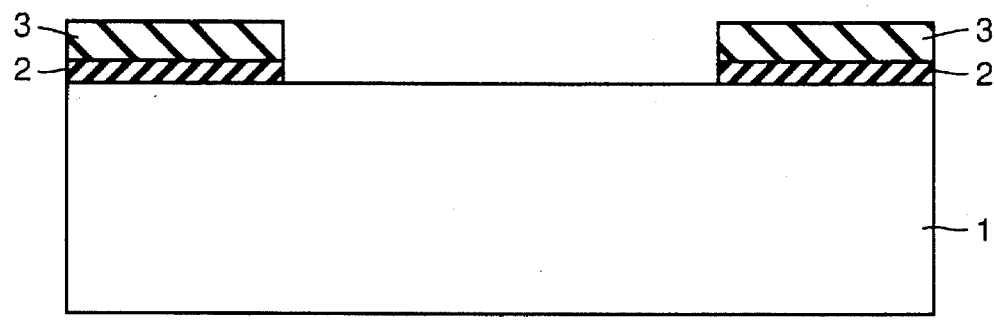
FIGS. 5 to 7 are, respectively, sectional views showing first to third steps of forming an element isolation oxide film according to a first modification in the first embodiment of the invention.
Figure 6:
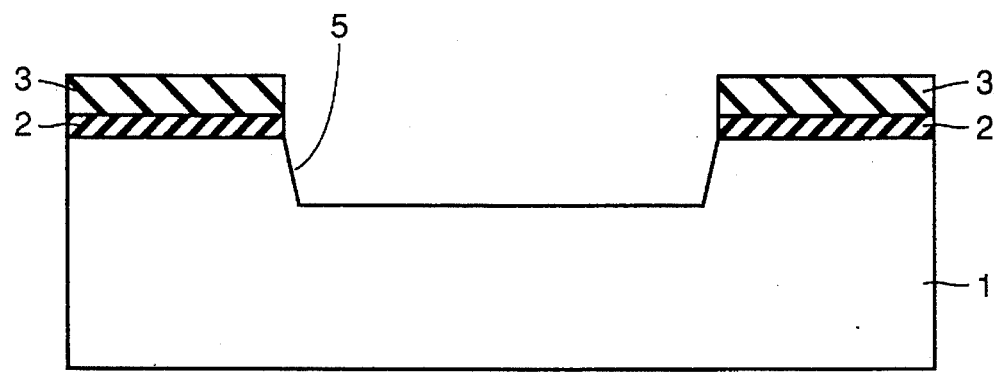
Figure 7:
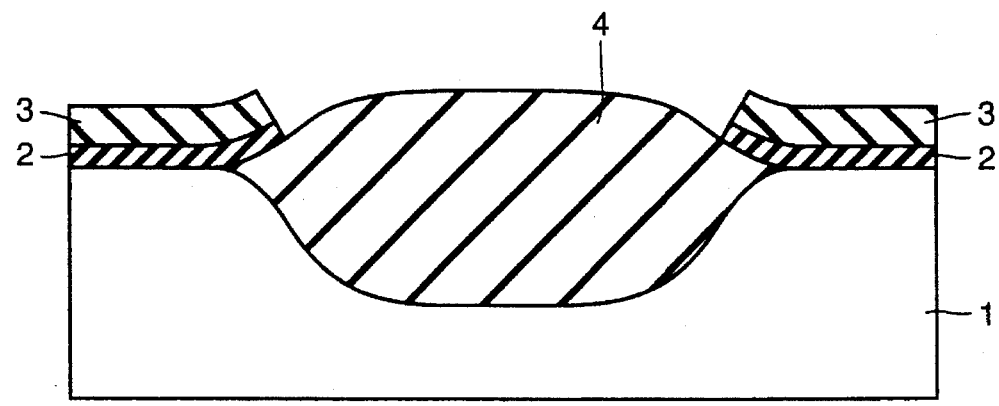

Referring now to FIGS. 5 to 7, a first modification of the first embodiment of the invention is described. FIGS. 5 to 7 are, respectively, sectional views showing first to third steps of the modification.

Referring to FIG. 5, an oxynitride film 2 and a silicon nitride film 3 are successively formed through similar steps as in the first embodiment, followed by patterning in a desired form. Subsequently, using the silicon nitride film 3 as a mask, the main surface of the silicon substrate 1 is subjected to anisotropic etching, thereby forming a groove 5 in the main surface of the silicon substrate 1 as shown in FIG. 6.

As shown in FIG. 7, an element isolation oxide film 4 is formed in the same manner as in the first embodiment. The formation of the groove 5 enables one to reduce the difference in step between the upper surface of the element isolation oxide film 4 and the main surface of the silicon substrate 1 over the case of the first embodiment.

Second Modification

A second modification is described with reference to FIGS. 8 to 11, which are, respectively, first to fourth steps of the second modification of the first embodiment of the invention.

Figure 8:
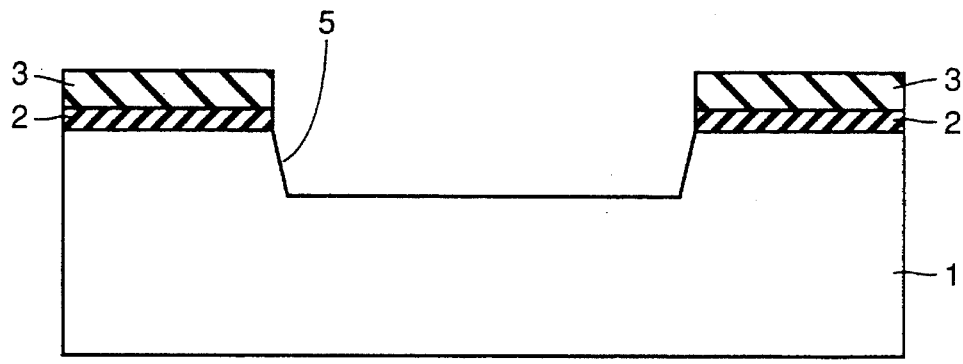
FIGS. 8 to 11 are, respectively, sectional views showing first to fourth steps of forming an element isolation oxide film according to a second modification in the first embodiment of the invention.
Figure 9:
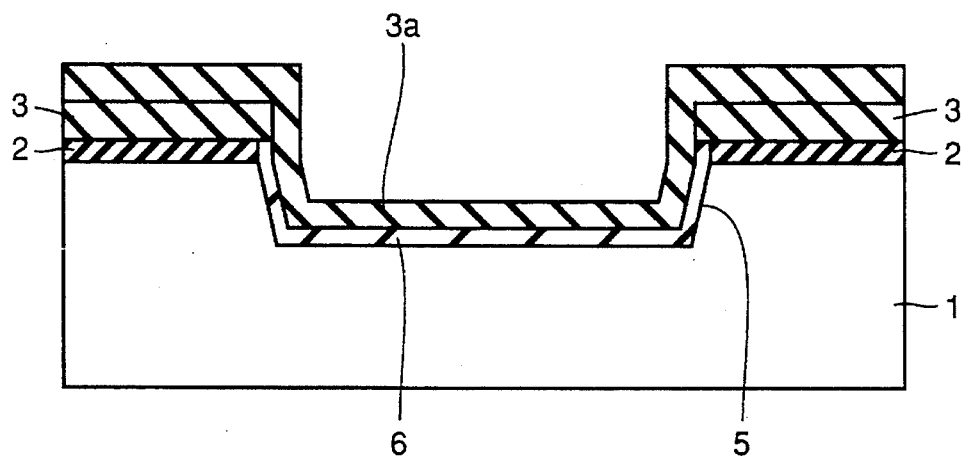
Figure 10:
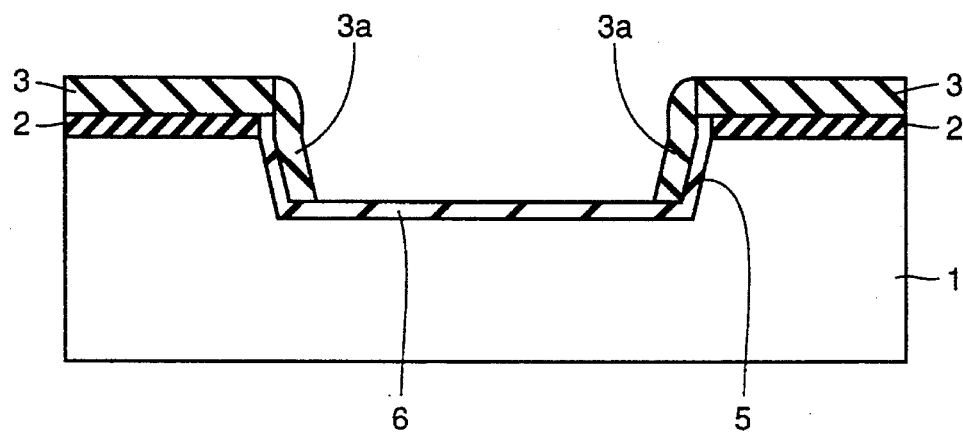

Referring to FIG. 8, the steps including the step of forming the groove 5 are performed through similar steps as in the first modification. As shown in FIG. 9, a silicon oxide film 6 is formed on the surface of the groove 5 according to a thermal oxidation method or the like. Using a CVD method, a silicon nitride film 3a is formed to cover the silicon oxide film 6 and the silicon nitride film 3 therewith.

The silicon nitride film 3a is anisotropically etched to leave side wall insulating films 3a on the side walls of the groove 5. This is particularly shown in FIG. 10.

Figure 11:
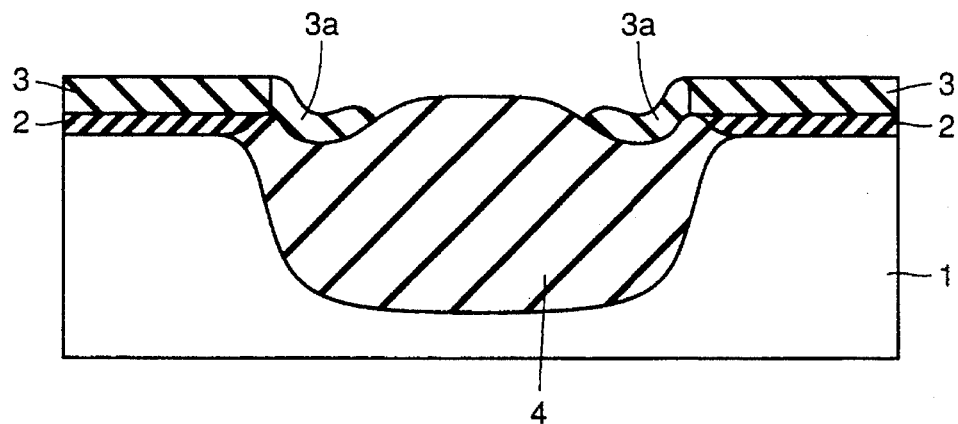

In FIG. 11, the main surface of the silicon substrate 1 is thermally oxidized using the side wall insulating films 3a and the silicon nitride films 3 as a mask. By this, an element isolation oxide film 4 is formed as shown. Thereafter, in the same manner as in the first embodiment, the side wall insulating films 3a, silicon nitride films 3 and oxynitride films 2 are removed.

The formation of the side wall insulating films 3a made of silicon nitride is more effective in suppressing the extension of the bird's beaks than in the case of the first embodiment.

Third Modification

A third modification of the first embodiment is described with reference to FIGS. 12 to 14, which are, respectively, sectional views showing first to third steps of the third modification.

Figure 12:
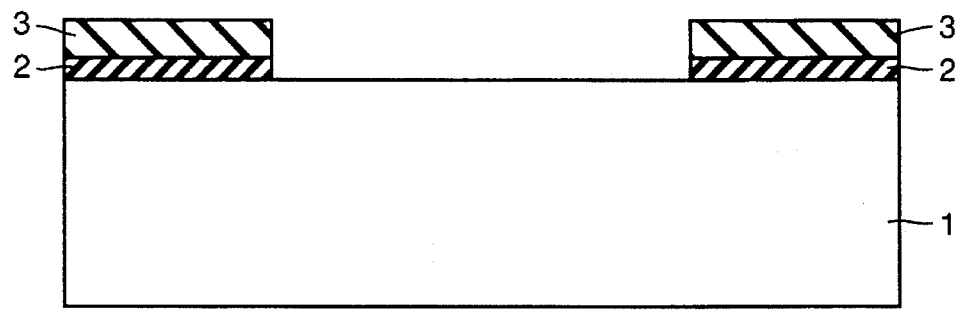
FIGS. 12 to 14 are, respectively, sectional views showing first to third steps of forming an element isolation oxide film according to a third modification in the first embodiment of the invention.
Figure 13:
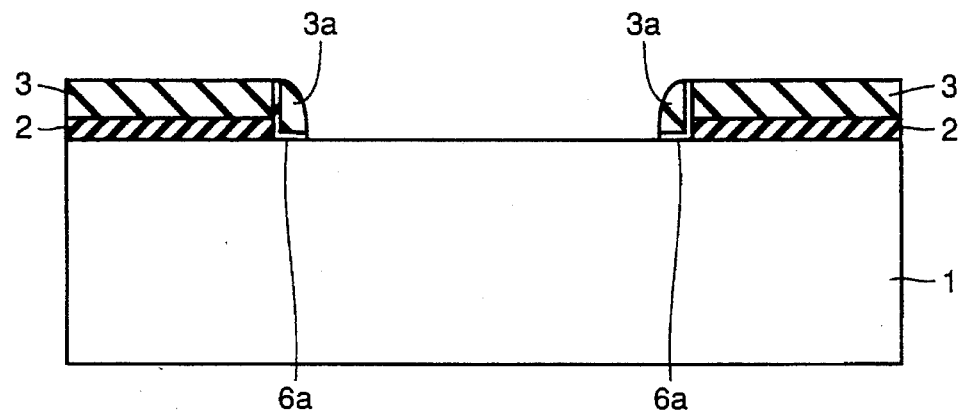

Referring to FIG. 12, the oxynitride film 2 and the silicon nitride film 3 are successively formed in the same manner as in the first embodiment, followed by patterning in a desired form. Subsequently, a silicon oxide film 6a and a silicon nitride film 3a are successively deposited according to a CVD method, followed by subjecting the silicon nitride film 3a and the silicon oxide film 6a to anisotropic etching. As a result, as shown in FIG. 13 the silicon oxide film 6a is left to cover the side walls of the silicon nitride film 3a and side wall insulating films 3a are formed on the silicon oxide films 6a, respectively.

Figure 14:
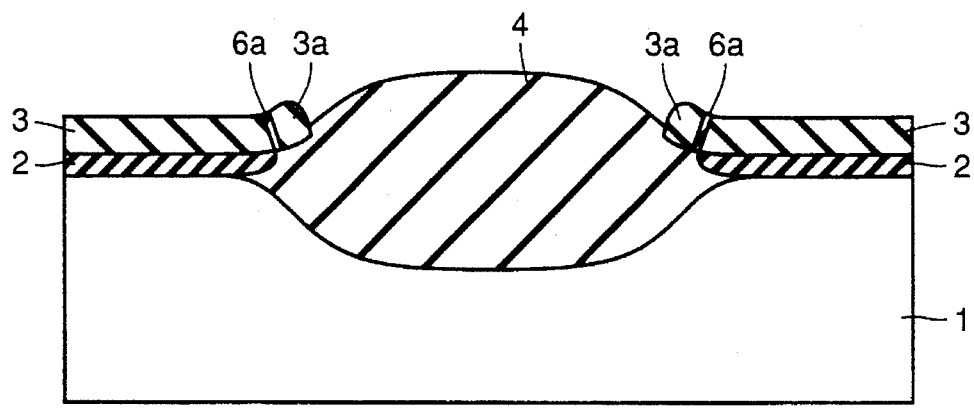

Referring to FIG. 14, the main surface of the silicon substrate 1 is thermally oxidized using the silicon nitride films 3 and the side wall insulating films 3a as a mask. Thus, an element isolation oxide film 4 is formed. Like the second modification, since the side wall insulating films 3a are formed, it is more effective than in the case of the first embodiment to suppress the extension of the bird's beaks of the element isolation oxide film 4.

Fourth Modification

Figure 15:
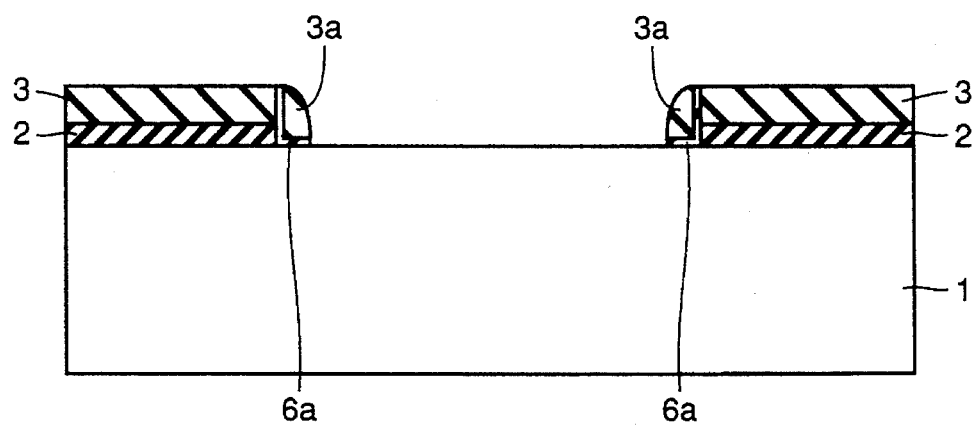
FIGS. 15 to 17 are, respectively, sectional views showing first to third steps of forming an element isolation oxide film according to a fourth modification in the first embodiment of the invention.
Figure 16:
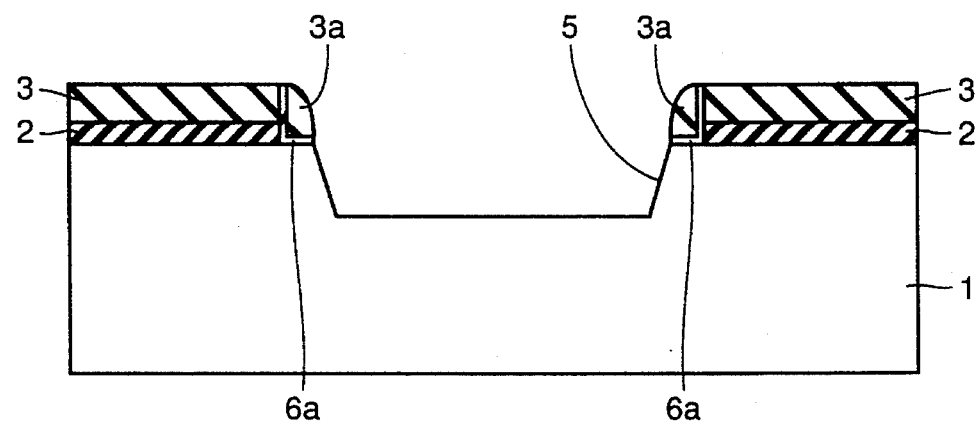
Figure 17:
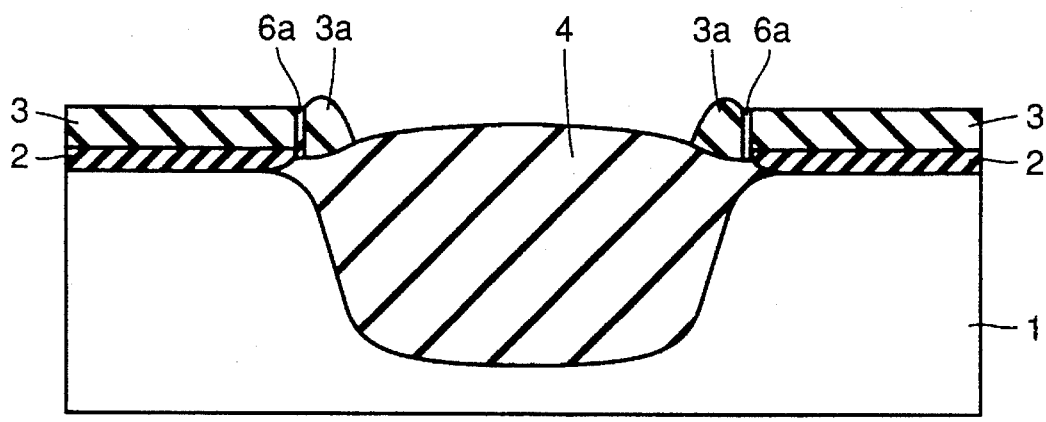

With reference to FIGS. 15 to 17, a fourth modification of the first embodiment is described. FIGS. 15 to 17 are, respectively, sectional views showing first to third steps of the fourth modification.

Referring to FIG. 15, the steps including the step of forming the side wall insulating films 3a are performed via similar steps as in the third modification. As shown in FIG. 16, using the side wall insulating films 3a and the silicon nitride films 3 as a mask, the silicon substrate 1 is anisotropically etched on the main surface thereof, thereby forming a groove 5.

In FIG. 17, using the side wall insulating films 3a and the silicon nitride films 3 as a mask, the main surface of the silicon substrate 1 is thermally oxidized. By this, an element isolation oxide film 4 is formed. In this modification, the groove 5 and the side wall insulating films 3a are formed, by which the extension of the bird's beaks of the element isolation oxide film 4 is more suppressed than in the cases of the first embodiment and the first to third modifications.

Thereafter, the side wall insulating films 3a and the silicon nitride films 3 are removed by the action of hot phosphoric acid, followed by removal of the oxynitride films 2 in the same manner as in the first embodiment.

Second Embodiment

Figure 18:
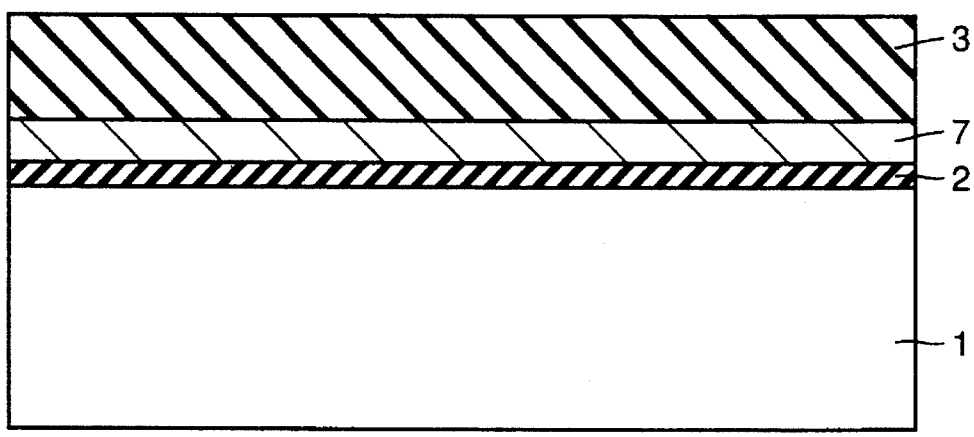
FIGS. 18 to 20 are, respectively, sectional views showing first to third steps of forming an element isolation oxide film according to a second embodiment of the invention.
Figure 19:
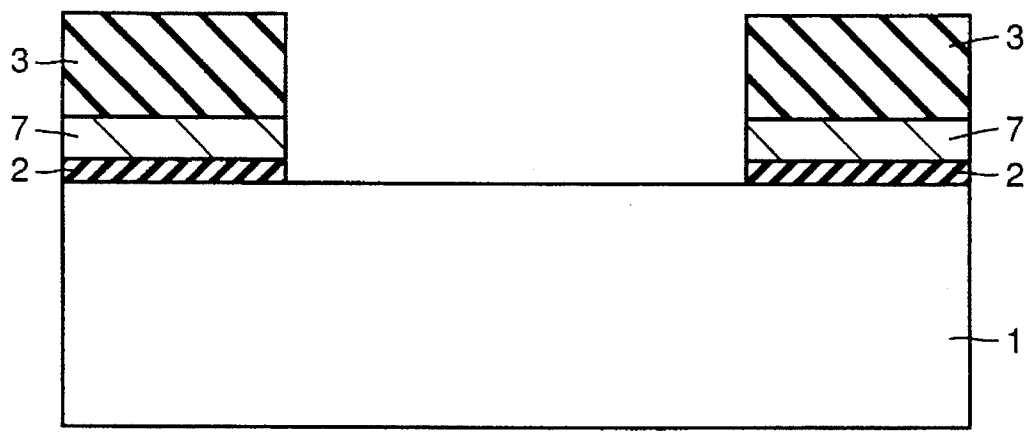
Figure 20:
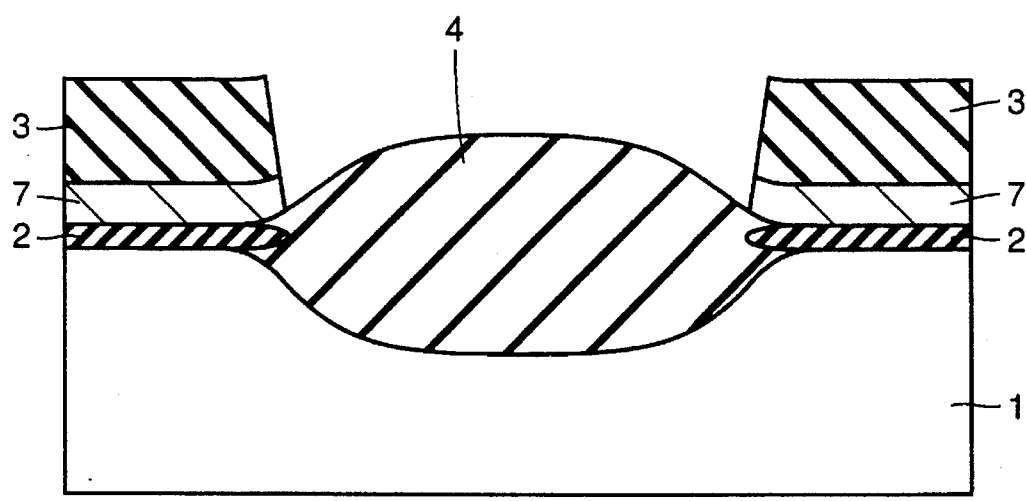

Reference is now made to FIGS. 18 to 31 to illustrate a second embodiment and its modifications. FIGS. 18 to 20 are, respectively, sectional views showing first to third steps of forming an element isolation oxide film in accordance with a second embodiment of the invention.

In FIG. 18, an oxynitride film 2 is formed on the main surface of a silicon substrate 1 in the same manner as in the first embodiment. A polysilicon film 7 is formed on the oxynitride film 2 according to a CVD method or the like. Thereafter, a silicon nitride film 3 is formed on the polysilicon film 7 such as by a CVD method. The formation of the polysilicon film 7 permits the stress caused by the silicon nitride film 3 to be further relaxed. This eventually leads to formation of a thicker silicon nitride film 3. As a consequence, it becomes possible to more effectively suppress the extension of the bird's beaks of an element isolation oxide film 4 to be formed in a subsequent step. The oxynitride film 2 should have a composition as in the first embodiment.

Referring to FIG. 19, a resist (not shown) formed in a desired pattern is formed on the silicon nitride film 3. Using the resist as a mask, the silicon nitride film 3, polysilicon film 7 and oxynitride film 2 are successively patterned.

In FIG. 20, the main surface of the silicon substrate 1 is thermally oxidized using the silicon nitride film 3 as a mask, thereby forming an element isolation oxide film 4.

In this embodiment, the silicon nitride film 3 can be formed as being thicker than in the case of the first embodiment, so that the bird's beaks of the element isolation oxide film can be further suppressed from extending. The polysilicon film contributes to effectively suppressing the formation of crystal defects in the main surface of the silicon substrate 1.

Reference is now made to FIGS. 21 to 31 to describe first to fourth modifications of this embodiment.

First Modification

A first modification is illustrated with reference to FIGS. 21 and 22, which are, respectively, sectional views of first and second steps of the first modification.

Figure 21:
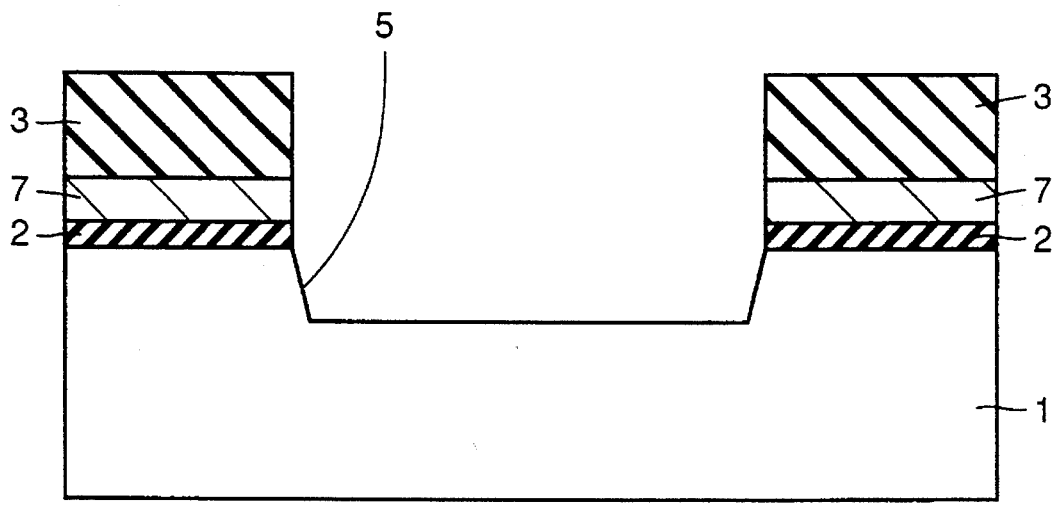
FIGS. 21 and 22 are, respectively, sectional views showing first and second steps of forming an element isolation oxide film according to a first modification in the second embodiment of the invention.

Referring to FIG. 21, a silicon nitride film 3, a polysilicon film 7 and an oxynitride film 2 are successively formed in the same manner as in the second embodiment, followed by patterning in a desired form. Using the patterned silicon nitride films 3 as a mask, the main surface of the silicon substrate is anisotropically etched to form a groove 5.

Figure 22:
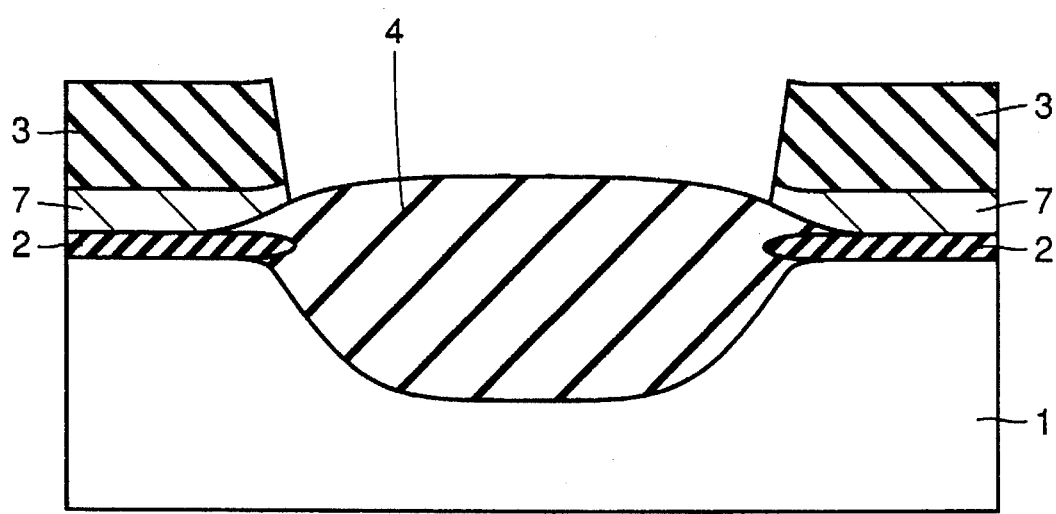

In FIG. 22, the exposed main surface of the silicon substrate 1 is thermally oxidized using the silicon nitride films 3 as a mask. Thus, an element isolation oxide film 4 is formed. In this modification, the groove 5 is formed, so that the difference in step between the upper surface of the element isolation oxide film 4 and the main surface of the silicon substrate 1 can be reduced over the case of the second embodiment.

Second Modification

A second modification is described with reference to FIGS. 23 to 25, which are, respectively, sectional views showing first to third steps of the second modification.

Figure 23:
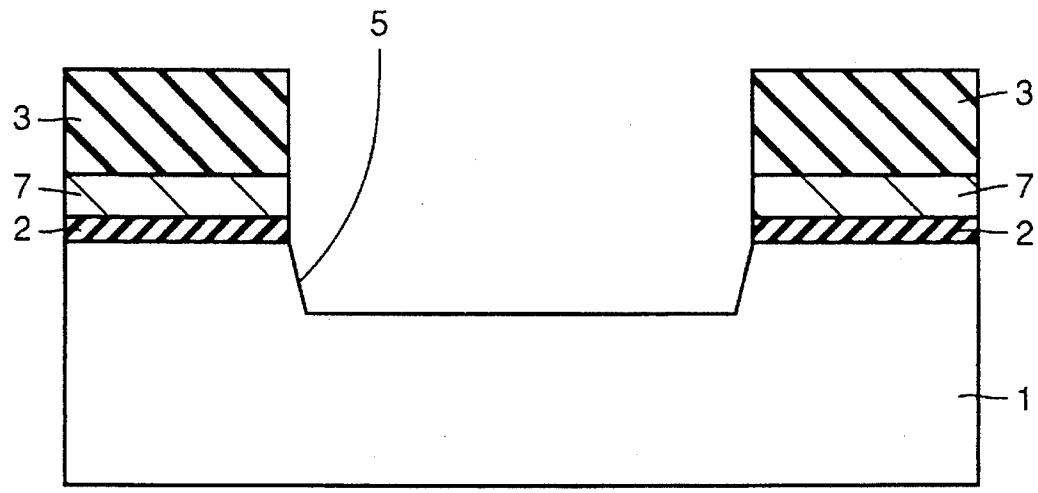
FIGS. 23 to 25 are, respectively, sectional views showing first to third steps of forming an element isolation oxide film according to a second modification in the second embodiment of the invention.
Figure 24:
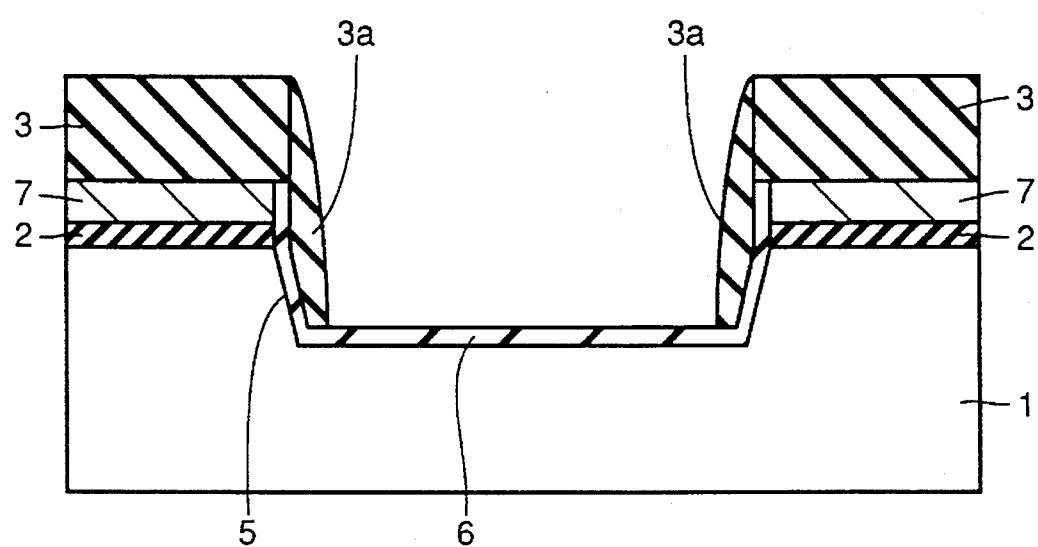

In FIG. 23, the steps including the step of forming the groove 5 are performed in the same manner as in the first modification. The surface of groove 5 is then thermally oxidized to form a silicon oxide film 6. Subsequently, a silicon nitride film 3a is formed such as by a CVD method to cover the silicon oxide film 6 and the silicon nitride film 3 therewith, followed by anisotropic etching of the silicon nitride film 3a thereby forming side wall insulating films 3a covering the side walls of the groove 5 as shown in FIG. 24.

Figure 25:
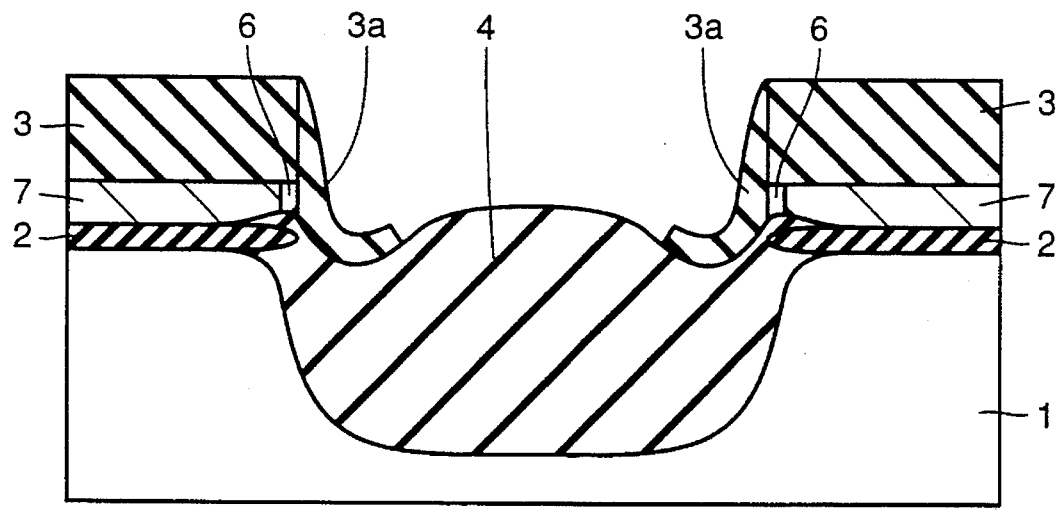

In FIG. 25, using the side wall insulating films 3a and the silicon nitride films 3 as a mask, the silicon substrate 1 is thermally oxidized on the main surface thereof. By this, an element isolation oxide film 4 is formed. In this modification, since the side wall insulating films 3a are formed, the extension of bird's beaks can be further reduced over the case of the above first modification of the second embodiment.

Third Modification

A third modification is described with reference to FIGS. 26 to 28, which are, respectively, sectional views showing first to third steps of the third modification.

Figure 26:
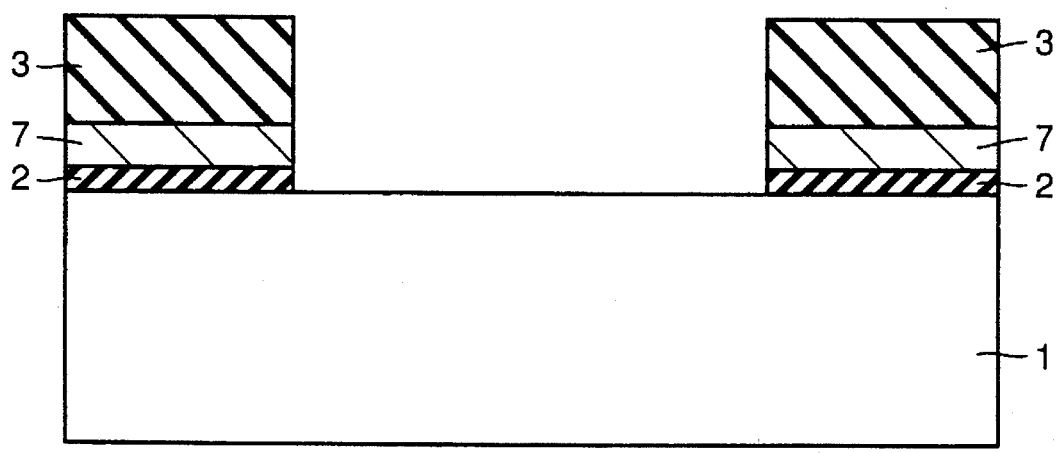
FIGS. 26 to 28 are, respectively, sectional views showing first to third steps of forming an element isolation oxide film according to a third modification in the second embodiment of the invention.
Figure 27:
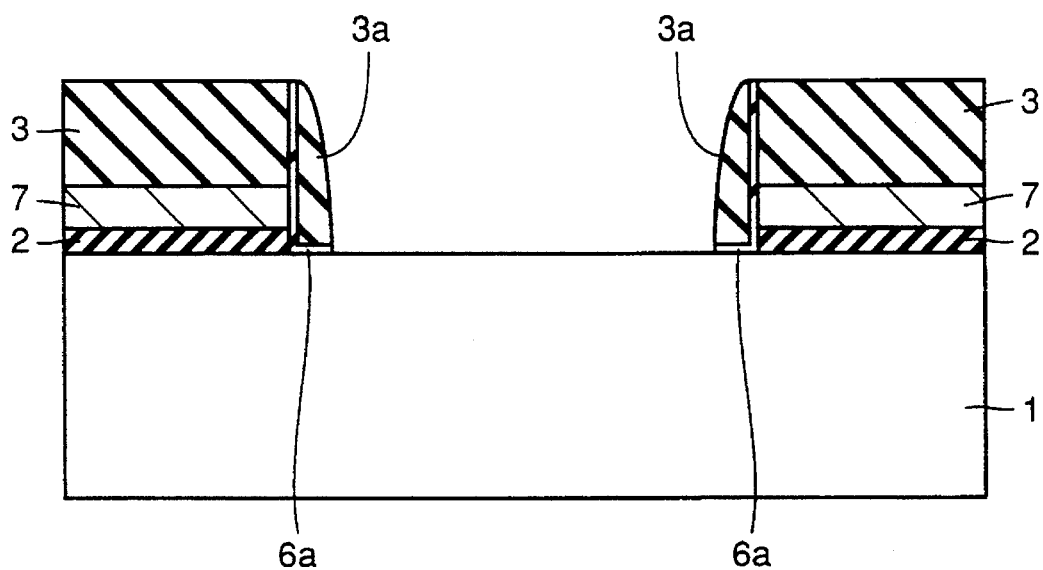

Referring to FIG. 26, an oxynitride film 2, a polysilicon film 7 and a silicon nitride film 3 are successively formed in the same manner as in the second embodiment, followed by patterning of these films in a desired form. As shown in FIG. 27, a silicon oxide film 6a and a silicon nitride film 3a are successively deposited such as by a CVD method. Subsequently, the silicon nitride film 3a and the silicon oxide film 6a are subjected to anisotropic etching thereby leaving the silicon oxide films 6a and side wall insulating films 3a to cover the side walls made of the silicon nitride film 3, polysilicon film 7 and oxynitride film 2.

Figure 28:
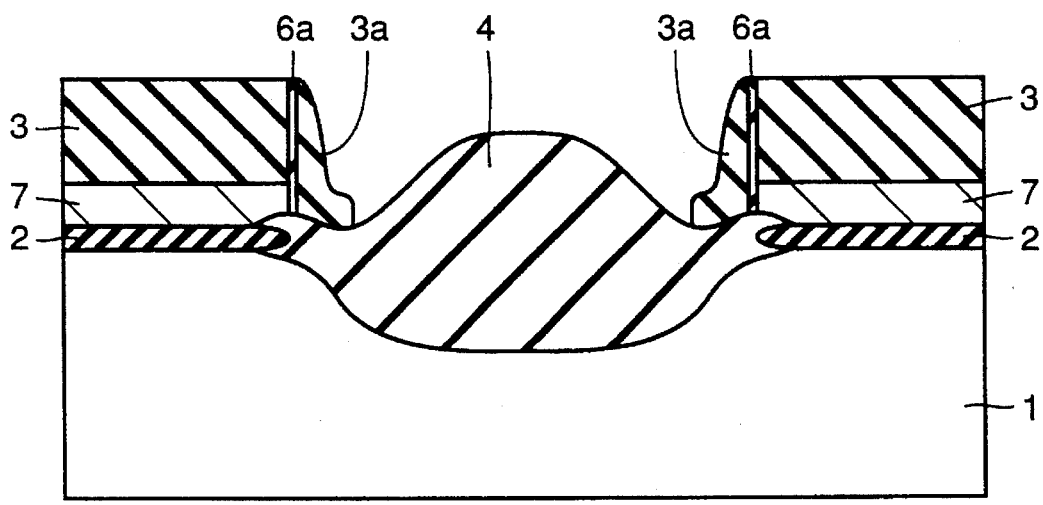

Referring to FIG. 28, the silicon substrate 1 is thermally oxidized at the main surface thereof using the side wall insulating films 3a and the silicon nitride films 3 as a mask, thereby forming an element isolation oxide film 4. In the case, the side wall insulating films 3a are formed, so that the bird's beak extension can be effectively suppressed from the element isolation oxide film 4.

Fourth Modification

A fourth modification is described with reference to FIGS. 29 to 31, which are, respectively, sectional views showing first to third steps of the modification.

Figure 29:
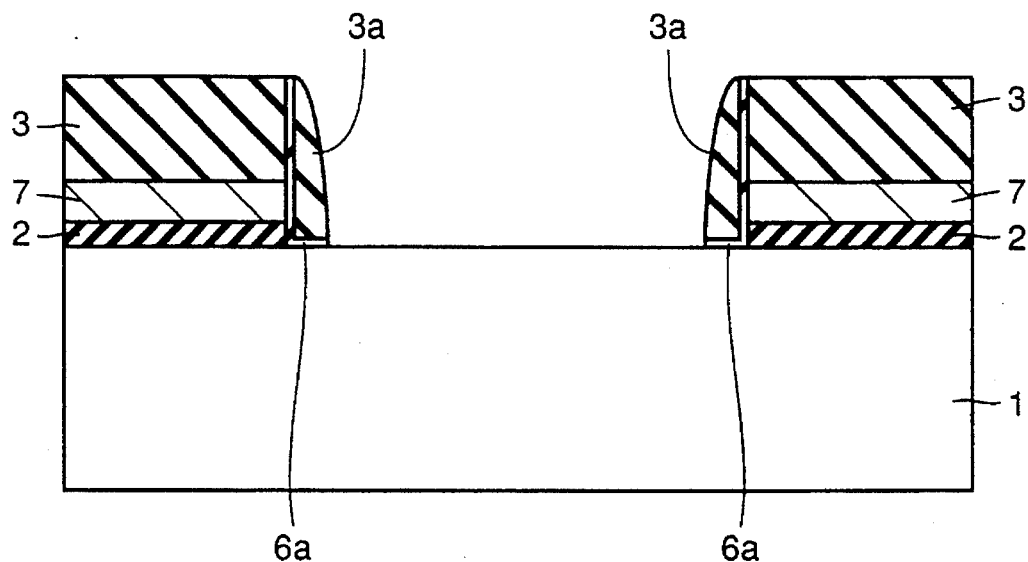
FIGS. 29 to 31 are, respectively, sectional views showing first to third steps of forming an element isolation oxide film according to a fourth modification in the second embodiment of the invention.
Figure 30:
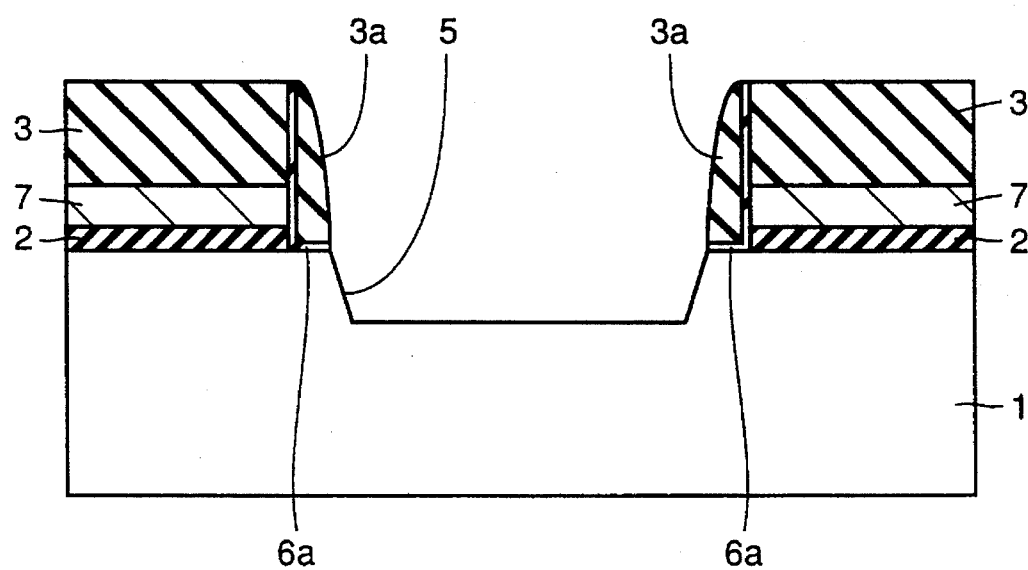

Referring to FIG. 29, the steps including the step of forming the side wall insulating films 3a are performed in the same manner as in the third modification of this embodiment. Using the side wall insulating films 3a and the silicon nitride films 3 as a mask, the silicon substrate 1 is anisotropically etched at the main surface thereof to form a groove 5 as shown in FIG. 30.

Figure 31:
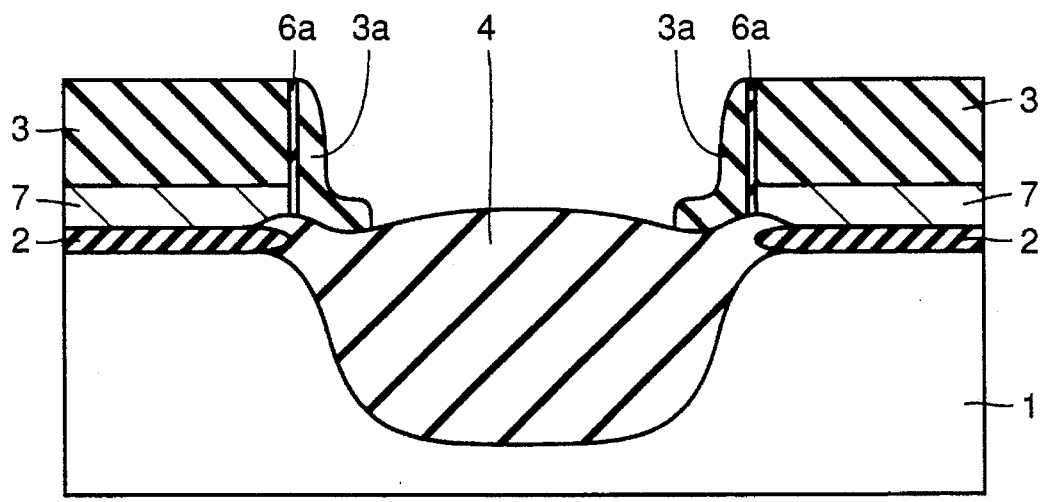

In FIG. 31, using the side wall insulating films 3a and the silicon nitride films 3 as a mask, the main surface of the silicon substrate 1 is thermally oxidized to form an element isolation oxide film 4.

In this modification, the extension of the bird's peaks can be reduced and the difference in step between the upper surface of the element isolation oxide film 4 and the main surface of the silicon substrate 1 can also be reduced.

Third Embodiment

Figure 32:
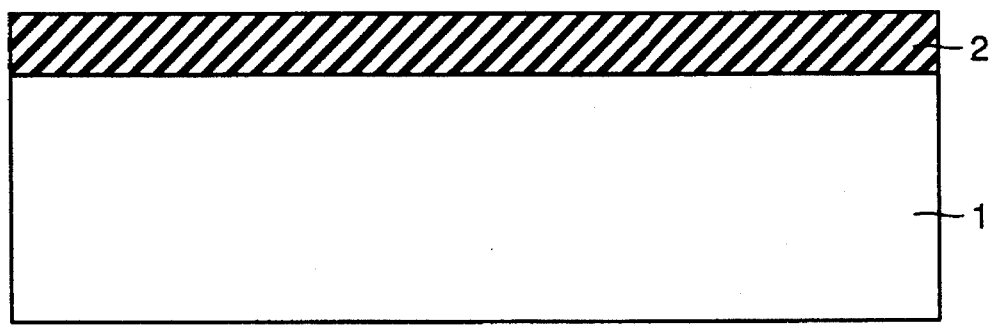
FIGS. 32 to 34 are, respectively, sectional views showing first to third steps of forming an element isolation oxide film according to a third embodiment of the invention.
Figure 33:
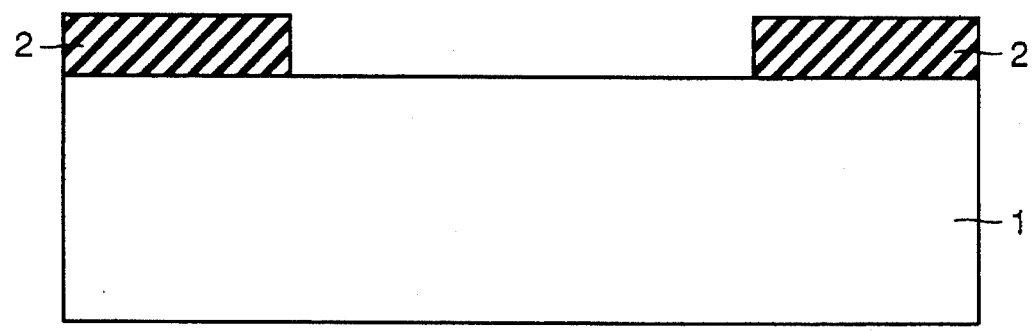
Figure 34:
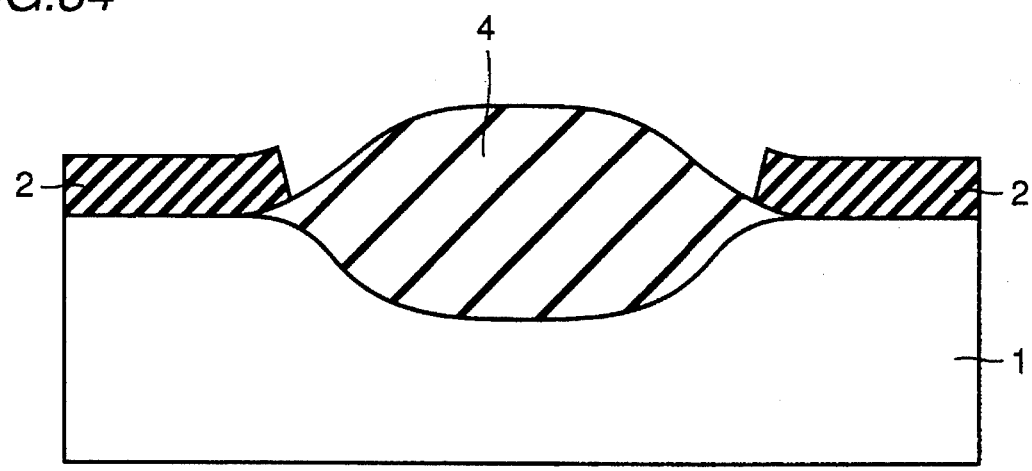
Figure 35:
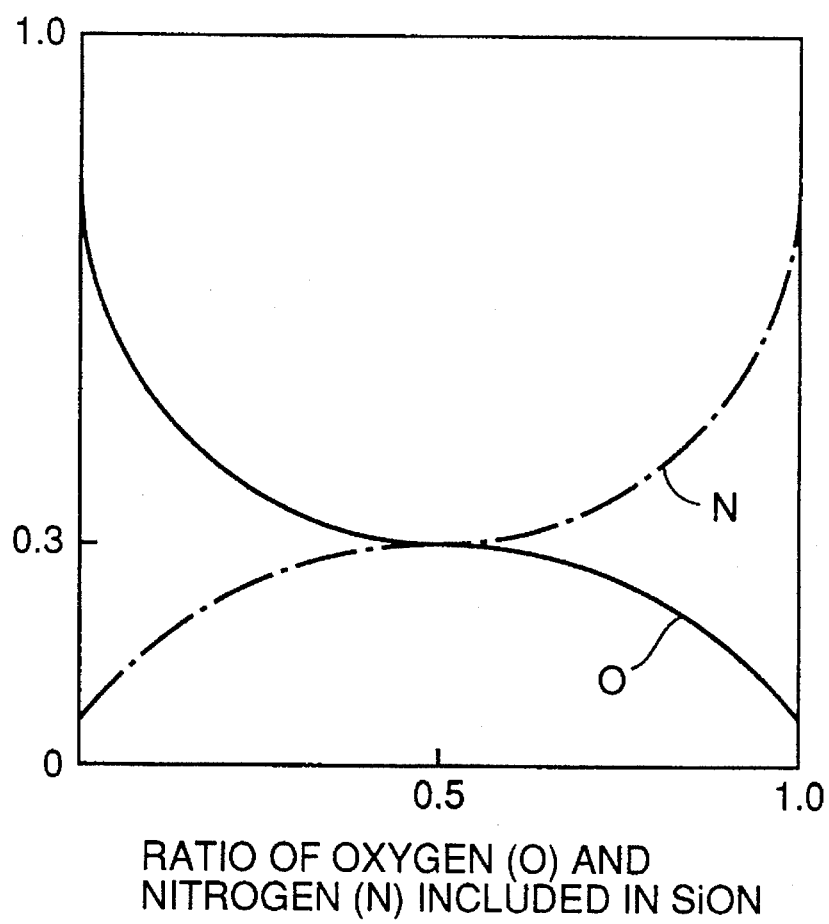
FIG. 35 is a graph showing the relation between the compositional ratio of O (oxygen) and that of N (nitrogen) in the thickness direction of an oxynitride film formed according to a further aspect of the invention.

A third embodiment and modifications of the invention are described with reference of FIGS. 32 to 59. FIGS. 32 to 34 are, respectively, sectional views showing first to third steps of forming an element isolation oxide film in accordance with the third embodiment of the invention.

Referring to FIG. 32, an oxynitride film 2 is formed on the main surface of a silicon substrate 1 while appropriately controlling feeds of $SiH_2Cl_2$, $NH_3$ and $N_2O$ in the same manner as in the first embodiment. In this embodiment, the feeds of the respective gases are so controlled that the oxynitride film 2 has a portion having a composition close to that of a silicon nitride in a thickness greater than with the case of the first embodiment. More particularly, the oxynitride film 2 is so formed that a ratio between the oxygen (O) and the nitrogen (N) in the oxynitride film 2 along the thickness thereof has the tendency shown in FIG. 35.

As shown in FIG. 33, the oxynitride film 2 is patterned in a desired form in the same manner as in the first embodiment. Using the patterned oxynitride film 2 as a mask, the main surface of the silicon substrate 1 is subjected to thermal oxidation thereby forming an element isolation oxide film 4.

Since the surface layer portion of the oxynitride film 2 has a composition very close to that of a silicon nitride film, the film 2 is able to function as a mask at the time of the thermal oxidation. Moreover, the oxynitride film 2 has, at a bottom thereof (i.e., a portion positioned at the side of the main surface of the silicon substrate), a composition very close to that of a silicon oxide and partly becomes a part of the element isolation oxide film 4. The oxynitride film 2 of this embodiment has a good stress relaxing function like the case of the first embodiment. Accordingly, the bottom portion of the oxynitride film 2 having a very close composition as a silicon oxide film can be made thin. This contributes to suppressing the extension of the bird's beaks of the element isolation oxide film 4.

The modifications of this embodiment are described with reference to FIGS. 36 to 59.

First Modification

Figure 36:
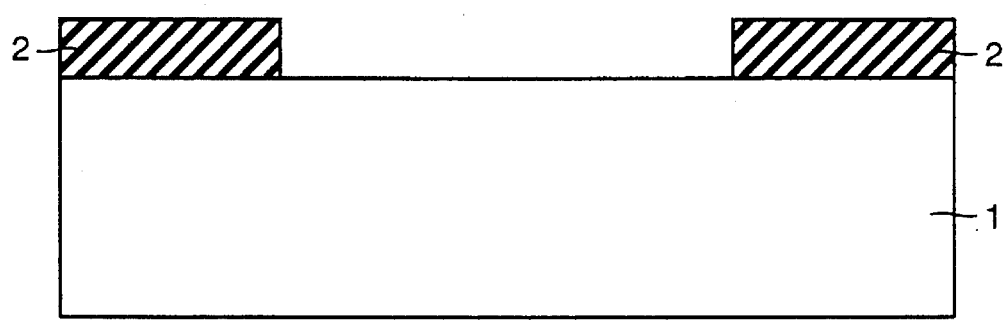
FIGS. 36 to 38 are, respectively, sectional views showing first to third steps of forming an element isolation oxide film according to a first modification in the third embodiment of the invention.
Figure 37:
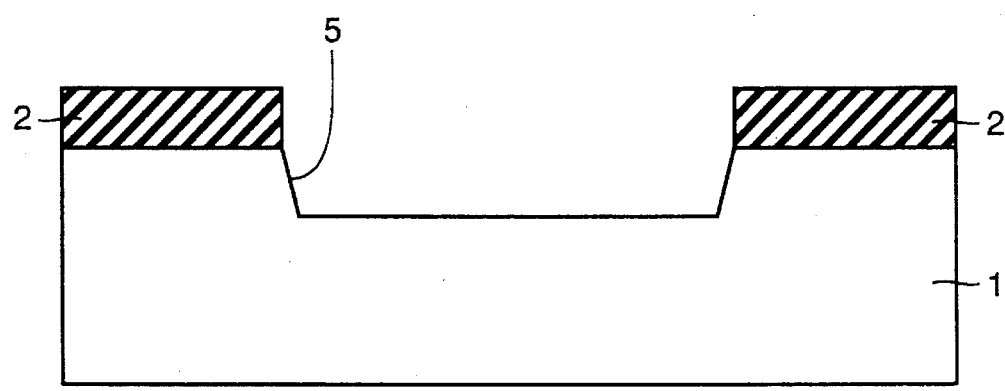
Figure 38:
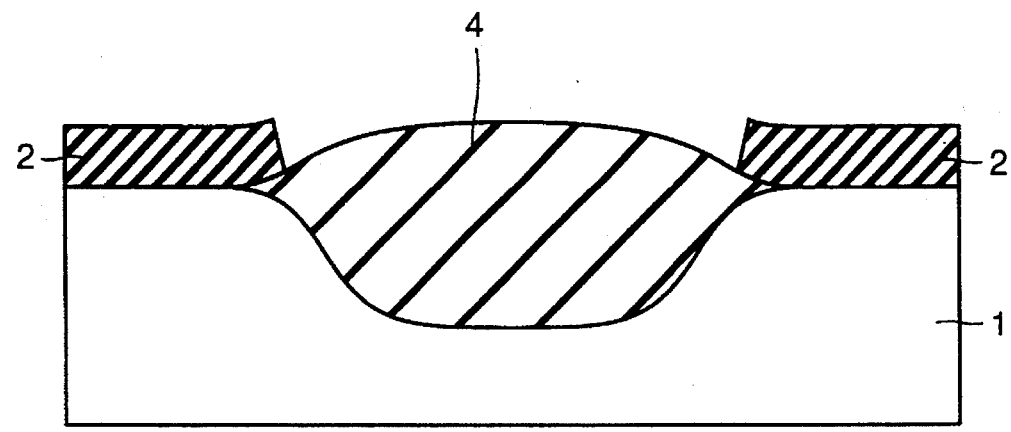

Referring to FIGS. 36 to 38, a first modification of this embodiment is described. FIGS. 36 to 38 are, respectively, sectional views showing first to third steps of the first modification.

As shown in FIG. 36, an oxynitride film 2 is formed and patterned in a desired form in the same manner as in the third embodiment. Using the patterned oxynitride films 2 as a mask, the main surface of the silicon substrate 1 is anisotropically etched to form a groove 5. This is particularly shown in FIG. 37.

In FIG. 38, the main surface of the silicon substrate 1 is thermally oxidized with the mask of the oxynitride films 2 used as a mask to form an element isolation oxide film 4. In this modification, the groove 5 is formed, so that the difference in step between the upper surface of the element isolation oxide film 4 and the main surface of the silicon substrate 1 can be reduced over the case of the third embodiment.

Second Modification

A second modification of the embodiment is described with reference to FIGS. 39 to 42, which are, respectively, sectional views showing first to fourth steps of the second modification.

Figure 39:
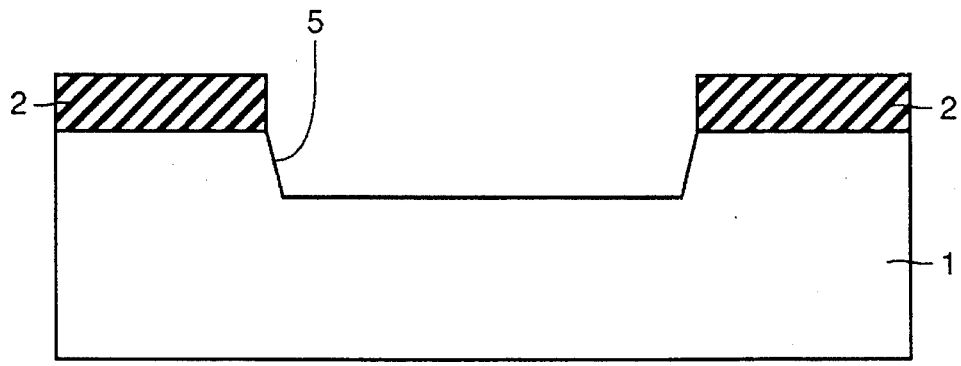
FIGS. 39 to 42 are, respectively, sectional views showing first to fourth steps of forming an element isolation oxide film according to a second modification in the third embodiment of the invention.
Figure 40:
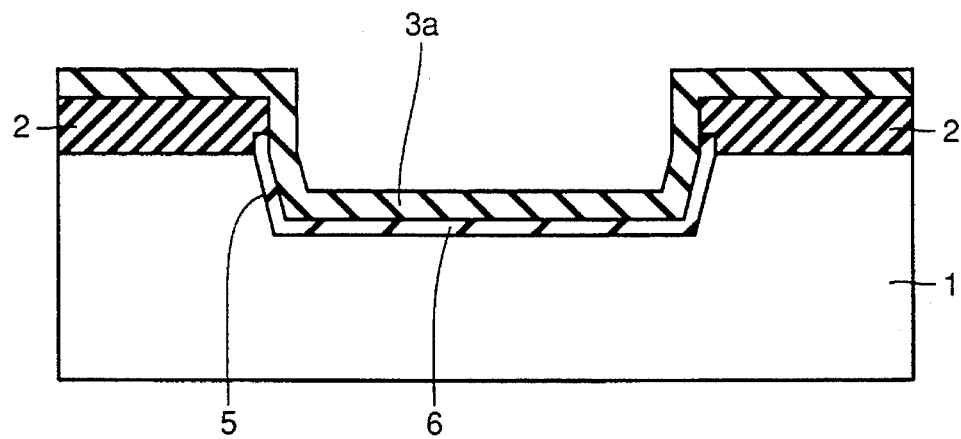

Referring to FIG. 39, the steps including the step of forming the groove 5 are performed in the same manner as in the first modification of this embodiment. As shown in FIG. 40, the main surface of the silicon substrate 1 is subjected to thermal oxidation to form a silicon oxide film 6 on the surface of the groove 5. Thereafter, a silicon nitride film 3a is formed by a CVD method or the like to cover the oxynitride film 2 and the groove 5 therewith.

Figure 41:
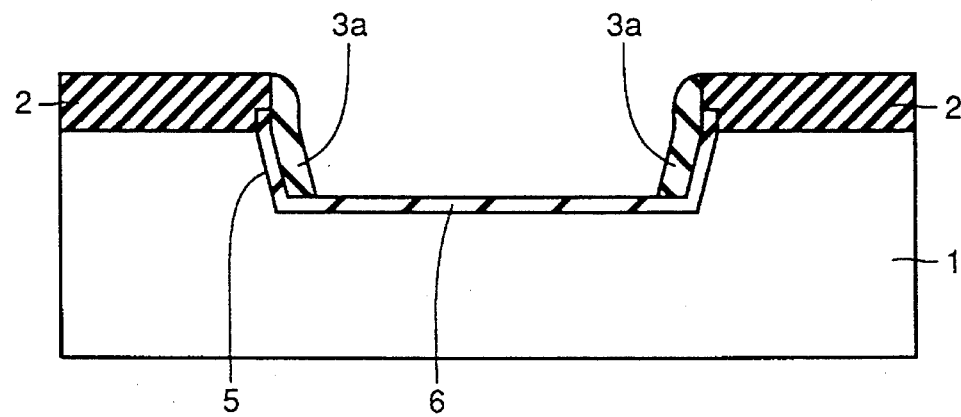

Referring to FIG. 41, the silicon nitride film 3a is subjected to anisotropic etching to form side wall insulating films 3a on the side walls of the groove 5 and the side walls of the oxynitride films 2.

Figure 42:
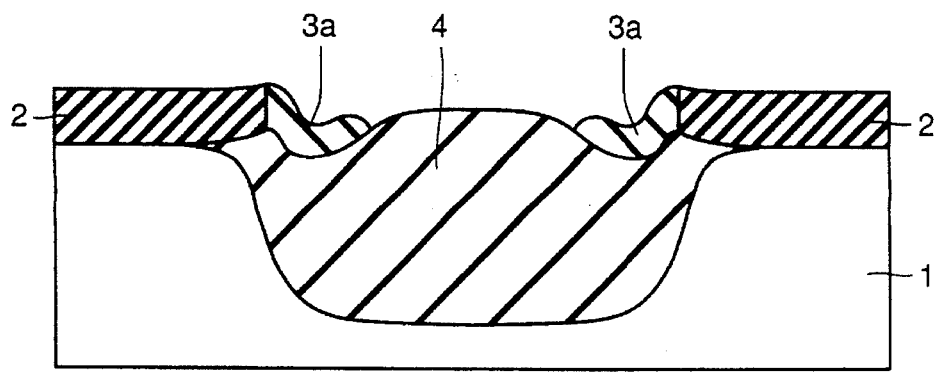

In FIG. 42, the main surface of the silicon substrate 1 is thermally oxidized using the side wall insulating films 3a and the oxynitride films 2 as a mask. By this, an element isolation oxide film 4 is formed as shown. In this modification, since the side wall insulating films 3a are formed, it is expected to further suppress the extension of the bird's beaks of the element isolation oxide film 4.

Third Modification

Figure 43:
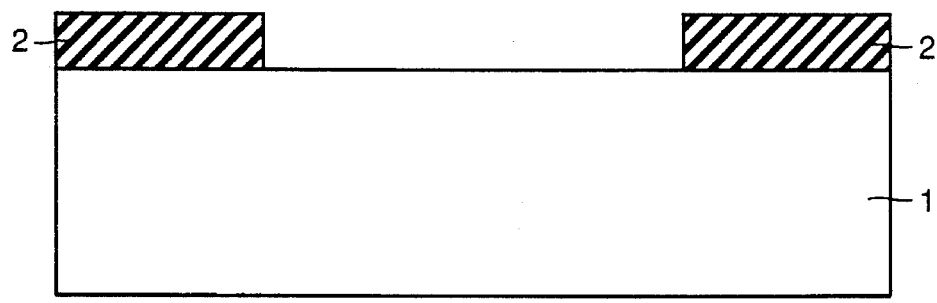
FIGS. 43 to 45 are, respectively, sectional views showing first to third steps of forming an element isolation oxide film according to a third modification in the third embodiment of the invention.
Figure 44:
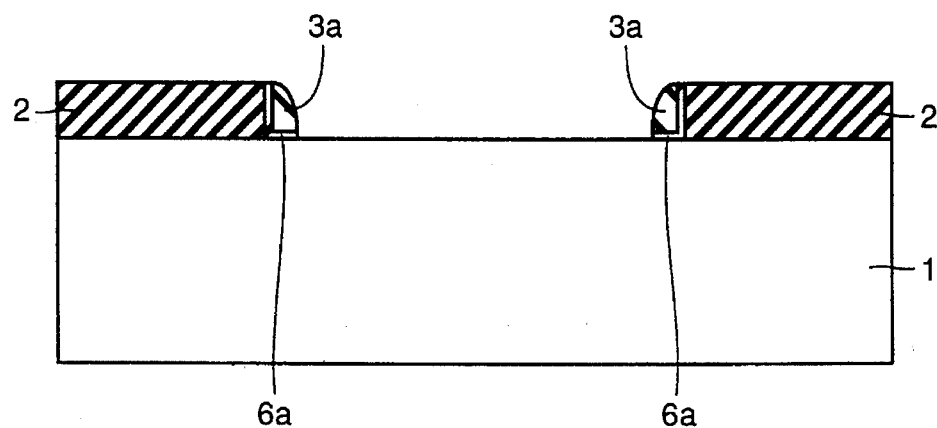
Figure 45:
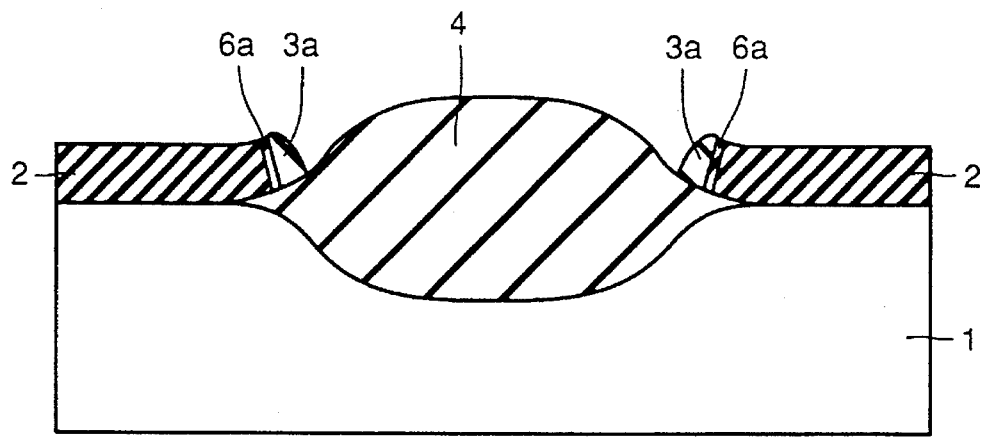

Using FIGS. 43 to 45, a third modification of this embodiment is described. FIGS. 43 to 45 are, respectively, sectional views of first to third steps of this modification.

Reference is made to FIG. 43, wherein an oxynitride film 2 is formed and patterned in a desired form in the same manner as in the third embodiment. As shown in FIG. 44, a silicon oxide film 6a and a silicon nitride film 3a are successively formed to cover the oxynitride film 2 and the main surface of the silicon substrate 1 such as by a CVD method. The silicon nitride film 3a and the silicon oxide film 6a are successively anisotropically etched, leaving the silicon oxide film 6a to cover the side surfaces of the oxynitride film 2 and also side wall insulating films 3a on the silicon oxide films 6a.

Referring to FIG. 45, the main surface of the silicon substrate 1 is subjected to thermal oxidation with the side wall insulating films 3a and the oxynitride films 2 using as a mask, thereby forming an element isolation oxide film 4. In this modification, the side wall insulating films 3a are formed, with the possibility that the extension of the bird's beaks of the element isolation oxide film 4 is more suppressed than in the case of the first modification.

Fourth Modification

A fourth modification of this embodiment is described with reference to FIGS. 46 to 48, which are, respectively, sectional views of first to third steps of the fourth modification.

Figure 46:
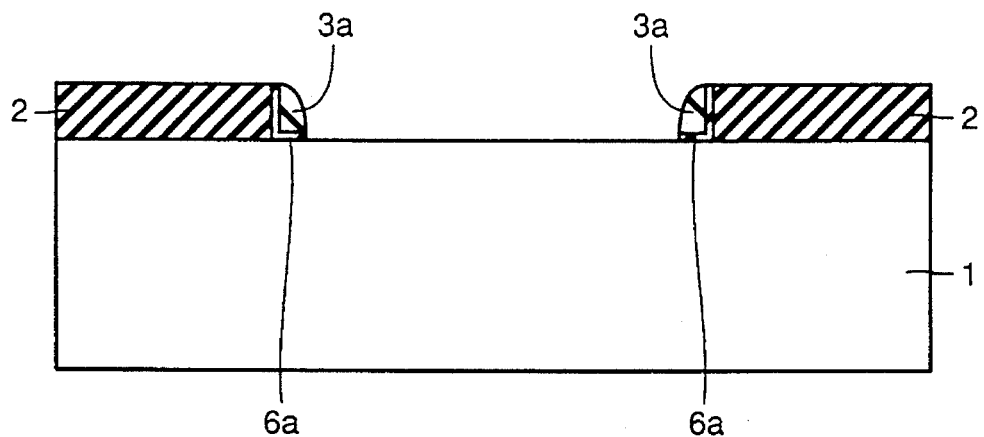
FIGS. 46 to 48 are, respectively, sectional views showing first to third steps of forming an element isolation oxide film according to a fourth modification in the third embodiment of the invention.
Figure 47:
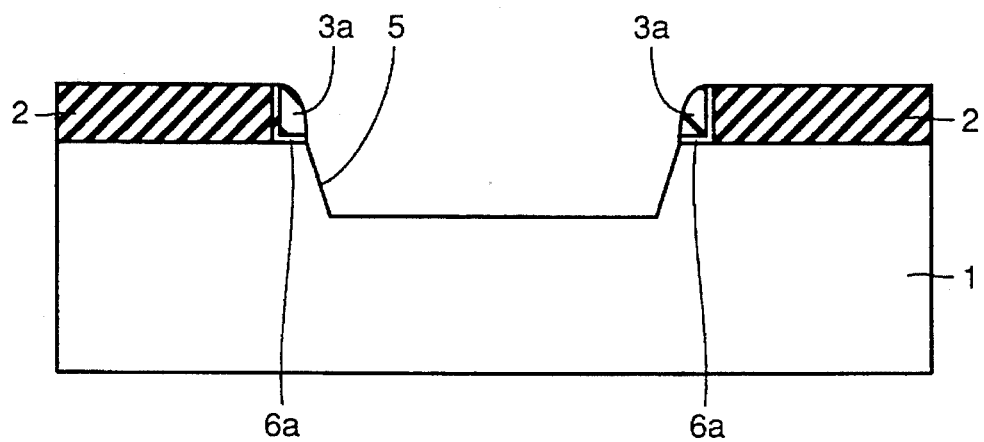

In FIG. 46, the same steps as those of the third modification of this embodiment are performed to form side wall insulating films 3a. Referring to FIG. 47, using the side wall insulating films 3a and the oxynitride films 2 as a mask, the main surface of the silicon substrate 1 is anisotropically etched to form a groove 5.

Figure 48:
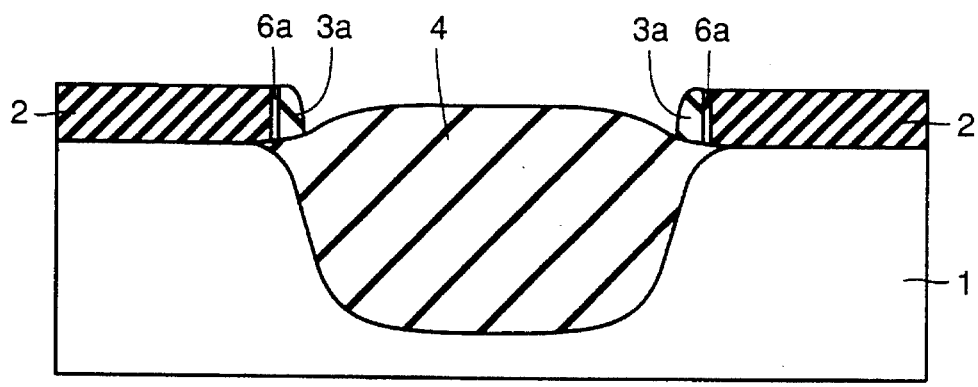

In FIG. 48, using the side wall insulating films 3a and the oxynitride films 2 as a mask, the main surface of the silicon substrate 1 is thermally oxidized, thereby forming an element isolation oxide film 4 as shown. In this modification, the difference in step between the upper surface of the element isolation oxide film 4 and the main surface of the silicon substrate 1 can be reduced. Additionally, the bird's beak extension of the element isolation oxide film 4 can be suppressed.

Fifth Modification

Referring to FIGS. 49 to 53, a fifth modification of this embodiment is described. FIGS. 49 to 53 are, respectively, sectional views showing first to fifth steps of the fifth modification of this embodiment.

Figure 49:
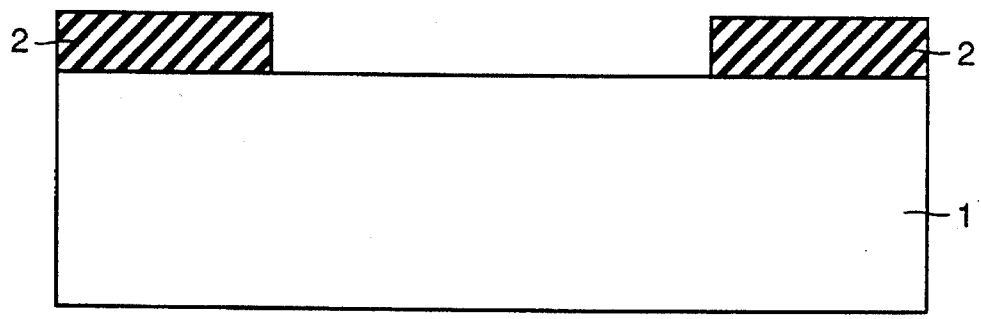
FIGS. 49 to 53 are, respectively, sectional views showing first to fifth steps of forming an element isolation oxide film according to a fifth modification in the third embodiment of the invention.
Figure 50:
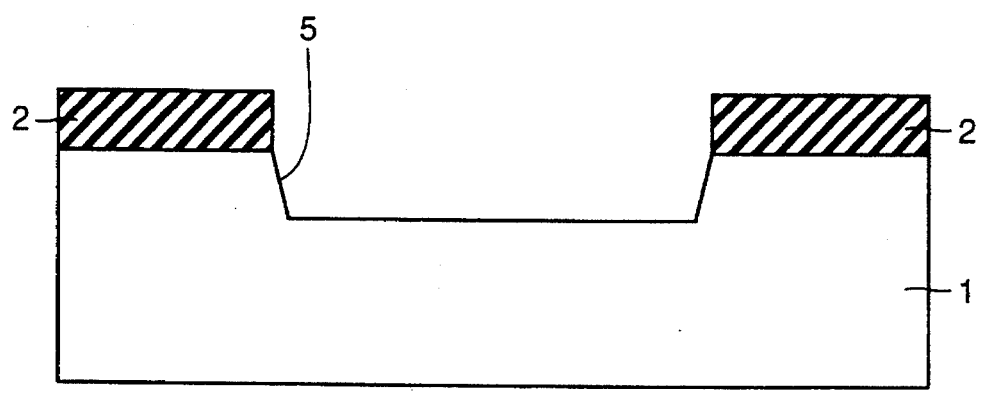

Referring to FIG. 49, the same steps as those of the third embodiment are repeated to form an oxynitride film 2, followed by patterning in a desired form. Thereafter, as shown in FIG. 50, the silicon substrate 1 is anisotropically etched on the main surface thereof with the oxynitride films 2 using as a mask. By this, a groove 5 is formed.

Figure 51:
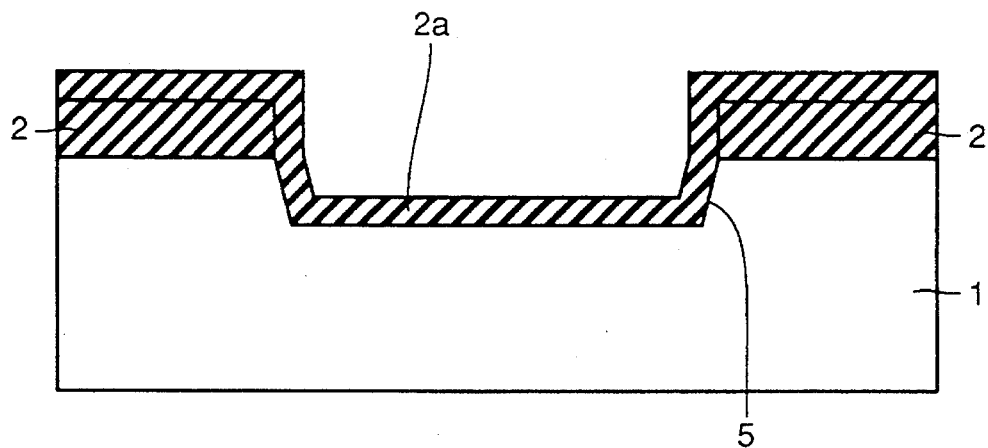
Figure 52:
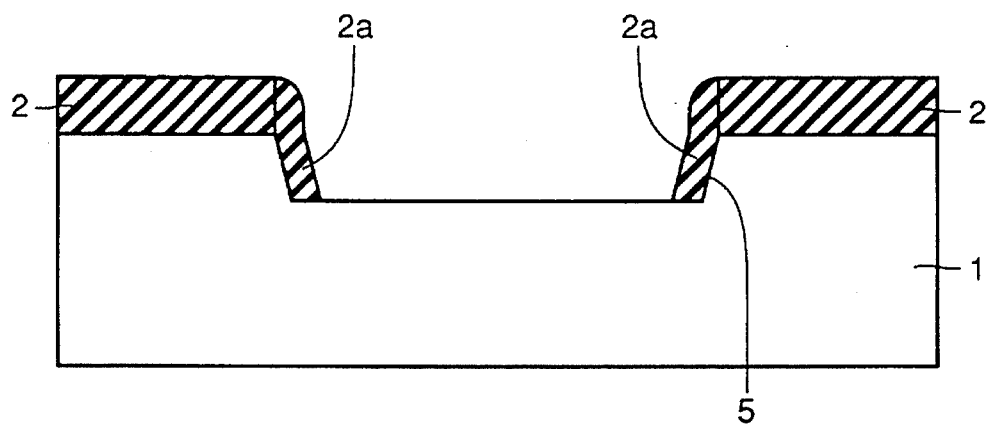

Reference is made to FIG. 51 wherein an oxynitride film 2a is formed to cover the groove 5 and the oxynitride film 2 in the same manner as in the third embodiment. The oxynitride film 2a is then subjected to anisotropic etching, thereby forming side wall insulating films 2a to cover the side walls of the groove 5 and the side surfaces of the oxynitride films 2 as shown in FIG. 52.

Figure 53:
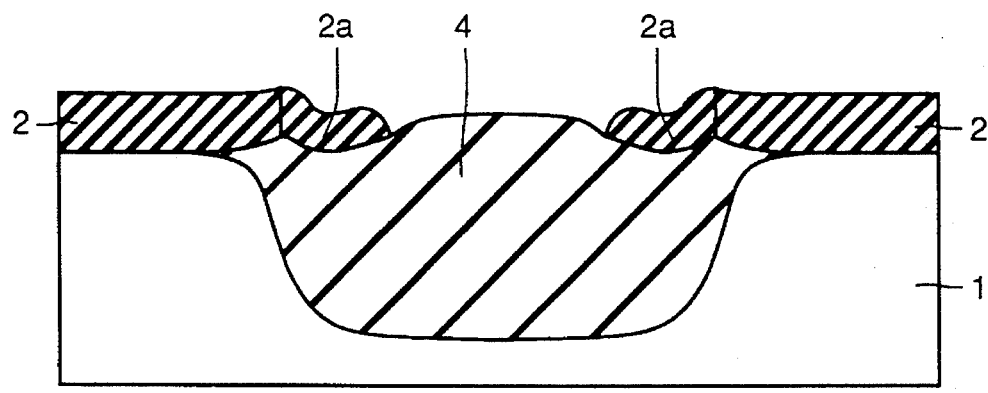

In FIG. 53, using the side wall insulating films 2a and the oxynitride films 2 as a mask, the main surface of the silicon substrate 1 is thermally oxidized. As a result, an element isolation oxide film 4 is formed.

As set out hereinabove, in this modification, the oxynitride films are used as the side wall insulating films 2a, enabling one to make the element isolation oxide film 4 whose recess is smaller than in the case using silicon nitride films as side wall insulating films. This makes it possible to make the element isolation oxide film 4 whose surface is more flattened than in the case of the second modification of this embodiment.

Sixth Modification

Figure 54:
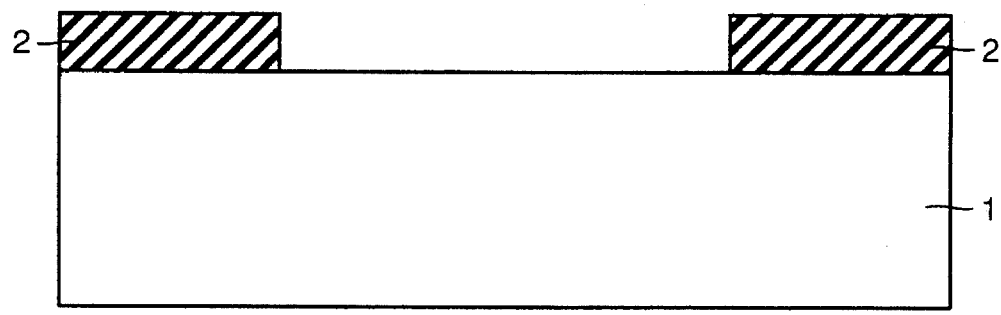
FIGS. 54 to 56 are, respectively, sectional views showing first to third steps of forming an element isolation oxide film according to a sixth modification in the third embodiment of the invention.
Figure 55:
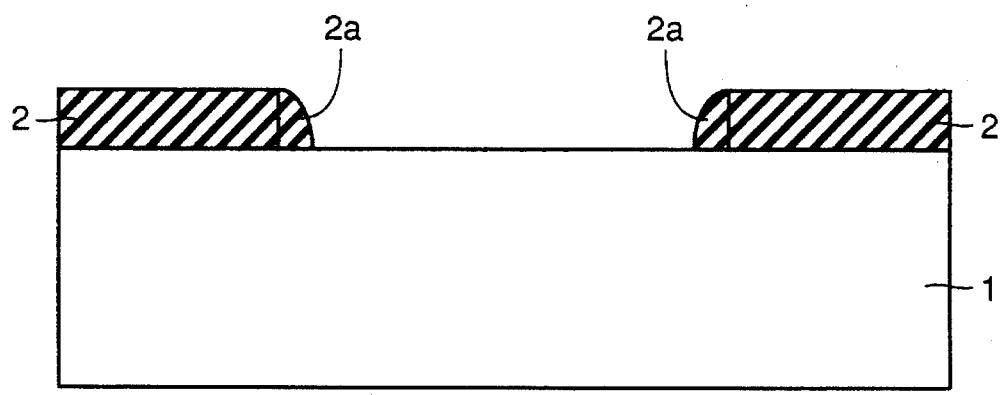
Figure 56:
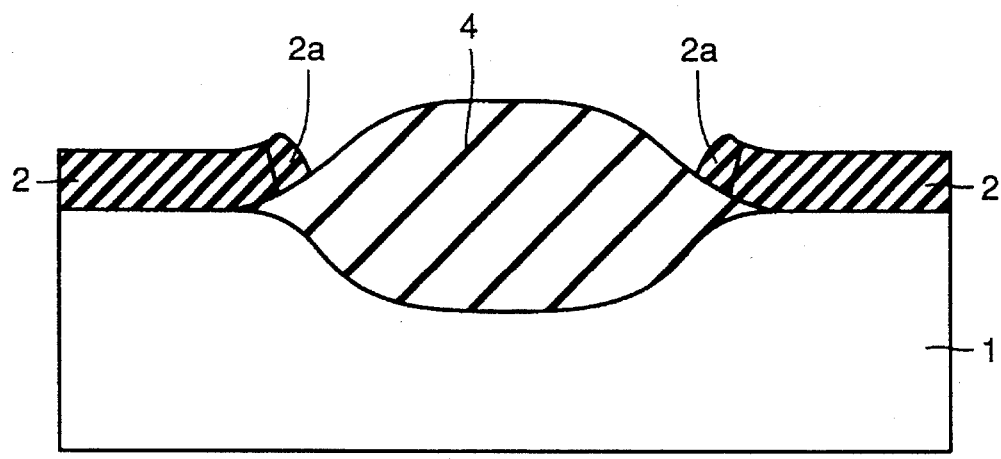

FIGS. 54 to 56 show a sixth modification of this embodiment, which are, respectively, first to third steps of the sixth modification of the embodiment.

Reference is made to FIG. 54 wherein the same steps as those of the third embodiment are repeated to form an oxynitride film 2, followed by patterning. Next, as shown in FIG. 55, an oxynitride film 2a is formed to cover the oxynitride film 2 and the main surface of the silicon substrate 1 in the same manner as in the third embodiment. Then, the oxynitride film 2a is subjected to anisotropic etching to form side wall insulating films 2a.

Reference is now made to FIG. 56 wherein the main surface of the silicon substrate 1 is thermally oxidized using the side all insulating films 2a and the oxynitride films 2 as a mask. Thereby an element isolation oxide film 4 is formed. According to this modification, the resultant element isolation oxide film 4 has, in the vicinity of edge portions thereof, surfaces whose recesses are smaller than in the case of the third modification of this embodiment.

Seventh Modification

Figure 57:
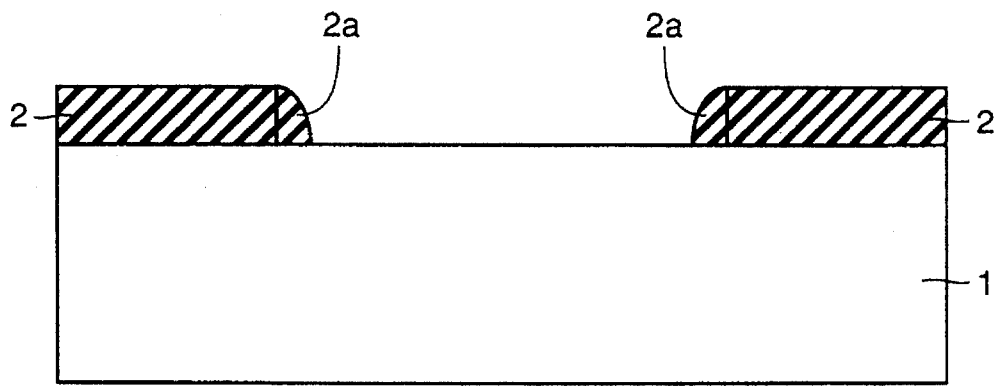
FIGS. 57 to 59 are, respectively, sectional views showing first to third steps of forming an element isolation oxide film according to a seventh modification in the third embodiment of the invention.
Figure 58:
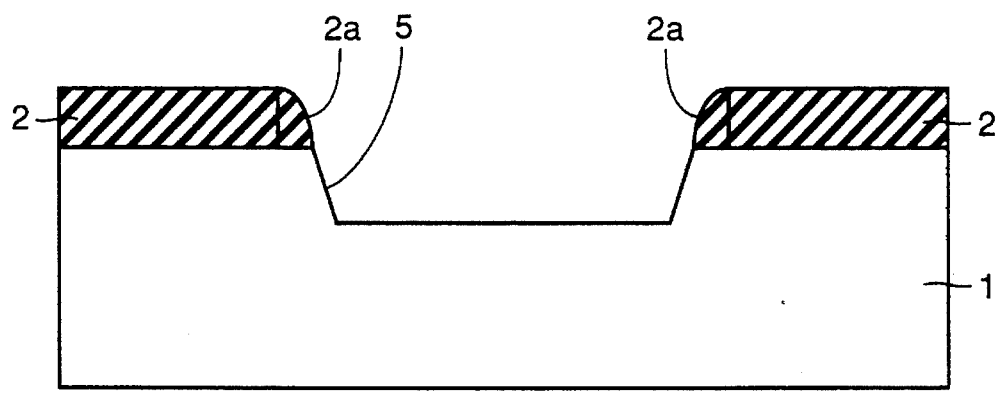
Figure 59:
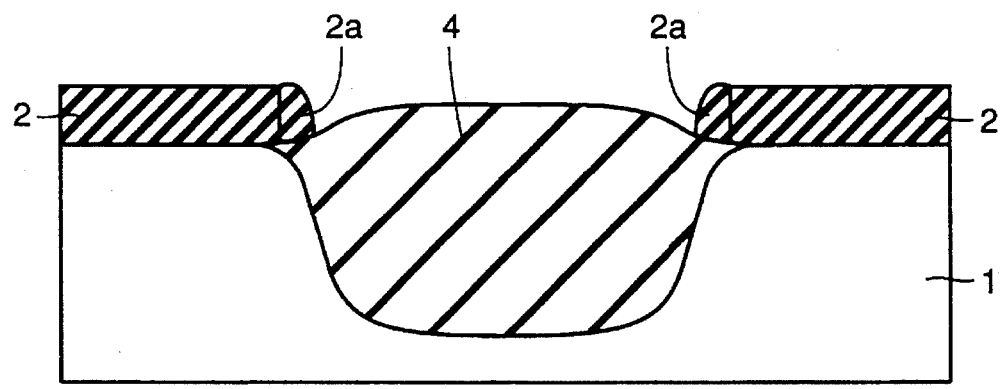

With reference to FIGS. 57 to 59, a seventh modification of the embodiment is described. FIGS. 57 to 59 are, respectively, sectional views showing first to third steps of the seventh modification of the embodiment.

Reference is made to FIG. 57, wherein the same steps as those of the sixth modification are repeated to form side wall insulating films 2a. Using the side wall insulating films 2a and the oxynitride films 2 as a mask, the main surface of the silicon substrate 1 is subjected to anisotropic etching to form a groove 5.

In FIG. 59, using the side wall insulting films 2a and the oxynitride films 2 as a mask, the main surface of the silicon substrate 1 is thermally oxidized thereby forming an element isolation oxide film 4. In accordance with this modification, the surface of the element isolation oxide film 4 can be made more flattened than in the case of the fourth modification.

Fourth Embodiment

Using FIGS. 60 to 87, a fourth embodiment and its modifications of the invention are described. FIGS. 60 to 65 are, respectively, sectional views showing first to sixth steps of the fourth embodiment.

Figure 60:
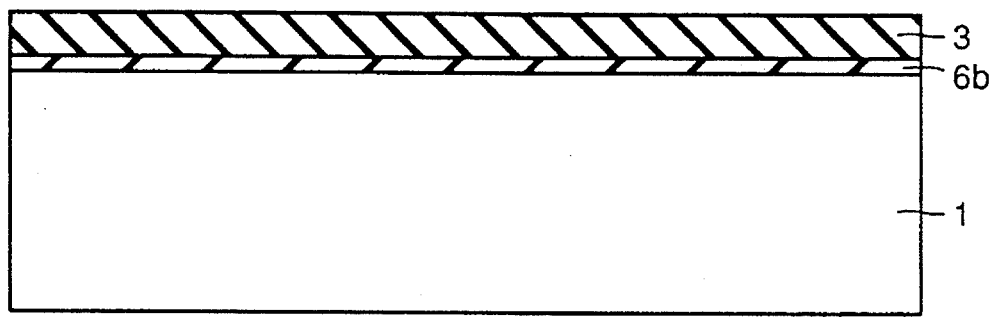
FIGS. 60 to 65 are, respectively, sectional views showing first to sixth steps of forming an element isolation oxide film according to a fourth embodiment of the invention.

Reference is made to FIG. 60 wherein a silicon oxide film 6b is formed on a main surface of a silicon substrate 1 according to a thermal oxidation method or a CVD method, followed by further formation of a silicon nitride film 3 on the silicon oxide film 6b according to a CVD method or the like.

Figure 61:
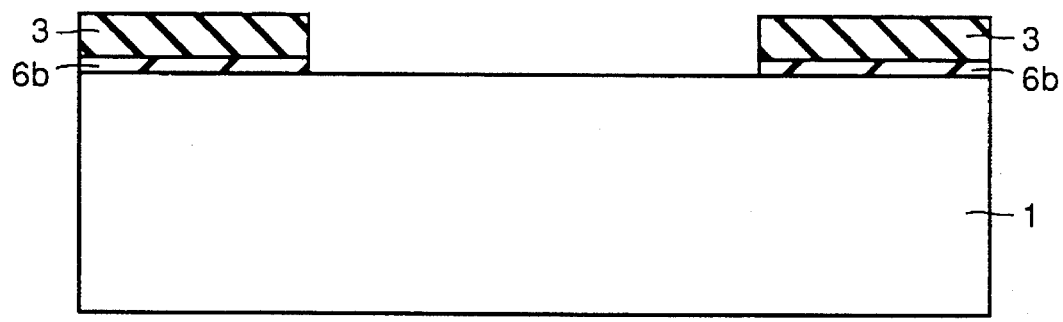
Figure 62:
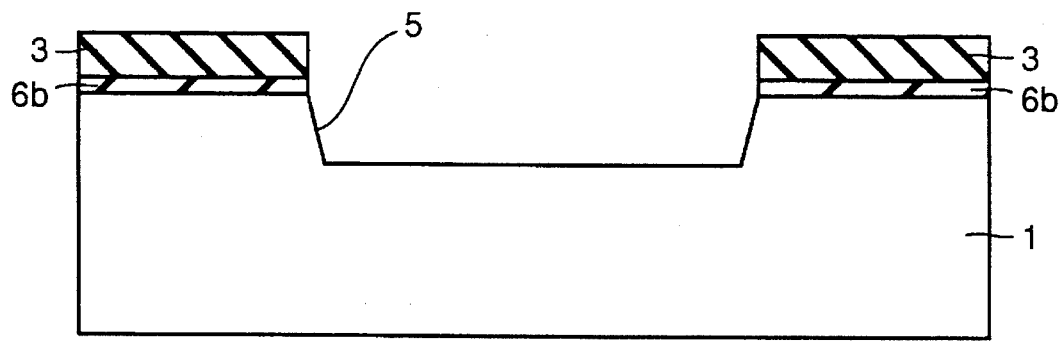

In FIG. 61, the silicon nitride film 3 and the silicon oxide film 6 are successively subjected to anisotropic etching to obtain a desired pattern of the silicon nitride film 3 and the silicon oxide film 6. As shown in FIG. 62, using the silicon nitride films 3 as a mask, the main surface of the silicon substrate 1 is subjected to anisotropic etching to form a groove 5.

Figure 63:
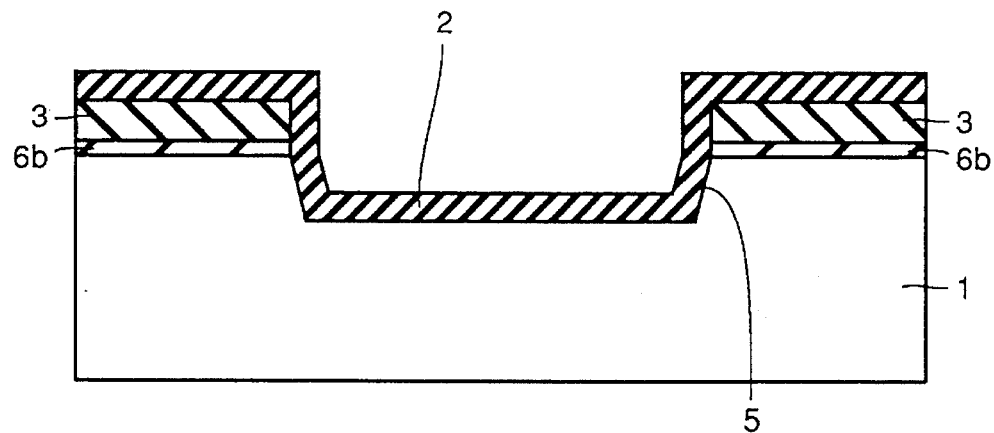
Figure 64:
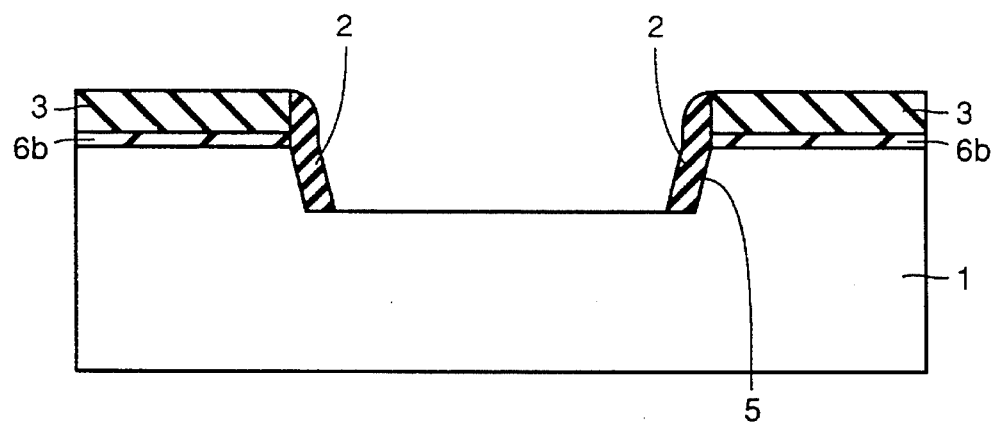

Reference is made to FIG. 63, an oxynitride film 2 is formed to cover the groove 5 and the silicon nitride film 3 in the same manner as in the first embodiment. The oxynitride film 2 is then subjected to anisotropic etching. By this, the side wall insulating films 2 are formed to cover the side walls of the groove 5 and the side surfaces of the silicon nitride film 3 as shown in FIG. 64.

Figure 65:
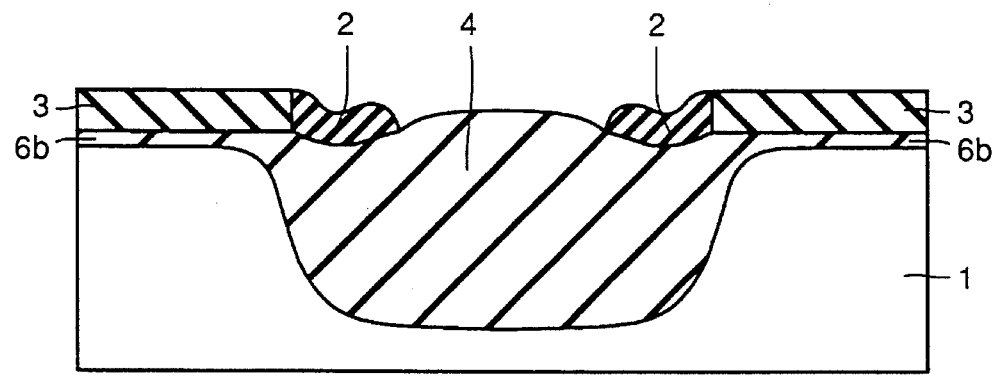

Referring to FIG. 65, the main surface of the silicon substrate 1 is thermally oxidized with the side wall insulating films 2 and the silicon nitride films 3 using as a mask. Thus, an element isolation oxide film 4 is formed. According to this embodiment, since the oxynitride film is used as the side wall insulating films 2, the recess on the surface of the element isolation oxide film 4 can be made small. More particularly, the surface of the element isolation oxide film 4 can be flattened.

Modifications of this embodiment are described with reference to FIGS. 66 to 87.

First Modification

Referring to FIGS. 66 to 69, a first modification of this embodiment is illustrated, which figures are, respectively, first to fourth steps of the first modification in this embodiment.

Figure 66:
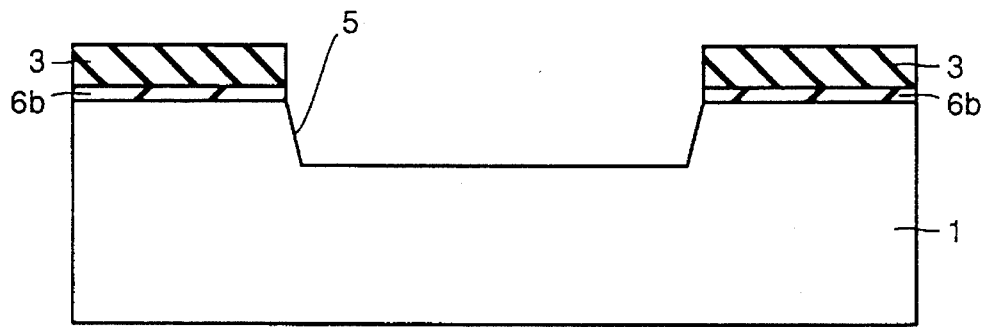
FIGS. 66 to 69 are, respectively, sectional views showing first to fourth steps of forming an element isolation oxide film according to a first modification in the fourth embodiment of the invention.
Figure 67:
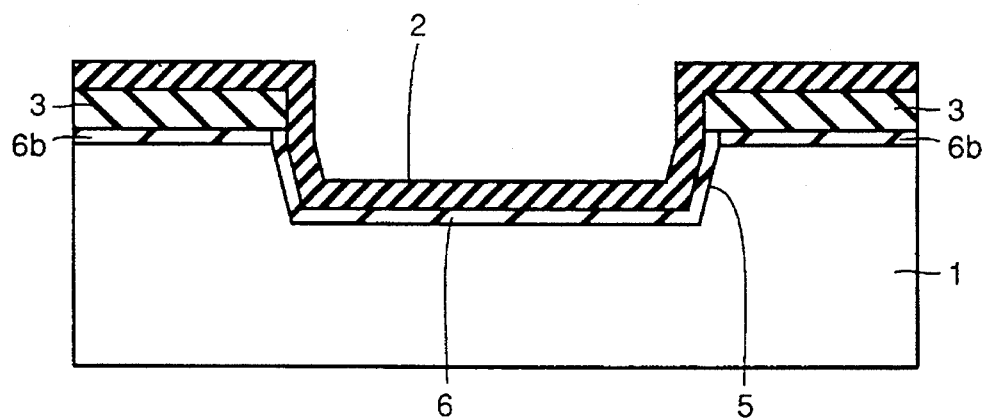
Figure 68:
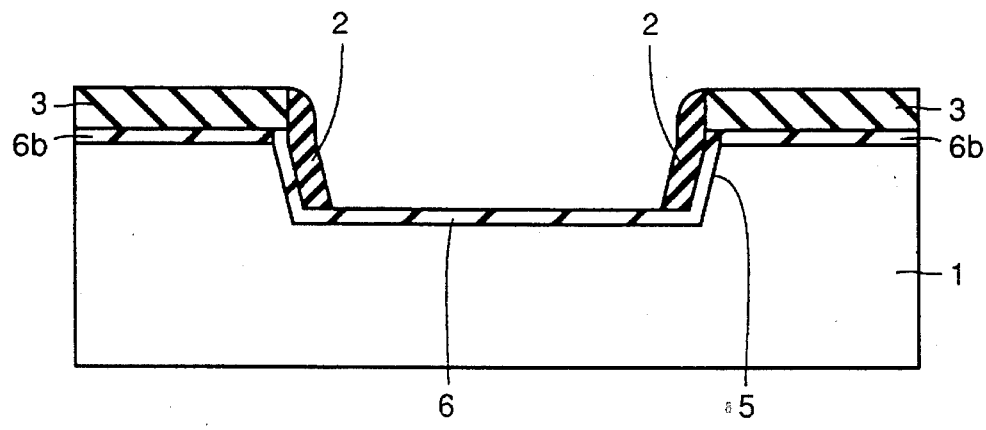

Referring to FIG. 66, the same steps as those of the fourth embodiment are repeated to form a groove 5. Subsequently, the groove 5 is thermally oxidized on the surface thereof to form a silicon oxide film 6. In the same manner as in the first embodiment, an oxynitride film 2 is formed to cover the silicon oxide film 6 and the silicon nitride films 3 as shown in FIG. 67. The oxynitride film 2 is subjected to anisotropic etching to form side wall insulating films 2 on the side walls of the groove 5 and the side surfaces of the silicon nitride films 3 as shown in FIG. 68.

Figure 69:
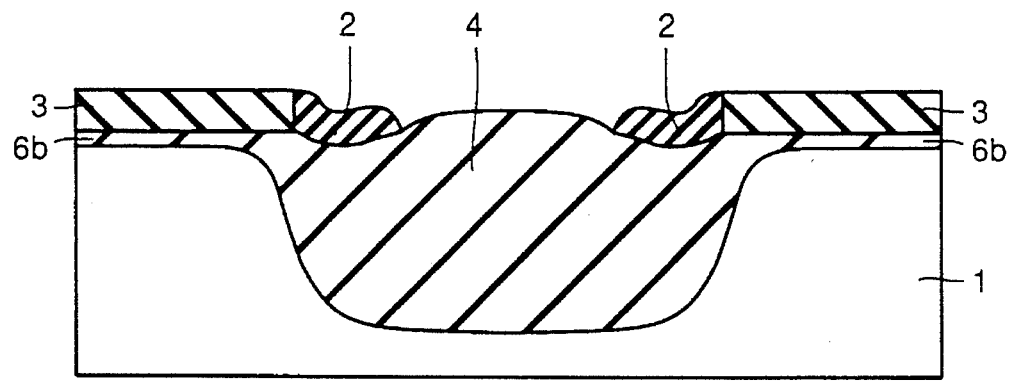

Reference is made to FIG. 69, using the side wall insulating films 2 and the silicon nitride films 3 as a mask, the main surface of the silicon substrate 1 is thermally oxidized. By this, an element isolation oxide film 4 is formed. In this modification, similar effects are in the fourth embodiment can be expected.

Second Modification

Figure 70:
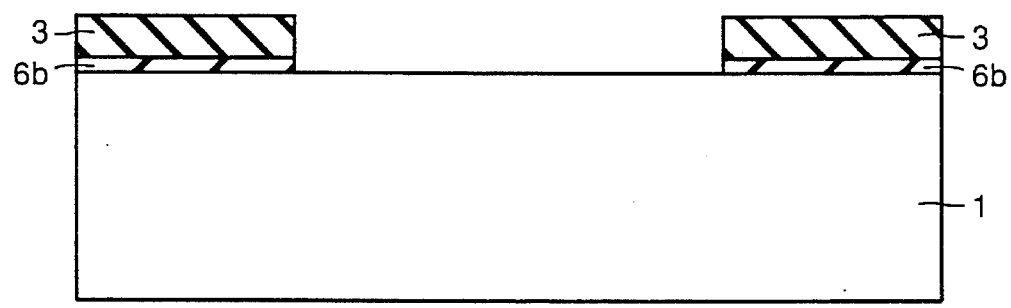
FIGS. 70 to 72 are, respectively, sectional views showing first to third steps of forming an element isolation oxide film according to a second modification in the fourth embodiment of the invention.
Figure 71:
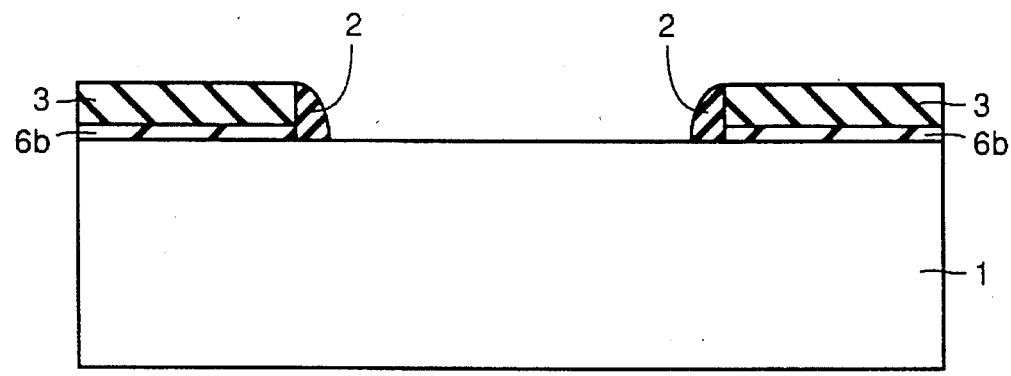
Figure 72:
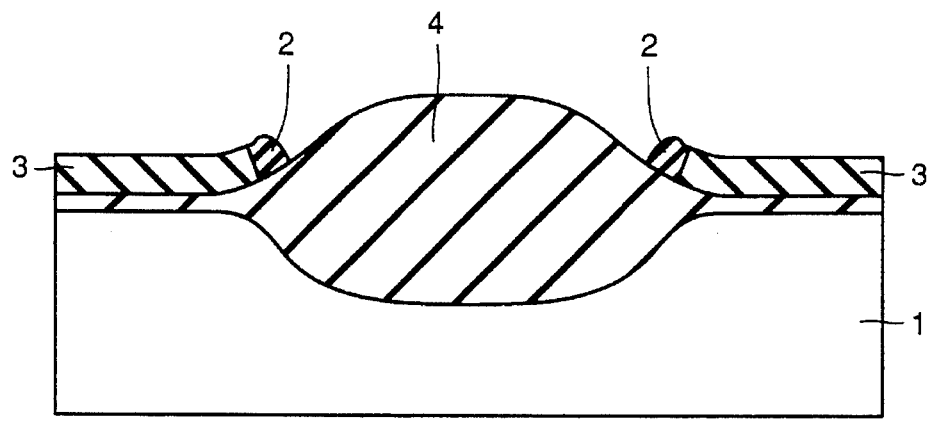

Using FIGS. 70 to 72, a second modification of this embodiment is described. FIGS. 70 to 72 are, respectively, sectional views showing first to third steps of the second modification of this embodiment.

Referring to FIG. 70, the same steps as those of the fourth embodiment are repeated to, respectively, form a silicon oxide film 6b and a silicon nitride films 3, followed by patterning in a desired form. An oxynitride film 2 is formed to cover the silicon nitride films 3 and the main surface of the silicon substrate 1 in the same manner as in the fourth embodiment. The oxynitride film 2 is subjected to anisotropic etching thereby forming side wall insulating films 2 as shown in FIG. 71.

As shown in FIG. 72, using the side wall insulating films 2 and the silicon nitride films 3 as a mask, the main surface of the silicon substrate is thermally oxidized, thereby forming an element isolation oxide film 4. In this modification, similar effects as in the first modification will be expected.

Third Modification

Figure 73:
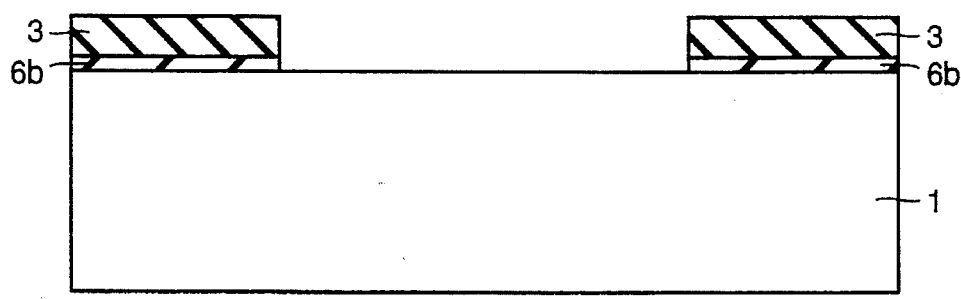
FIGS. 73 to 75 are, respectively, sectional views showing first to third steps of forming an element isolation oxide film according to a third modification in the fourth embodiment of the invention.
Figure 74:
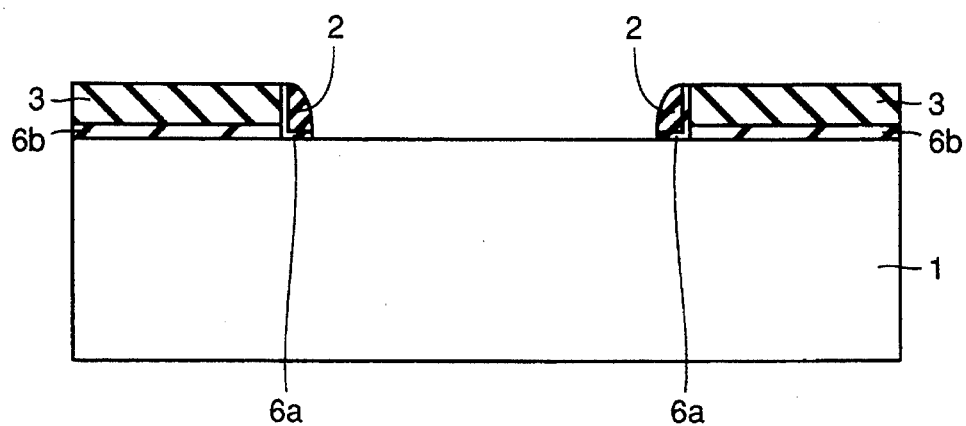
Figure 75:
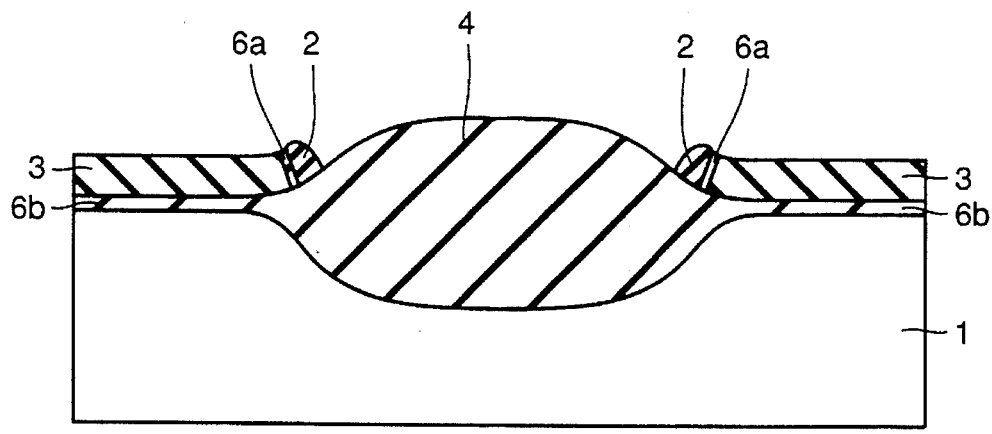

Using FIGS. 73 to 75, a third modification of this embodiment is described. FIGS. 73 to 75 are, respectively, sectional views showing first to third steps of the third modification of the embodiment.

Referring to FIG. 73, the same steps as those of the second modification are repeated to, respectively, form a silicon nitride film 3 and a silicon oxide film 6b, followed by patterning in a desired form. A silicon oxide film 6a is formed to cover the silicon nitride films 3 and the main surface of the silicon substrate 1 according to a CVD method or the like. An oxynitride film 2 is formed on the silicon oxide film 6a in the same manner as in the fourth embodiment. The oxynitride film 2 and the silicon oxide film 6a are successively, anisotropically etched. By this, while leaving the silicon oxide films 6a to cover the side surfaces of the silicon nitride film 3 therewith, side wall insulating films 2 are formed on the silicon oxide films 6a as shown in FIG. 74.

As shown in FIG. 75, using the side wall insulating films 2 and the silicon nitride films 3 as a mask, the main surface of the silicon substrate 1 is thermally oxidized, thereby forming an element isolation oxide film 4. In this modification, similar effects as in the first modification will be expected.

Fourth Modification

Figure 76:
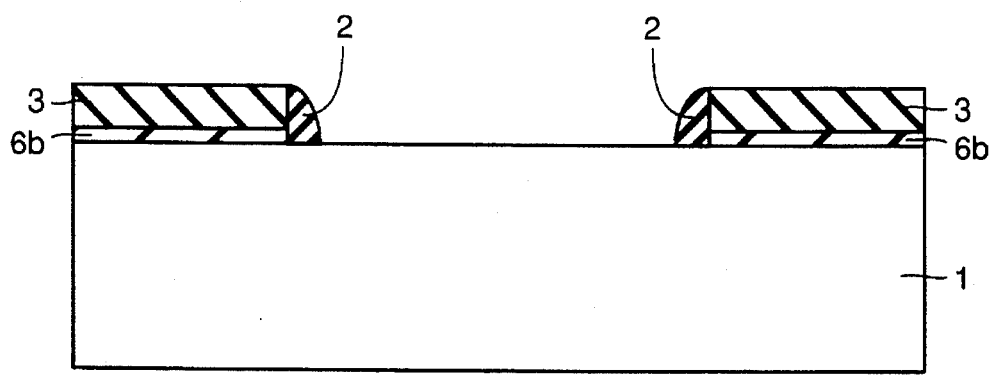
FIGS. 76 to 78 are, respectively, sectional views showing first to third steps of forming an element isolation oxide film according to a fourth modification in the fourth embodiment of the invention.
Figure 77:
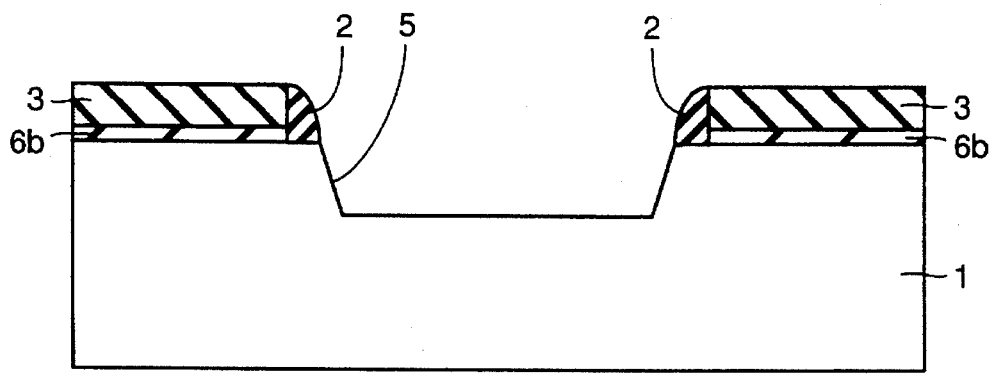
Figure 78:
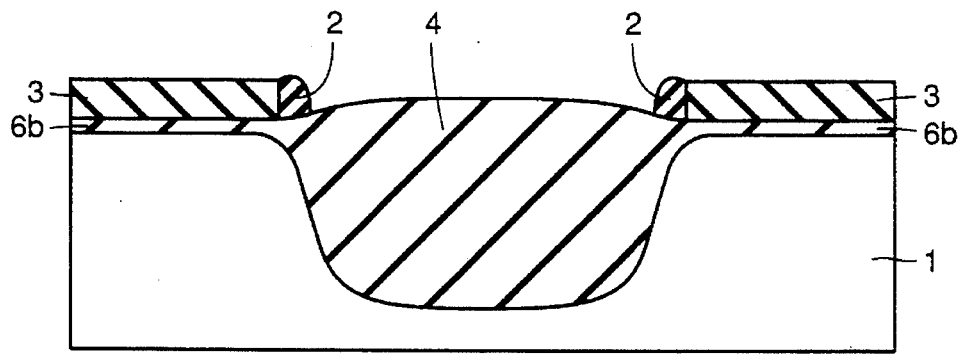

Referring to FIGS. 76 to 78, a fourth modification of this embodiment is described. FIGS. 76 to 78 are, respectively, sectional views showing first to third steps of the fourth modification of the embodiment.

As shown in FIG. 76, the same steps as those of the second modification are repeated to form side wall insulating films 2. Using the side wall insulating films 2 and the silicon nitride films 3 as a mask, the main surface of the silicon substrate 1 is anisotropically etched thereby forming a groove 5 as shown in FIG. 77.

Reference is made to FIG. 78 wherein using the side wall insulating films 2 and the silicon nitride films 3 as a mask, the main surface of the silicon substrate 1 is thermally oxidized, thereby forming an element isolation oxide film 4. In this modification, since the groove 5 is formed, the difference in step between the upper surface of the element isolation oxide film 4 and the main surface of the silicon substrate 1 can be reduced.

Fifth Modification

Figure 79:
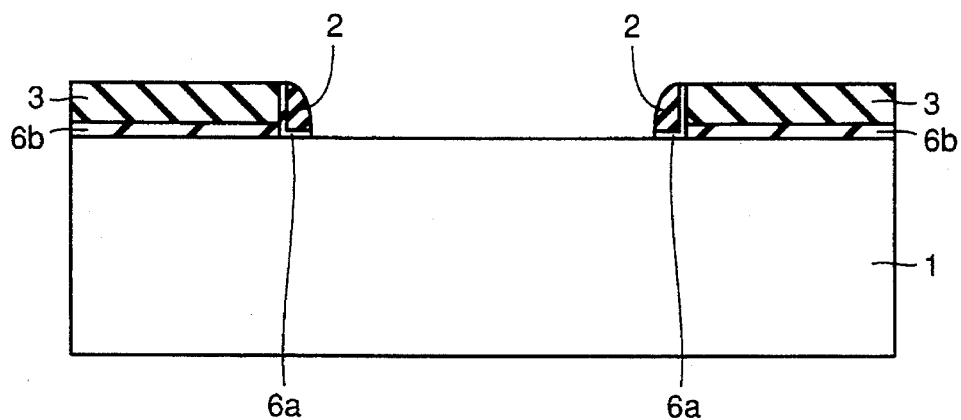
FIGS. 79 to 81 are, respectively, sectional views showing first to third steps of forming an element isolation oxide film according to a fifth modification in the fourth embodiment of the invention.
Figure 80:
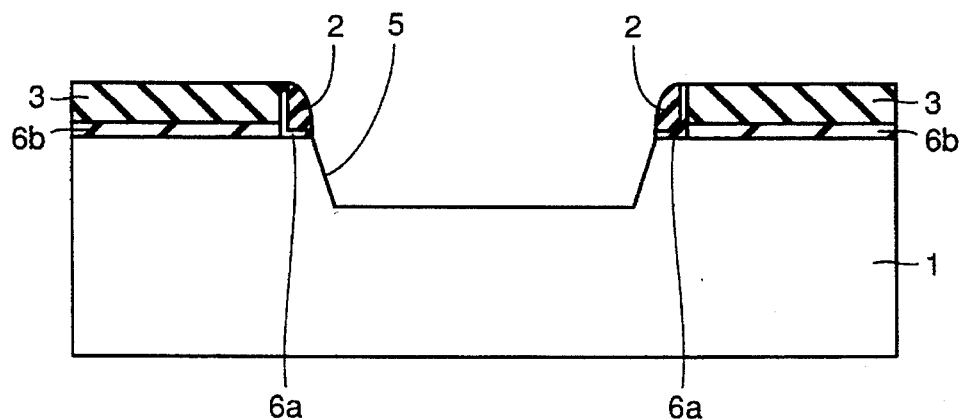
Figure 81:
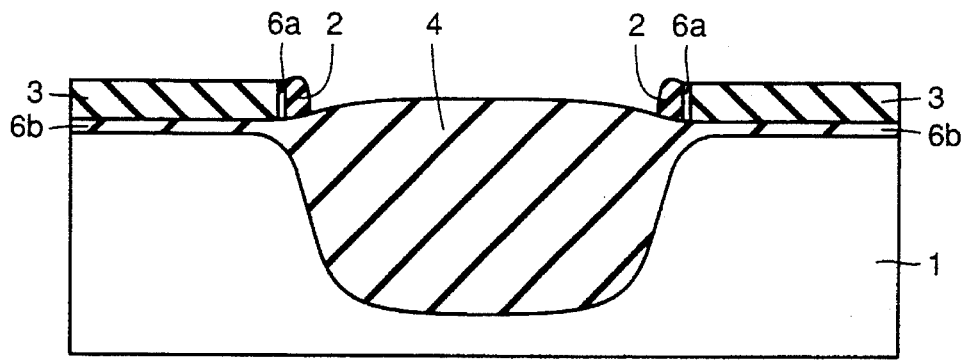

Using FIGS. 79 to 81, a fifth modification of the embodiment is described. FIGS. 79 to 81 are, respectively, sectional views showing first to third steps of the fifth modification of this embodiment.

As shown in FIG. 79, the same steps as those of the third modification are repeated to form side wall insulating films 2. Using the side wall insulating films 2 and the silicon nitride films 3 as a mask, the main surface of the silicon substrate 1 is anisotropically etched thereby forming a groove 5 as shown in FIG. 80.

Reference is made to FIG. 81 wherein using the side wall insulating films 2 and the silicon nitride films 3 as a mask, the main surface of the silicon substrate 1 is thermally oxidized, thereby forming an element isolation oxide film 4. In this modification, the upper surface of the element isolation oxide film 4 can be more flattened than in the case of the third modification, like the fourth modification.

Sixth Modification

A sixth modification of this embodiment is described with reference to FIGS. 82 to 84, which are, respectively, sectional views showing first to third steps of the sixth modification of this embodiment.

Figure 82:
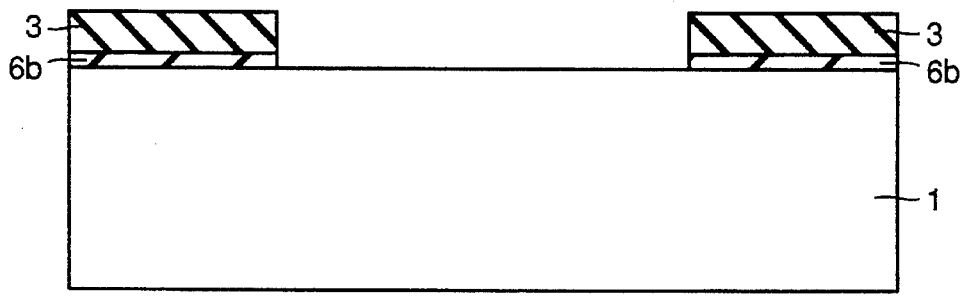
FIGS. 82 to 84 are, respectively, sectional views showing first to third steps of forming an element isolation oxide film according to a sixth modification in the fourth embodiment of the invention.
Figure 83:
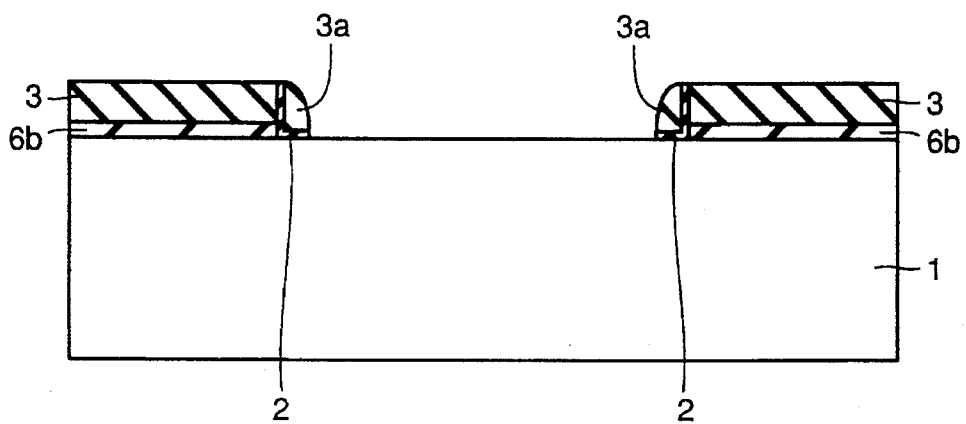

Reference is made to FIG. 82 wherein the same steps as those of the first modification of this embodiment are repeated to form a silicon oxide film 6b and a silicon nitride film 3, followed by patterning in a desired form. Thereafter, in the same manner as in the fourth embodiment, an oxynitride film 2 is formed so that it covers the silicon nitride film 3 and the main surface of a silicon substrate 1, followed by forming a silicon nitride film 3a by use of a CVD method or the like. The silicon nitride film 3a and the oxynitride film 2 are successively subjected to anisotropic etching. By this, the oxynitride films 2 are left to cover the side surfaces of the silicon nitride film 3 as shown in FIG. 83 and side wall insulating films 3a are formed on the oxynitride films 2.

Figure 84:
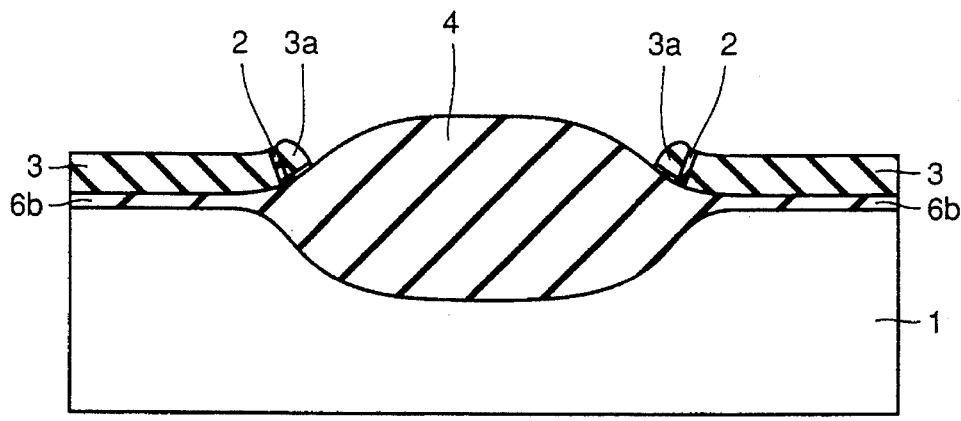

Reference is made to FIG. 84 wherein using the side wall insulating films 3a, oxynitride films 2 and silicon nitride films 3 as a mask, the main surface of the silicon substrate 1 is thermally oxidized thereby forming an element isolation oxide film 4.

Seventh Modification

Figure 85:
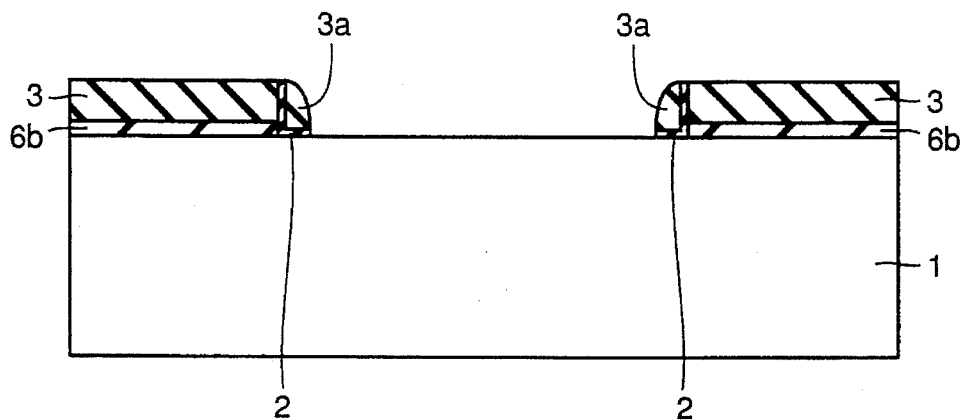
FIGS. 85 to 87 are, respectively, sectional views showing first to third steps of forming an element isolation oxide film according to a seventh modification in the fourth embodiment of the invention.
Figure 86:
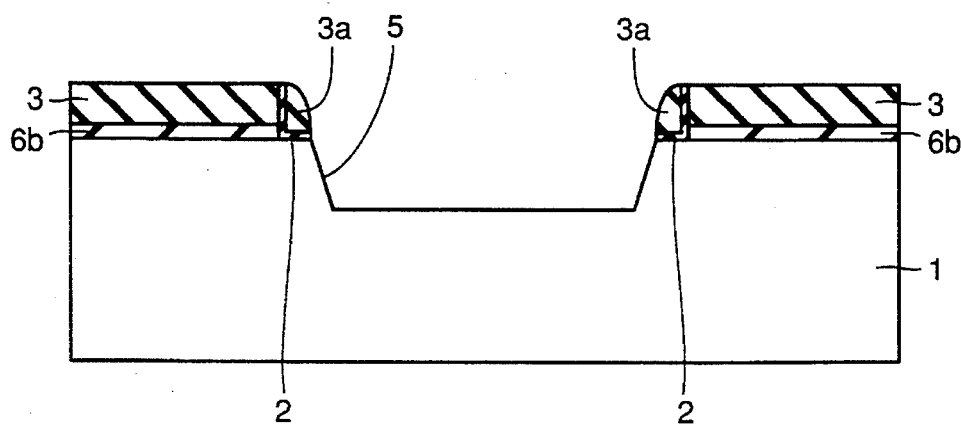
Figure 87:
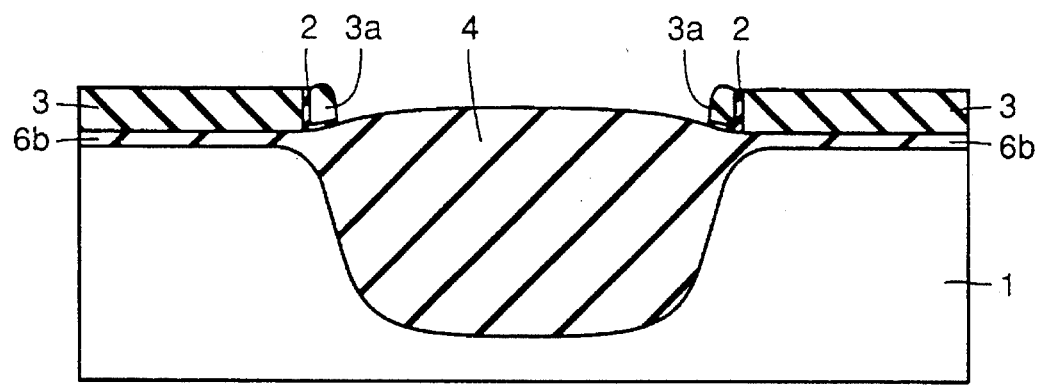

Using FIGS. 85 to 87, a seventh modification is described. FIGS. 85 to 87 are, respectively, sectional views showing first to third steps of the seventh modification of this embodiment.

Referring to FIG. 85 wherein side wall insulating films 3a are formed through the steps in the same manner as in the sixth modification. Using the side wall insulating films 3a and the silicon nitride films 3 as a mask, the main surface of the silicon substrate 1 is anisotropically etched to form a groove 5 as shown in FIG. 86.

In FIG. 87, using the side wall insulating films 3a, oxynitride films 2 and silicon nitride films 3 as a mask, the main surface of the silicon substrate 1 is thermally oxidized, thereby forming an element isolation oxide film 4. According to this modification, the element isolation oxide film 4 is formed as more flattened than in the case of the sixth modification.

Fifth Embodiment

Figure 88:
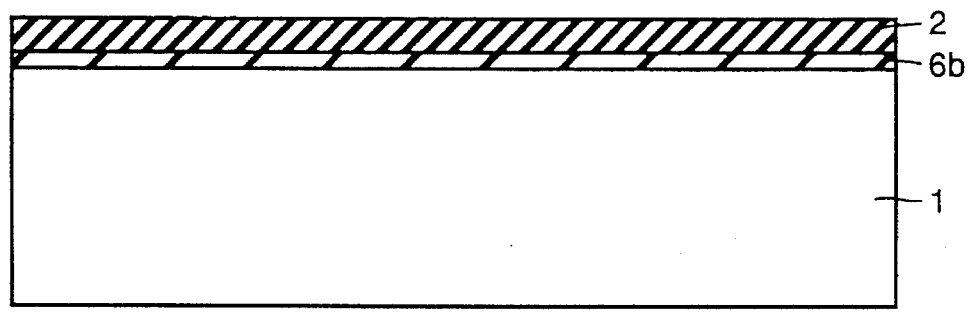
FIGS. 88 to 90 are, respectively, sectional views showing first to third steps of forming an element isolation oxide film according to a fifth embodiment of the invention.
Figure 89:
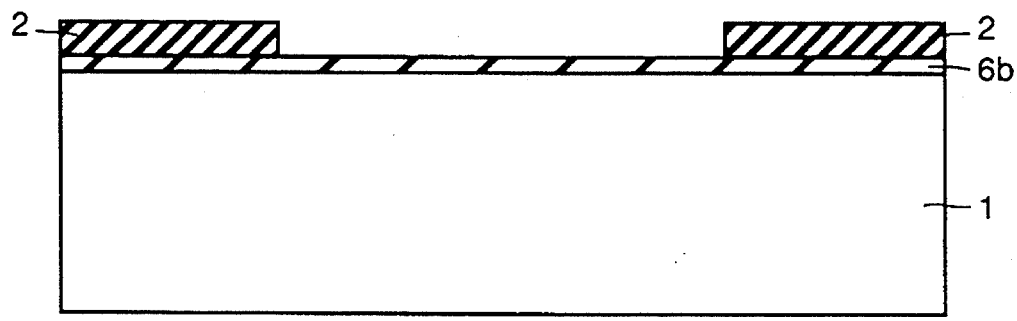
Figure 90:
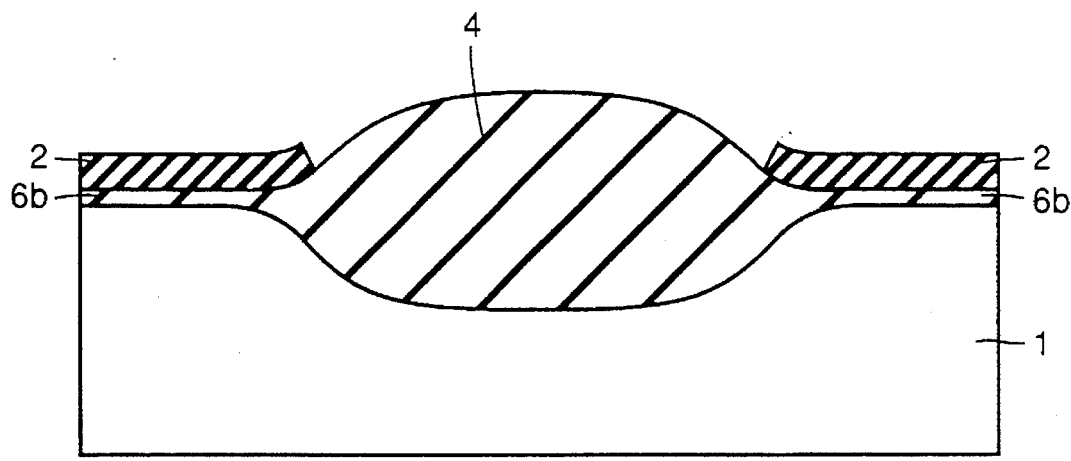

A fifth embodiment and its modifications of the invention are described with reference to FIGS. 88 to 114. FIGS. 88 to 90 are, respectively, sectional views showing first to third steps of the fifth embodiment of the invention.

Figure 91:
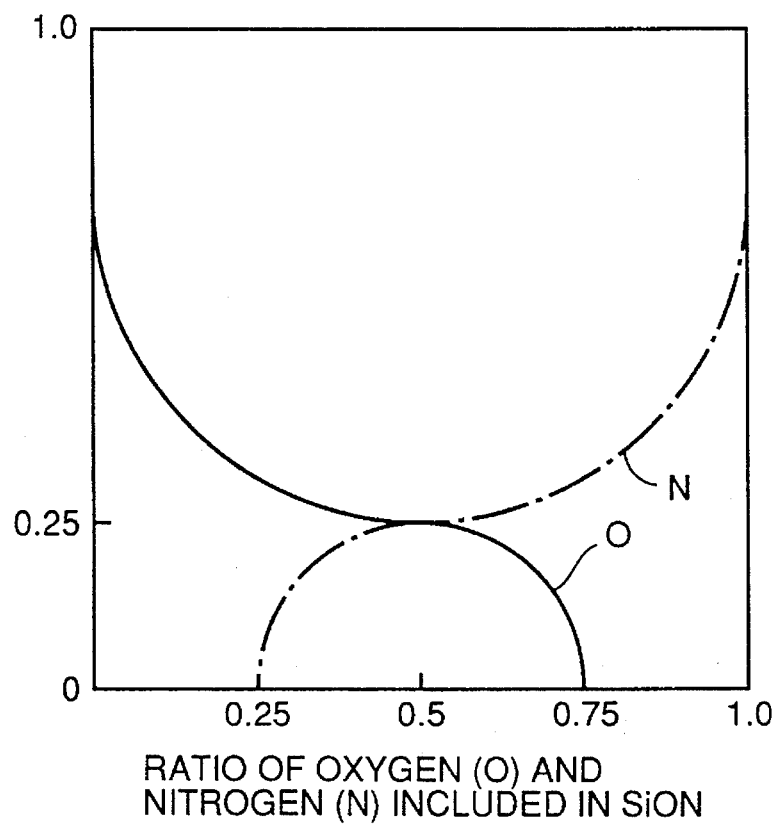
FIG. 91 is a graph showing the relation between the compositional ratio of O (oxygen) and that of N (nitrogen) in the thickness direction of an oxynitride film formed according to still another aspect of the invention.

Reference is made to FIG. 88 wherein a silicon oxide film 6b is formed on the main surface of a silicon substrate 1 according to a thermal oxidation method or a CVD method. The silicon oxide film 6b is so thin as in the order of magnitude of several tens angstroms. An oxynitride film 2 is formed on the silicon oxide film 6b. This oxynitride film 2 is formed according to a low pressure CVD method using a mixed gas of SiH2Cl2, NH3 and N2O. More particularly, N2O is fed in amounts greater than NH3, so that a portion of the oxynitride film 2 contacting or formed in the vicinity of the silicon oxide film 6b is formed. Thereafter, while gradually reducing the feed of N2O and gradually increasing the feed of NH3, an intermediate portion of the oxynitride film is formed. Finally, under conditions where the feed of N2O is substantially zero, the upper portion of the oxynitride film 2 is formed. In this manner, the resultant oxynitride film 2 is so formed as having a ratio of oxygen (O) and nitrogen (N) as shown in FIG. 91.

Reference is now made to FIG. 89 wherein the oxynitride film 2 is patterned in a desired form by use of photolithography and anisotropic etching techniques. Using the pattern of the oxynitride films 2 as a mask, the main surface of the silicon substrate 1 is thermally oxidized to form an element isolation oxide film 4 as shown in FIG. 90.

According to this embodiment, since the oxynitride film 2 has a composition similar to that of a silicon oxide film at the bottom thereof, and the composition gradually comes closer to that of silicon nitride toward the upper surface of the film 2. The oxynitride film 2 has an excellent stress relaxing function. This enables one to form a silicon oxide film 6 whose thickness is very small. This eventually leads to suppression of the bird's beak extension of the element isolation oxide film 4 over the case of prior art. Since the oxynitride film 2 has such a composition as set out hereinabove, it becomes possible to effectively suppress formation of crystal defects in the main surface of the silicon substrate 1 as will be caused by the formation of the element isolation oxide film 4.

Modifications of this embodiment are described with reference to FIGS. 92 to 114.

First Modification

Figure 92:
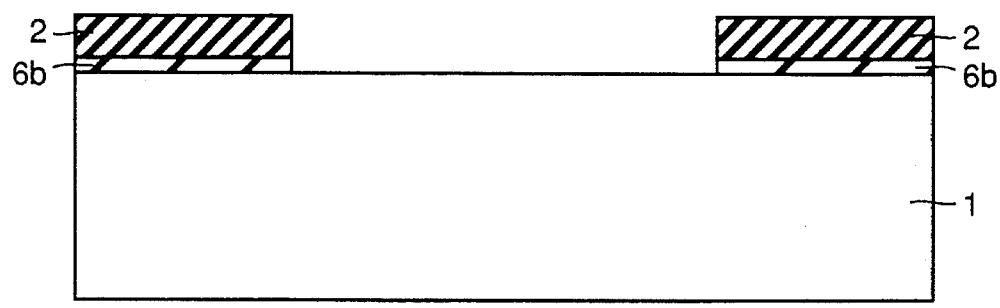
FIGS. 92 to 94 are, respectively, sectional views showing first to third steps of forming an element isolation oxide film according to a first modification in a fifth embodiment of the invention.
Figure 93:
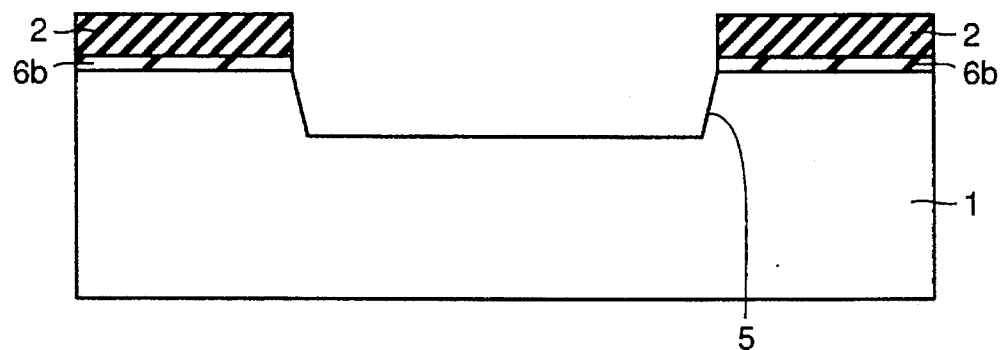
Figure 94:
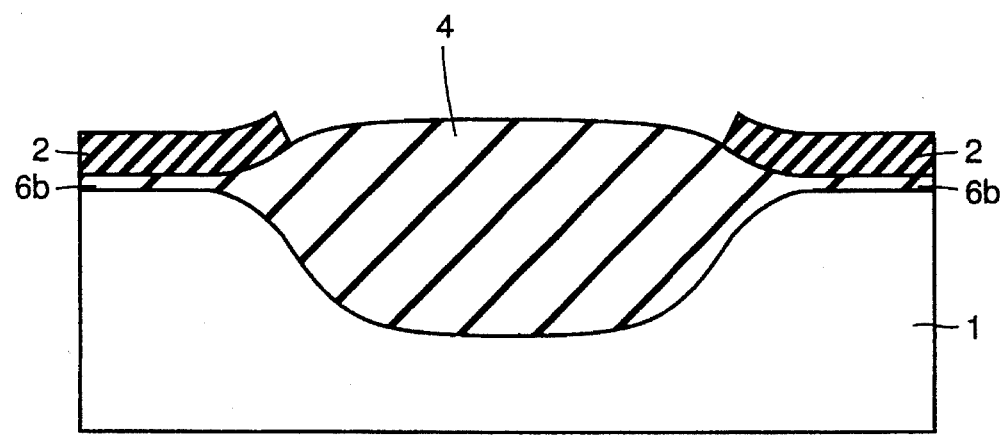

Referring to FIGS. 92 to 94, a first modification of this embodiment is described. FIGS. 92 to 94 are, respectively, sectional views showing first to third steps of the first modification of the embodiment.

In FIG. 92, a silicon oxide film 6b and an oxynitride film 2 are successively formed in the same manner as in the fifth embodiment, followed by patterning in a desired form.

Reference is then made to FIG. 93 wherein using the oxynitride films 2 as a mask, the main surface of the silicon substrate 1 is subjected to anisotropic etching to form a groove 5.

As shown in FIG. 94, using the oxynitride films 2 as a mask, the main surface of the silicon substrate 1 is thermally oxidized to form an element isolation oxide film 4. According to this modification, since the groove 5 is formed, the difference in step between the upper surface of the element isolation oxide film 4 and the main surface of the silicon substrate 1 can be reduced over the case of the fifth embodiment.

Second Modification

A second modification of this embodiment is described with reference to FIGS. 95 to 98, which are, respectively, sectional views of first to fourth steps of the second modification of the embodiment.

Figure 95:
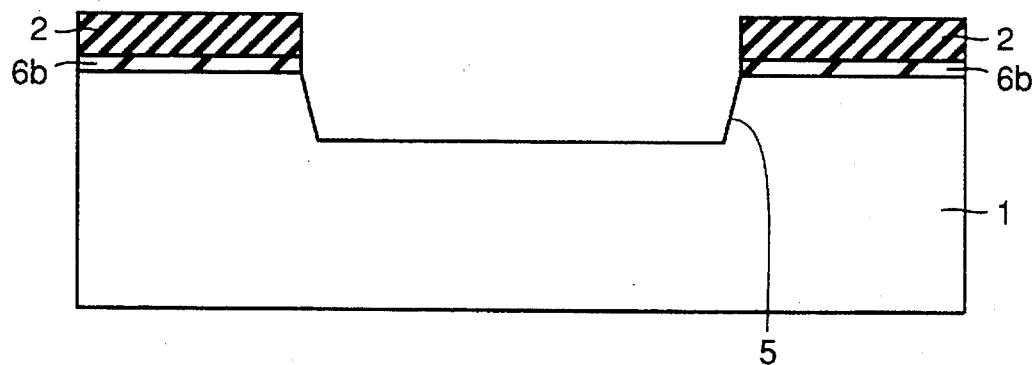
FIGS. 95 to 98 are, respectively, sectional views showing first to fourth steps of forming an element isolation oxide film according to a second modification in the fifth embodiment of the invention.
Figure 96:
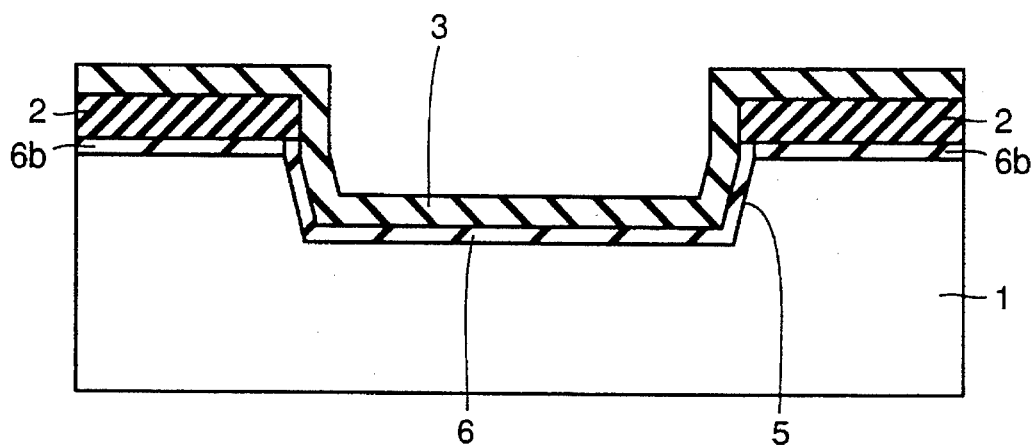

Reference is made to FIG. 95 a groove 5 is formed through the steps as in the first modification. As shown in FIG. 96, the groove 5 is thermally oxidized on the surface thereof to form a silicon oxide film 6. Next, a silicon nitride film 3 is formed to cover the silicon oxide film 6 and the oxynitride films 2 therewith according to a CVD method or the like.

Figure 97:
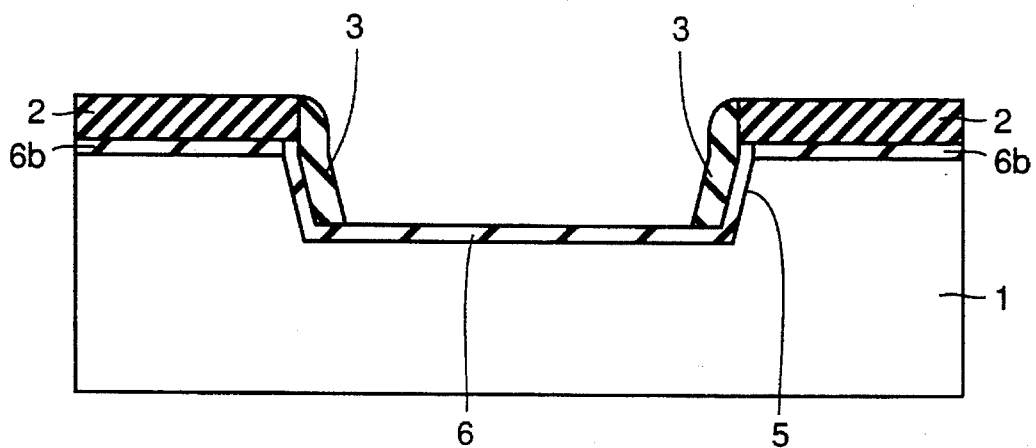

The silicon oxide film 3 is then subjected to anisotropic etching to form side wall insulating films 3 which covers the side walls of the groove 5 and the side surfaces of the oxynitride film 2 therewith as shown in FIG. 97.

Figure 98:
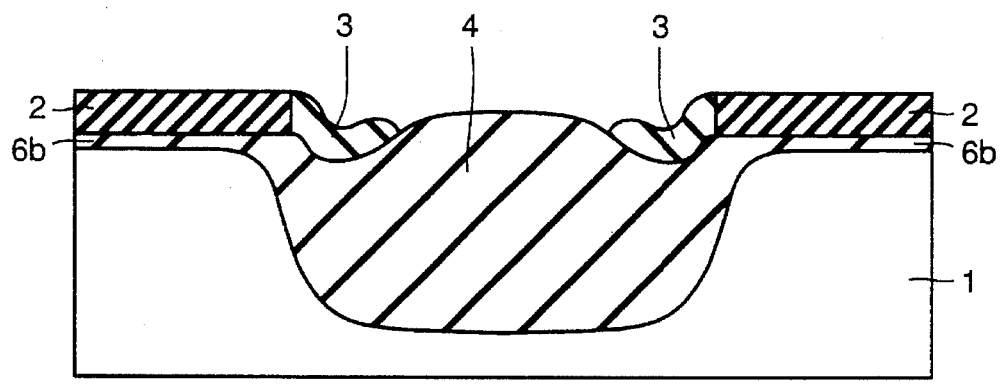

Reference is now made to FIG. 98 wherein using the side wall insulating films 3 and the oxynitride films 2 as a mask, the main surface of the silicon substrate 1 is thermally oxidized. As a result, an element isolation oxide film 4 is formed. Since the side wall insulating films 3 are formed, it is possible to more suppress the bird's beak extension of the element isolation oxide film 4 over the case of the first modification.

Third Modification

Using FIGS. 99 to 102, a third modification of this embodiment is described. FIGS. 99 to 102 are, respectively, sectional views of first to fourth steps of the third modification of the embodiment.

Figure 99:
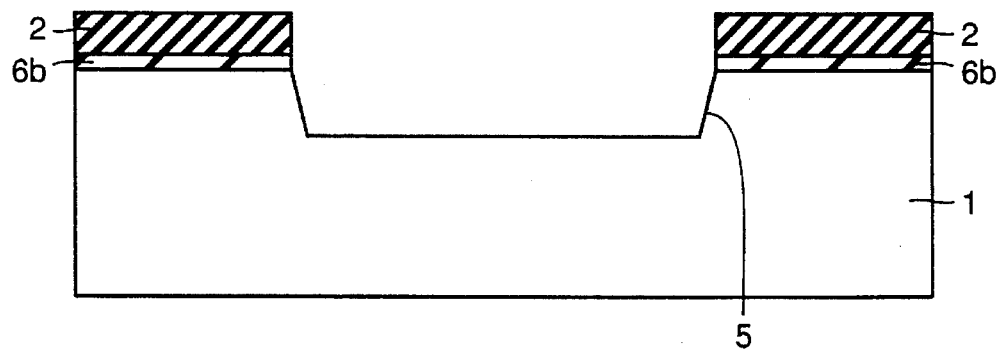
FIGS. 99 to 102 are, respectively, sectional views showing first to fourth steps of forming an element isolation oxide film according to a third modification in the fifth embodiment of the invention.
Figure 100:
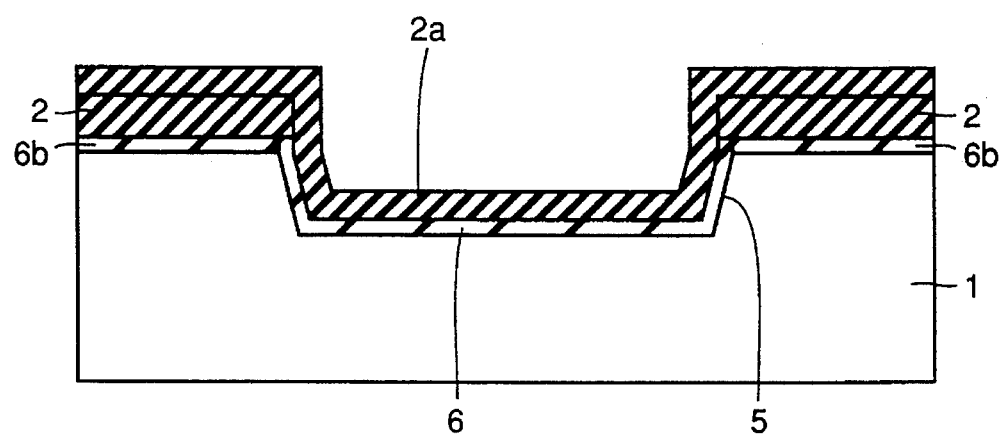

Reference is made to FIG. 99 wherein a groove 5 is formed through the steps as in the first modification. In FIG. 100, the groove 5 is thermally oxidized on the surface thereof to form a silicon oxide film 6. Next, an oxynitride film 2a is formed covering the silicon oxide film 6 and the oxynitride film 2 in the same manner as in the fifth embodiment.

Figure 101:
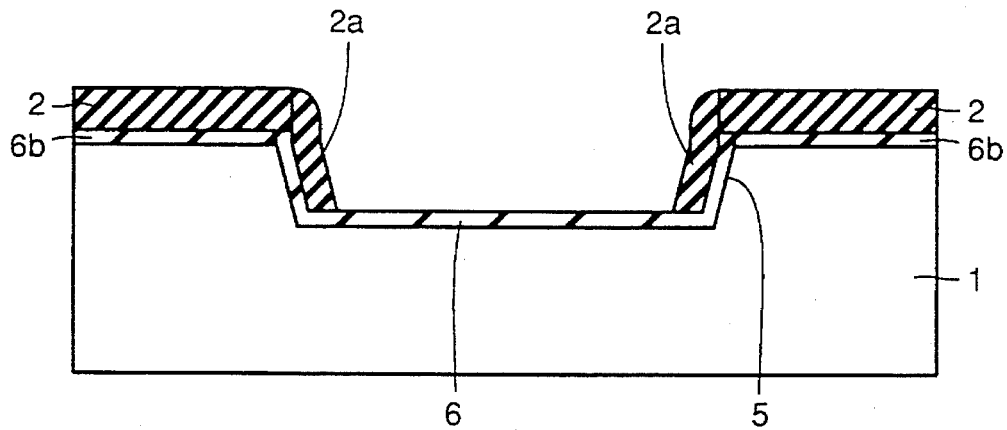

Thereafter, the oxynitride film 2a is subjected to anisotropic etching, by which side wall insulating films 2a are formed to cover the side walls of the groove 5 and the side surfaces of the oxynitride film 2 as shown in FIG. 101.

Figure 102:
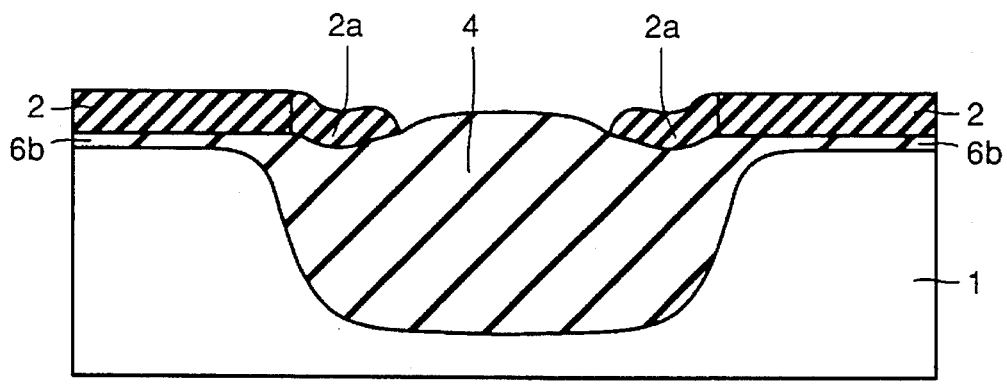

Referring to FIG. 102, using the side wall insulating films 2a and the oxynitride films 2 as a mask, the main surface of the silicon substrate 1 is thermally oxidized. As a result, an element isolation oxide film 4 is formed. In this modification, since the side wall insulating films 2a are made of the oxynitride film, it is possible to form the element isolation oxide film 4 having a surface whose recess is smaller than in the case of the second modification.

Fourth Modification

Figure 103:
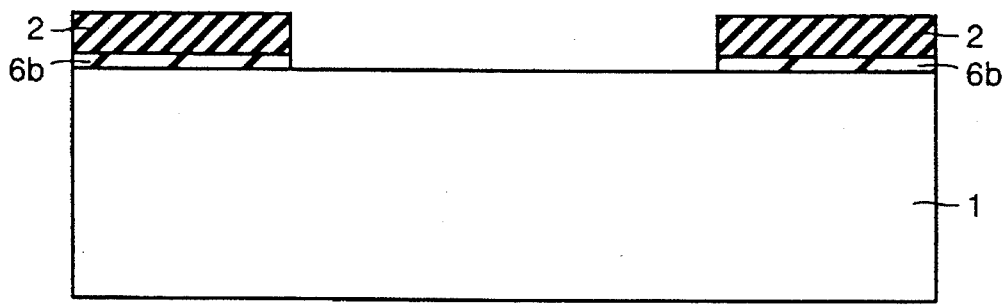
FIGS. 103 to 105 are, respectively, sectional views showing first to third steps of forming an element isolation oxide film according to a fourth modification in the fifth embodiment of the invention.
Figure 104:
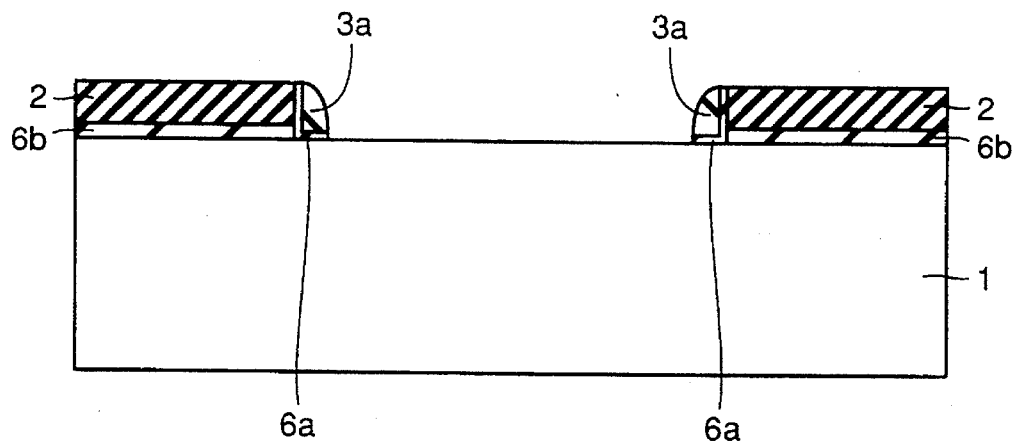
Figure 105:
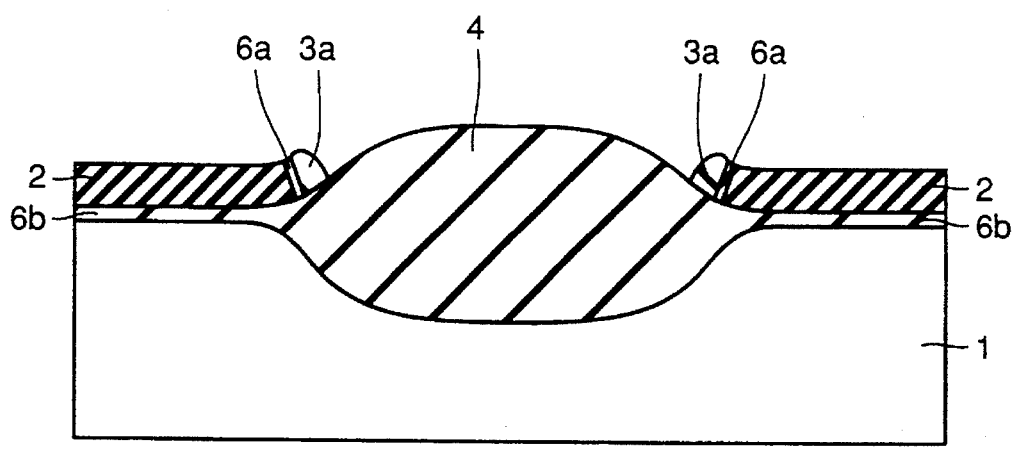

Referring to FIGS. 103 to 105, a fourth modification of the embodiment is described. FIGS. 103 to 105 are, respectively, sectional views showing first to third steps of the fourth modification.

Referring to FIG. 103, an oxynitride film 2 and a silicon oxide film 6b are formed through the steps as in the first modification, followed by patterning in a desired form. A silicon oxide film 6a and a silicon nitride film 3a are successively formed on the main surface of the silicon substrate 1 and the oxynitride films 2 such as by a CVD method. The silicon nitride film 3a and the silicon oxide film 6a are successively subjected to anisotropic etching. By this, the silicon oxide films 6a are left to cover the side surfaces of the oxynitride film 2, and side wall insulating films 3a are formed on the silicon oxide films 6a as shown in FIG. 104.

Reference is then made to FIG. 105 wherein using the silicon nitride films 3a and the oxynitride films 2 as a mask, the main surface of the silicon substrate 1 is thermally oxidized, thereby forming an element isolation oxide film 4.

Fifth Modification

A fifth modification of this embodiment is described with reference to FIGS. 106 and 108, which are, respectively, sectional views showing first to third steps of the fifth modification.

Figure 106:
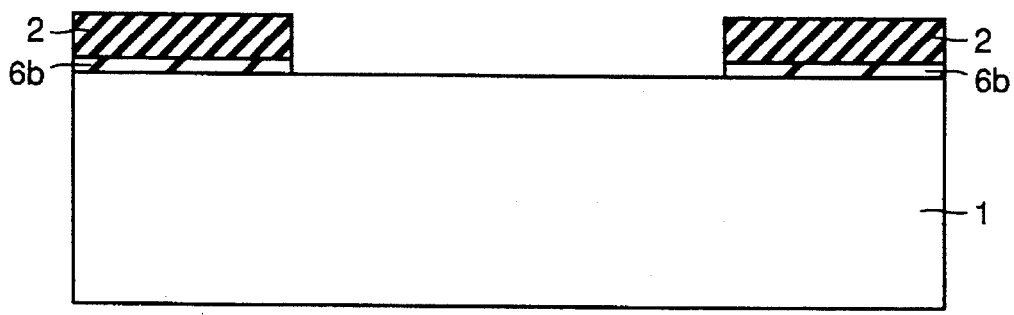
FIGS. 106 to 108 are, respectively, sectional views showing first to third steps of forming an element isolation oxide film according to a fifth modification in the fifth embodiment of the invention.
Figure 107:
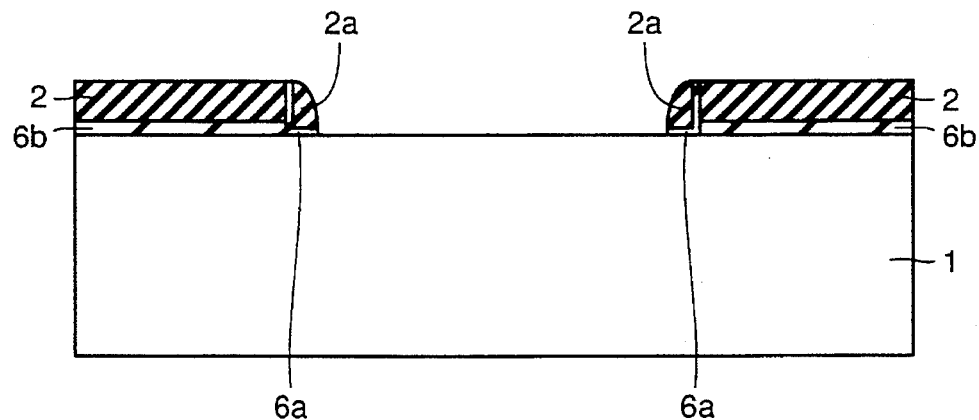

As shown in FIG. 106, an oxynitride film 2 and a silicon oxide film 6b are formed through the steps as in the fourth modification, followed by patterning in a desired form. A silicon oxide film 6a is formed to cover the main surface of the silicon substrate 1 and the oxynitride film 2 such as by a CVD method. An oxynitride film 2a is formed on the silicon oxide film 6a in the same manner as in the fifth embodiment, followed by successive anisotropic etching of the oxynitride film 2a and the silicon oxide film 6a. By this, silicon oxide films 6a are left on the side surfaces of the oxynitride film 2, side wall insulating films 2a are formed on the silicon oxide films 6a, respectively.

Figure 108:
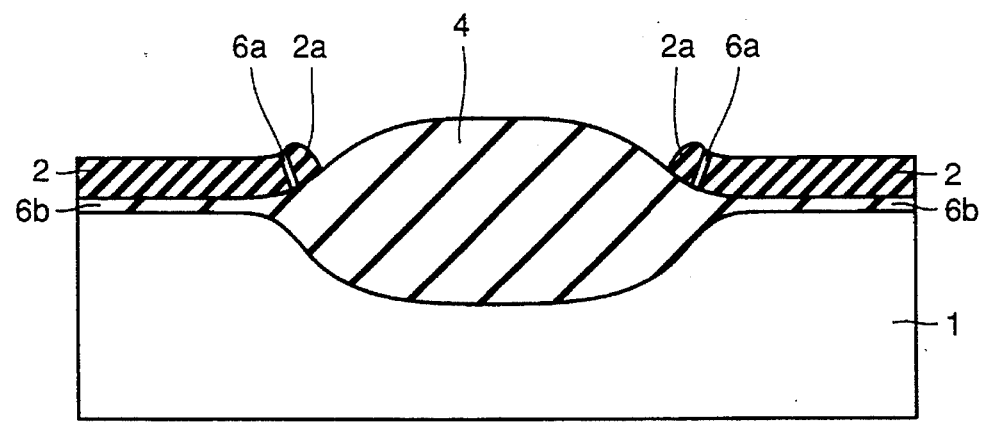

Referring to FIG. 108, using the side wall insulating films 2a and the oxynitride films 2 as a mask, the silicon substrate 1 is thermally oxidized on the main surface thereof, thereby forming an element isolation oxide film 4. According to this modification, since the side wall insulating films 2a are made of an oxynitride film, it is possible to form the element isolation oxide film 4 as having a smaller recess on the surface thereof than in the case of the fourth modification.

Sixth Modification

Figure 110:
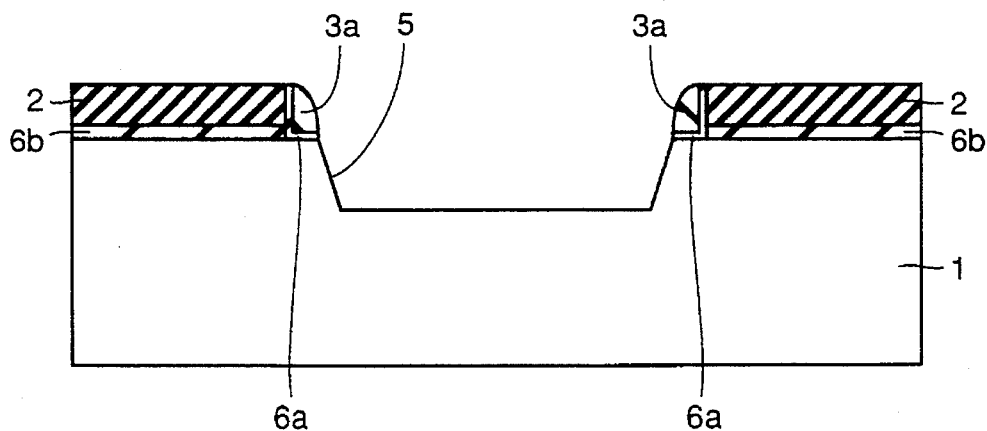
Figure 111:
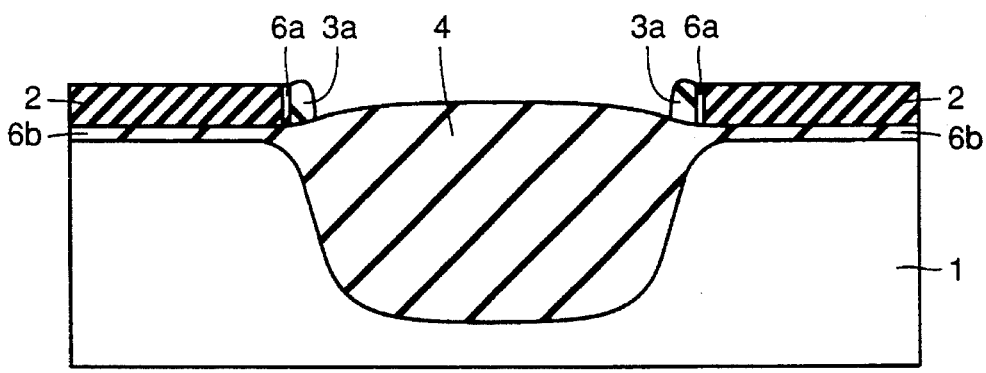

A sixth modification is described with reference to FIGS. 109 to 111, which are, respectively, sectional views of first to third steps of the sixth modification of this embodiment.

Figure 109:
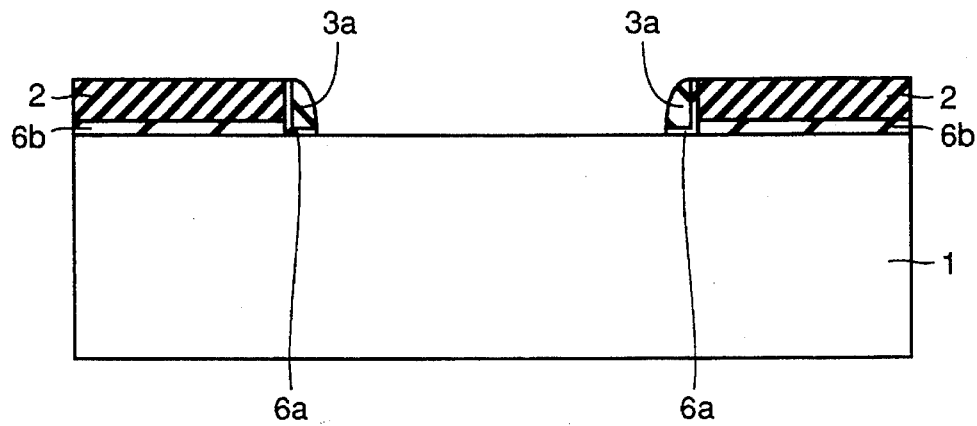
FIGS. 109 to 111 are, respectively, sectional views showing first to third steps of forming an element isolation oxide film according to a sixth modification in the fifth embodiment of the invention.

Referring to FIG. 109, side walls insulating films 3a are formed through the steps as in the fourth modification. Using the side wall insulating films 3a and the oxynitride film 2 as a mask, the main surface of the silicon substrate 1 is anisotropically etched to form a groove 5 as shown in FIG. 110.

Next, using the side wall insulating films 3a and the oxynitride films 2 as a mask, thermal oxidation treatment is performed on the main surface of the silicon substrate 1. As a result, an element isolation oxide film 4 is formed as shown in FIG. 111. According to this modification, the bird's beak extension of the element isolation oxide film 4 is suppressed with the possibility that the surface of the element isolation oxide film 4 is flattened.

Seventh Modification

A seventh modification of this embodiment is described with reference to FIGS. 112 and 114, which are, respectively, sectional views of first to third steps of the seventh modification.

Figure 112:
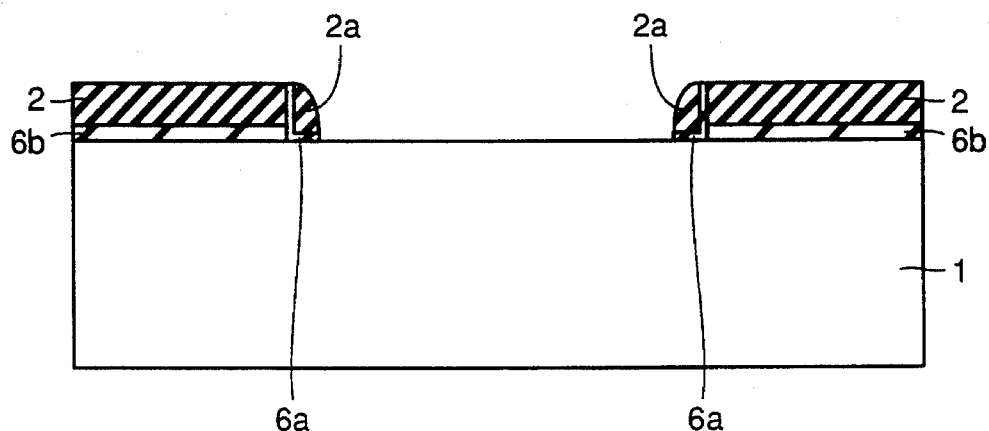
FIGS. 112 to 114 are, respectively, sectional views showing first to third steps of forming an element isolation oxide film according to a seventh modification in the fifth embodiment of the invention.
Figure 113:
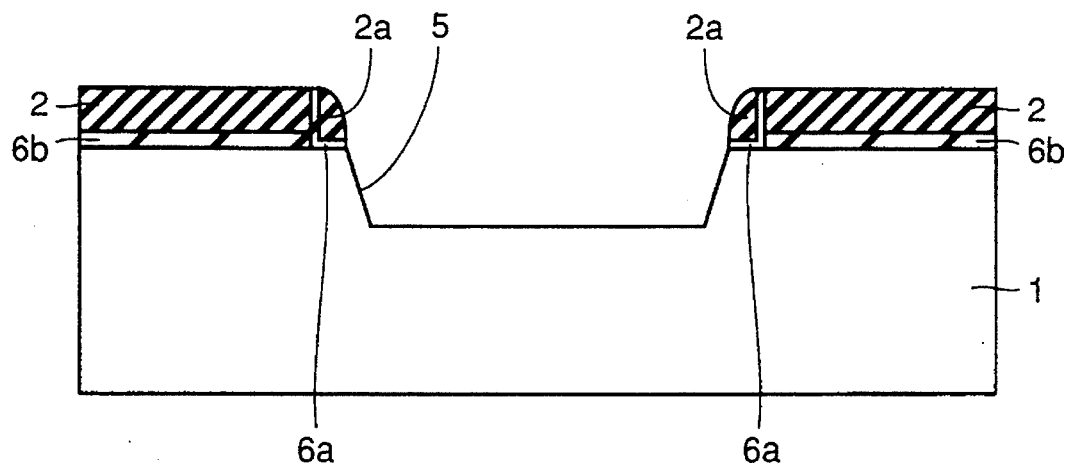

Referring to FIG. 112, side wall insulating films 2a are formed through the steps as in the fifth modification. Using the side wall insulating films 2a and the oxynitride films 2 as a mask, the main surface of the silicon substrate 1 is anisotropically etched thereby forming a groove 5 as shown in FIG. 113.

Figure 114:
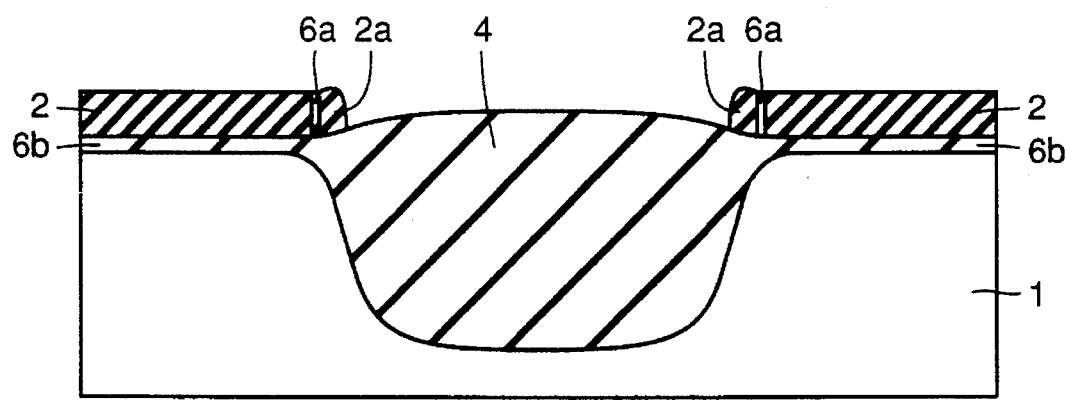
Figure 115:
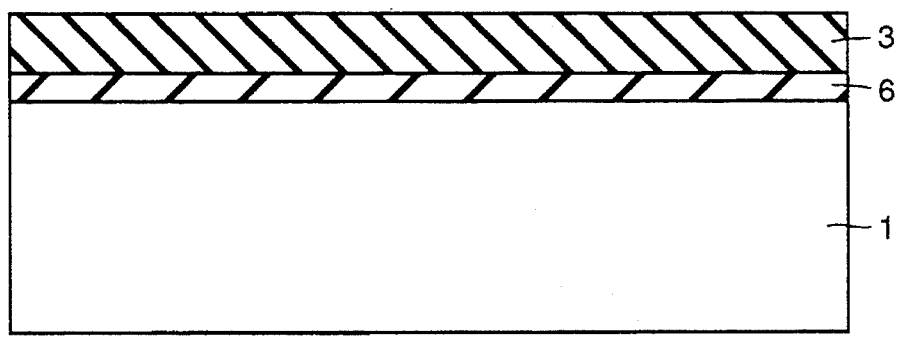
FIGS. 115 to 117 are, respectively, sectional views showing first to third steps of forming a known element isolation oxide film.
Figure 116:
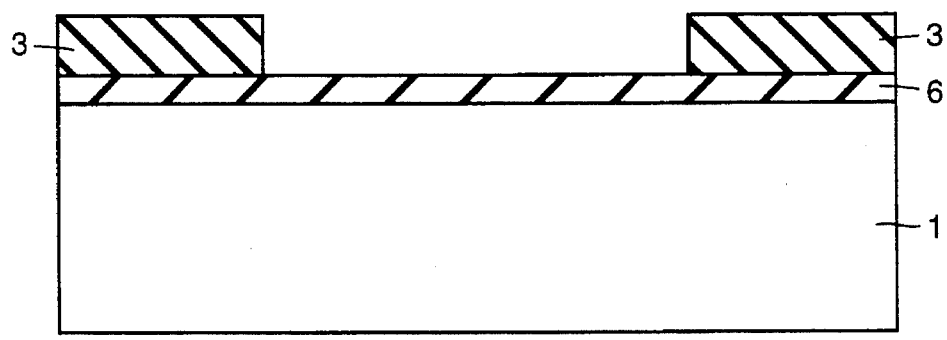
Figure 117:
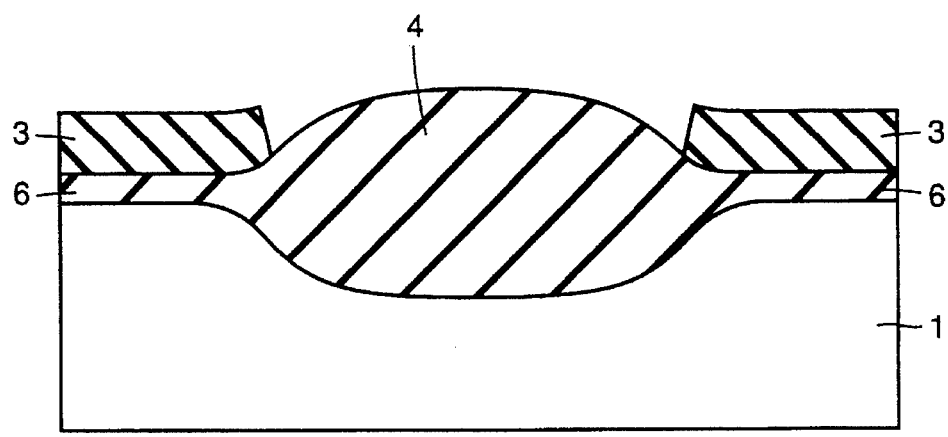
Figure 118:
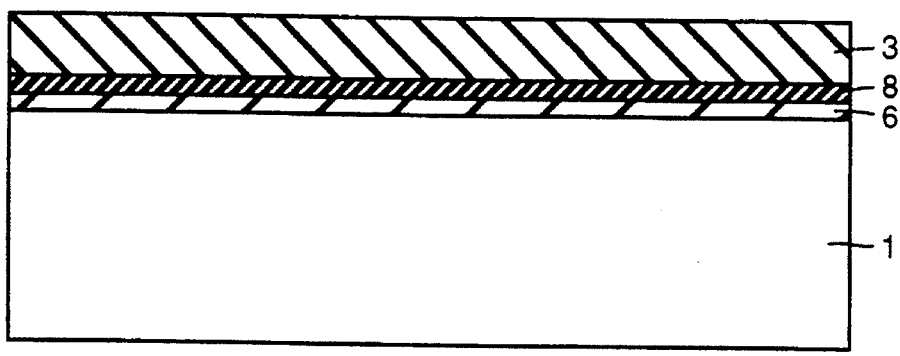
FIGS. 118 to 120 are, respectively, sectional views showing first to third steps of forming an element isolation oxide film according to a prior-art improved method.
Figure 119:
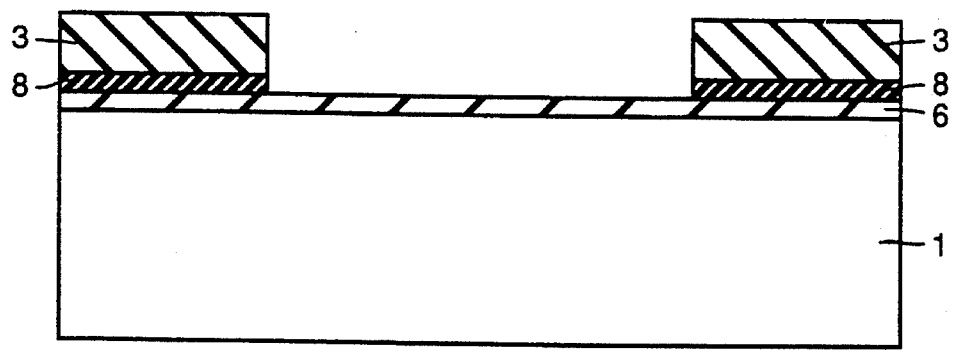
Figure 120:
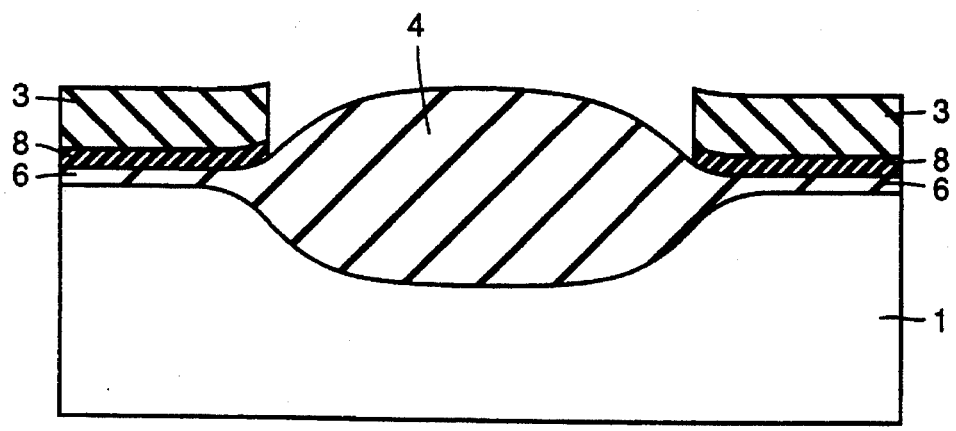

Referring to FIG. 114, using the side wall insulating films 2a and the oxynitride films 2 as a mask, the main surface of the silicon substrate 1 is thermally oxidized to form an element isolation oxide film 4. According to this modification, since an oxynitride film is used as the side wall insulating films 2a, the surface of the element isolation oxide film 4 can be made more flattened than in the case of the sixth modification.

The oxynitride film of the invention has a varying compositional ratio between oxygen and nitrogen along the thickness thereof. By this, the oxynitride film can be so controlled in composition that the film has a composition close to a silicon oxide film at a portion of one surface side thereof and has a composition gradually varying more closely to a silicon nitride film toward the other surface side. The resultant oxynitride film is imparted with a good stress relaxing function. As a result, where the oxynitride film of the invention is applied to the formation of an element isolation oxide film, a silicon oxide film to be provided between a silicon substrate and the oxynitride film may be made very thin. Alternatively, formation of any fresh silicon oxide film may not be necessary. This eventually leads to effective suppression of bird's beaks of the element isolation oxide film from undesirable extension. As set out hereinabove, since the oxynitride film has a good stress relaxing function, it becomes possible to effectively suppress formation of crystal defects in the main surface of a silicon substrate at the time when an element isolation oxide film is formed. Thus, according to the invention, element isolation oxide films can be formed as being adapted for fineness and having high reliability.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An oxynitride film comprising oxygen and nitrogen present in given amounts, respectively, wherein a compositional ratio of said oxygen and said nitrogen varies in a thickness direction of said oxynitride film.

2. An oxynitride film according to claim 1, wherein said oxynitride film has first and second surfaces opposite to each other and comprises a first surface layer portion containing said first surface and a second surface layer portion containing said second surface, a compositional ratio between said oxygen and said nitrogen in said first surface layer portion differing from a compositional ratio between said oxygen and said nitrogen in said second surface layer portion.

3. An oxynitride film according to claim 2, wherein said oxynitride film is formed on a silicon substrate so that said first surface layer portion is positioned at the side of said silicon substrate, said first surface layer portion having a content of said oxygen greater than a content of said nitrogen, said second surface layer portion having a content of said nitrogen greater than a content of said oxygen.

4. An oxynitride film according to claim 3, wherein said first surface layer portion of said oxynitride film consists essentially of a silicon oxide film.

5. An oxynitride film according to claim 4, wherein said second surface layer portion of said oxynitride film consists essentially of a silicon nitride film.

6. An oxynitride film according to claim 3, wherein said second surface layer portion of said oxynitride film consists essentially of a silicon nitride film.

7. An oxynitride film according to claim 3, wherein the content of said nitrogen gradually decreases from said second surface toward said first surface and the content of said oxygen gradually decreases from said second surface toward said first surface.

8. A method for forming an oxynitride film having given contents of oxygen and nitrogen, the method comprising the step of vapor deposition while changing a first gas feed for supplying oxygen and a second gas feed for supplying nitrogen.

9. A method for forming an oxynitride film according to claim 8, wherein said oxynitride film is formed on a main surface of a silicon substrate and comprises a first surface layer portion containing a first surface at a side of the main surface of said silicon substrate and a second surface layer portion containing a second surface opposite to said first surface, said step of vapor deposition comprising the steps of:

forming said first surface layer portion under conditions where said first gas feed is greater than said second gas feed; and forming said second surface layer portion under conditions where said first gas feed is smaller than said second gas feed.

10. A method for forming an oxynitride film according to claim 9, wherein said oxynitride film further comprises an intermediate portion between said first surface layer portion and said second surface layer portion, and said step of vapor deposition further comprises the step of forming said intermediate portion, while gradually decreasing said first gas feed and gradually increasing said second gas feed, between the step of forming said first surface layer portion and the step of forming said second surface layer portion.

11. A method for forming an element isolation oxide film by use of oxynitride which contains given contents of oxygen and nitrogen, is formed on a main surface of a silicon substrate, and comprises a first surface layer portion containing a first surface at a side of the main surface of said silicon substrate and a second surface layer portion containing a second surface opposite to said first surface, the method comprising the steps of:

forming said oxynitride film on said silicon substrate by forming said first surface layer portion by a chemical vapor deposition method wherein a first gas feed for supplying oxygen is greater than a second gas feed for supplying nitrogen and forming said second surface layer portion by a chemical vapor deposition method wherein said first gas feed is less than said second gas feed;

subjecting said oxynitride film to patterning in a desired form to selectively expose the main surface of said silicon substrate; and selectively oxidizing the exposed portions on the main surface of said silicon substrate using the pattern of said oxynitride film as a mask.

12. A method for forming an element isolation oxide film according to claim 11, wherein said oxynitride film has an intermediate portion between said first surface layer portion and said second surface layer portion and the step of forming said oxynitride film further comprises the step of forming said intermediate portion between the step of forming said first surface layer portion and the step of forming said second surface layer portion, said intermediate portion being formed while gradually decreasing said first gas feed and gradually increasing said second gas feed.

13. A method for forming an element isolation oxide film according to claim 11, wherein said oxynitride film is formed directly on the main surface of said silicon substrate and has said first surface layer portion constituted substantially of a silicon oxide film, the step of forming said oxynitride film comprises the step of forming said first surface layer portion while increasing said first gas feed to a maximum and decreasing said second gas feed to a level of approximately zero.

14. A method for forming an element isolation oxide film according to claim 11, wherein a silicon nitride film is further formed on said second surface layer portion, the step of forming said oxynitride film comprises the step of forming said silicon nitride film on said oxynitride film according to a chemical vapor deposition method after completion of the formation of said oxynitride film, and wherein the step of patterning said oxynitride film includes the step of patterning said silicon nitride film in the desired pattern and the step of oxidizing the main surface of said silicon substrate includes the step of selectively oxidizing the main surface of said silicon substrate with said silicon nitride film and said oxynitride film using as a mask.

15. A method for forming an element isolation oxide film according to claim 14, wherein a polysilicon film is formed between said silicon nitride film and said silicon substrate the step of forming said oxynitride film includes the step of successively forming said polysilicon film and said silicon nitride film after the formation of said oxynitride film, and the step of patterning said oxynitride film includes the step of patterning said polysilicon film in the desired form.

16. A method for forming an element isolation oxide film according to claim 11, wherein said second surface layer portion is substantially constituted of a silicon nitride film and the step of forming said oxynitride film includes the step of said second surface layer portion while decreasing said first gas feed to substantially zero and increasing said second gas feed to a maximum.

17. A method for forming an element isolation oxide film according to claim 11, wherein a groove is formed in the main surface of said silicon substrate which has been selectively exposed by patterning said oxynitride film, and the step of patterning said oxynitride film includes the step of forming said groove by etching the exposed main surface of said silicon substrate.

18. A method for forming an element isolation oxide film according to claim 17, wherein side wall insulating films consisting of an oxidation-resistant film are formed to cover side walls of said groove, and the step of forming said groove includes the steps of forming an oxidation-resistant film to cover said groove therewith, and subjecting said oxidation-resistant film to anisotropic etching to selectively expose the bottom face of said groove while leaving said side wall insulating films to cover the side walls of said groove.

19. A method for forming an element isolation oxide film according to claim 18, wherein said oxidation-resistant film consists of at least one material selected from an oxynitride film and a silicon oxide film.

20. A method for forming an element isolation oxide film according to claim 11, wherein side wall insulating films consisting of an oxidation-resistant film are formed to cover side walls of the patterned oxynitride film, and the step of patterning said oxynitride film includes the steps of forming, after patterning of said oxynitride film, the oxidation-resistant film to cover the exposed main surface of said silicon substrate and said oxynitride film and subjecting said oxidation-resistant film to selectively expose the main surface of said silicon substrate and to form said side wall insulating films to cover side walls of said oxynitride film therewith.

21. A method for forming an element isolation oxide film according to claim 11, wherein a silicon oxide film is formed between said oxynitride film and said silicon substrate, and the step of forming said oxynitride film includes the step of forming said silicon oxide film on the main surface of said silicon substrate prior to formation of said oxynitride film.

22. A method for forming an element isolation oxide film by use of an oxynitride film which contains given contents of oxygen and nitrogen, is formed on a main surface of a silicon substrate, and comprises a first surface layer portion containing a first surface at a side of the main surface of said silicon substrate and a second surface layer portion containing a second surface opposite to said first surface, the method comprising the steps of:

forming a silicon nitride film on the main surface of said silicon substrate with a silicon oxide film interposed therebetween;

patterning said silicon nitride film in a desired form;

forming said oxynitride film to cover the main surface of said silicon substrate and patterned said silicon nitride film therewith by a chemical vapor deposition method wherein said first surface layer portion is formed while a first gas feed for supplying oxygen is greater than a second gas feed for supplying nitrogen and said second surface layer portion is formed while said first gas feed is less than said second gas feed;

subjecting said oxynitride film to anisotropic etching to selectively expose the main surface of said silicon substrate and to form side wall insulating films consisting of said oxynitride film to cover side walls of said silicon nitride film; and selectively oxidizing the main surface of said silicon substrate using said side wall insulating films and said silicon nitride films as a mask.

23. A method for forming an element isolation oxide film according to claim 22, wherein a groove is formed at the exposed main surface of said silicon substrate and said side wall insulating films extend on the side walls of said groove, and the step of patterning said silicon nitride film includes the step of, etching the exposed main surface of said silicon substrate to form said groove after patterning said silicon nitride film and the step of forming said oxynitride film includes the step of forming said oxynitride film to cover side walls of said groove therewith.

24. A method for forming an element isolation oxide film according to claim 22, wherein the main surface of said silicon substrate is provided with the groove having side walls between side wall insulating films, and the step of forming said side wall insulating films includes, after formation of said side wall insulating films, the step of etching the exposed main surface of said silicon substrate to form said groove.

\* \* \* \* \*